(12) United States Patent
Usui et al.

(10) Patent No.: US 9,530,966 B2
(45) Date of Patent: Dec. 27, 2016

(54) POLYMER COMPOUND AND LIGHT EMITTING DEVICE USING THE SAME

(71) Applicant: SUMITOMO CHEMICAL COMPANY, LIMITED, Chuo-ku, Tokyo (JP)

(72) Inventors: Motoaki Usui, Tsukuba (JP); Mio Shiratori, Tsukuba (JP)

(73) Assignee: SUMITOMO CHEMICAL COMPANY, LIMITED, Tokyo (JP)

( * ) Notice: Subject to any disclaimer, the term of this patent is extended or adjusted under 35 U.S.C. 154(b) by 0 days.

(21) Appl. No.: 14/772,434

(22) PCT Filed: Mar. 14, 2014

(86) PCT No.: PCT/JP2014/057933
§ 371 (c)(1),
(2) Date: Sep. 3, 2015

(87) PCT Pub. No.: WO2014/157016
PCT Pub. Date: Oct. 2, 2014

(65) Prior Publication Data
US 2016/0013418 A1    Jan. 14, 2016

(30) Foreign Application Priority Data

Mar. 28, 2013 (JP) .................................. 2013-068494
Oct. 18, 2013 (JP) .................................. 2013-217057

(51) Int. Cl.
| C08G 65/04 | (2006.01) |
| H01L 51/00 | (2006.01) |
| C09K 11/06 | (2006.01) |
| C08G 61/12 | (2006.01) |
| H01L 51/50 | (2006.01) |

(52) U.S. Cl.
CPC ........... *H01L 51/0043* (2013.01); *C08G 61/12* (2013.01); *C08G 61/128* (2013.01); *C09K 11/06* (2013.01); *H01L 51/0035* (2013.01); *H01L 51/0039* (2013.01); *C08G 2261/122* (2013.01); *C08G 2261/135* (2013.01); *C08G 2261/312* (2013.01); *C08G 2261/3142* (2013.01); *C08G 2261/3162* (2013.01); *C08G 2261/3325* (2013.01); *C08G 2261/342* (2013.01); *C08G 2261/512* (2013.01); *C08G 2261/76* (2013.01); *C08G 2261/95* (2013.01); *C09K 2211/185* (2013.01); *H01L 51/5012* (2013.01); *H01L 51/5016* (2013.01); *H01L 51/5056* (2013.01); *H01L 51/5072* (2013.01)

(58) Field of Classification Search
CPC .............. C08G 2261/3162; C08G 2261/76; C08G 2261/95; C08L 79/02; H01L 51/0039
See application file for complete search history.

(56) References Cited

U.S. PATENT DOCUMENTS

| 2007/0063191 | A1 | 3/2007 | Inbasekaran et al. |
| 2007/0102695 | A1* | 5/2007 | Inbasekaran ............ C07C 25/22 257/40 |
| 2008/0097076 | A1 | 4/2008 | Radu et al. |
| 2008/0102312 | A1 | 5/2008 | Parham et al. |
| 2008/0220285 | A1 | 9/2008 | Vestweber et al. |
| 2009/0227765 | A1 | 9/2009 | Towns et al. |
| 2009/0315453 | A1 | 12/2009 | Kobayashi et al. |
| 2011/0042661 | A1 | 2/2011 | Endo et al. |
| 2012/0199825 | A1 | 8/2012 | Soga et al. |
| 2013/0270544 | A1 | 10/2013 | Anryu et al. |
| 2013/0284985 | A1* | 10/2013 | Yoshida ................ C07C 211/61 252/500 |

FOREIGN PATENT DOCUMENTS

| CN | 101945925 A | 1/2011 |
| JP | 2007-528916 A | 10/2007 |

(Continued)

OTHER PUBLICATIONS

Written Opinion, issued by International Searching Authority in corresponding International Application No. PCT/JP2014/057933, on Jun. 24, 2014.
International Search Report for PCT/JP2014/057933 dated Jun. 24, 2014 [PCT/ISA/210].
Office Action dated May 5, 2016 in Chinese Application No. 201480017027.X.

*Primary Examiner* — Shane Fang
(74) *Attorney, Agent, or Firm* — Sughrue Mion, PLLC

(57) ABSTRACT

A polymer compound comprising a constituent unit represented by the formula (1') and a constituent unit having a mono-valent cross-linkable group:

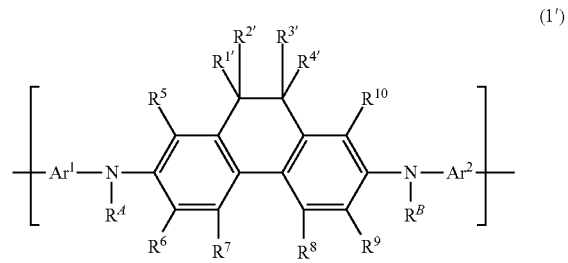

(1')

wherein $R^{1'}$ to $R^{4'}$ represent an alkyl group, an alkoxy group, an aryl group, an aryloxy group, a mono-valent heterocyclic group, $R^5$ to $R^{10}$ represent a hydrogen atom, an alkyl group, an alkoxy group, an aryl group, an aryloxy group, a mono-valent heterocyclic group, $R^A$ and $R^B$ represent a hydrogen atom, an alkyl group, an aryl group, a mono-valent heterocyclic group, and $Ar^1$ and $Ar^2$ represent an arylene group, a di-valent heterocyclic group.

13 Claims, No Drawings

(56) References Cited

FOREIGN PATENT DOCUMENTS

| | | | |
|---|---|---|---|
| JP | 2008-517135 A | 5/2008 | |
| JP | 2008106241 A | 5/2008 | |
| JP | 2008-169367 A | 7/2008 | |
| JP | 2009-287000 A | 12/2009 | |
| JP | 201228726 A | 2/2012 | |
| JP | 2012-153742 A | 8/2012 | |
| JP | 2013-155294 A | 8/2013 | |
| JP | 2014-110427 A | 6/2014 | |
| JP | 5573697 B2 | 8/2014 | |
| TW | 201231618 A1 | 8/2012 | |
| TW | 201233770 A1 | 8/2012 | |
| WO | 2005104263 A1 | 11/2005 | |
| WO | 2006122630 A1 | 11/2006 | |
| WO | 2012/086668 A1 | 6/2012 | |
| WO | 2012/086670 A1 | 6/2012 | |

\* cited by examiner

POLYMER COMPOUND AND LIGHT EMITTING DEVICE USING THE SAME

CROSS REFERENCE TO RELATED APPLICATIONS

This application is a National Stage of International Application No. PCT/JP2014/057933 filed Mar. 14, 2014, claiming priority based on Japanese Patent Application Nos. 2013-068494 filed Mar. 28, 2013 and 2013-217057 filed Oct. 18, 2013, the contents of all of which are incorporated herein by reference in their entirety.

TECHNICAL FIELD

The present invention relates to a polymer compound and a light emitting device using the same.

BACKGROUND ART

As a hole transporting material for use in a light emitting device, for example, a polymer compound comprising the following constituent unit derived from an arylamine and the following constituent unit derived from a fluorene having benzocyclobutane structures (Patent document 1):

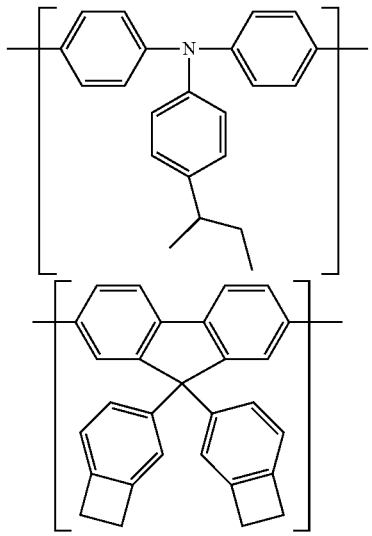

and a polymer compound comprising the following constituent unit derived from an arylamine and the following constituent unit derived from an arylamine having a benzocyclobutane structure (Patent document 2):

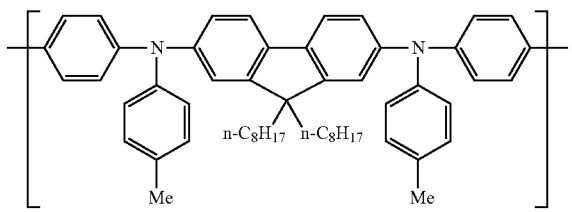

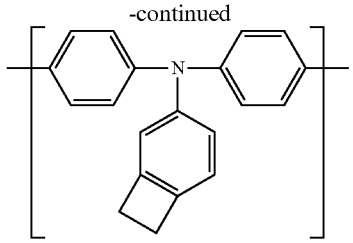

are under consideration.

PRIOR ART DOCUMENTS

Patent Documents

Patent document 1: JP-A No. 2008-106241
Patent document 2: JP-A No. 2012-028726

SUMMARY OF THE INVENTION

Problem to be Solved by the Invention

However, a light emitting device produced using the above-described polymer compound does not necessarily have a sufficient luminance life.

Then, the present invention has an object of providing a polymer compound which is useful for producing a light emitting device excellent in luminance life. Further, the present invention has an object of providing a composition and a film comprising the polymer compound, an insolubilized film obtained by insolubilizing the film in a solvent, and a light emitting device having the film or the insolubilized film.

Means for Solving the Problem

In a first aspect, the present invention provides a polymer compound comprising a constituent unit represented by the following formula (1') and a constituent unit having at least one mono-valent cross-linkable group selected from the following Group A of cross-linkable group:

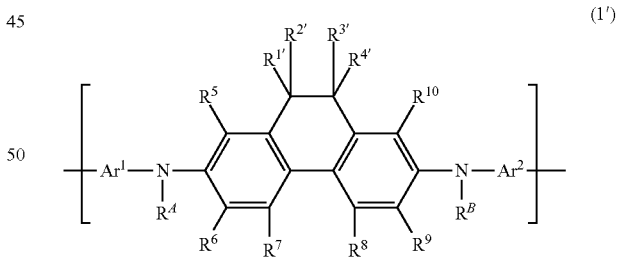

[wherein $R^{1'}$, $R^{2'}$, $R^{3'}$ and $R^{4'}$ represent each independently an alkyl group, an alkoxy group, an aryl group, an aryloxy group or a mono-valent heterocyclic group and these groups may have a substituent.

$R^5$, $R^6$, $R^7$, $R^8$, $R^9$ and $R^{10}$ represent each independently a hydrogen atom, an alkyl group, an alkoxy group, an aryl group, an aryloxy group or a mono-valent heterocyclic group and these groups may have a substituent.

$R^A$ and $R^B$ represent each independently a hydrogen atom, an alkyl group, an aryl group or a mono-valent heterocyclic group and these groups may have a substituent.

Ar¹ and Ar² represent each independently an arylene group or a di-valent heterocyclic group and these groups may have a substituent.

$R^{1'}$ and $R^{3'}$ may be mutually linked to form a ring structure together with carbon atoms to which they are linked, $R^{2'}$ and $R^{4'}$ may be mutually linked to form a ring structure together with carbon atoms to which they are linked, $R^{1'}$ and $R^{2'}$ may be mutually linked to form a ring structure together with a carbon atom to which they are linked, $R^{3'}$ and $R^{4'}$ may be mutually linked to form a ring structure together with a carbon atom to which they are linked, adjacent groups of $R^6$, $R^7$, $R^8$ and $R^9$ may be mutually linked to form a ring structure together with carbon atoms to which they are linked.

Ar¹ and $R^A$ may be mutually linked to form a ring structure together with a nitrogen atom to which they are linked, Ar² and $R^B$ may be mutually linked to form a ring structure together with a nitrogen atom to which they are linked.]

(Group A of Cross-Linkable Group)

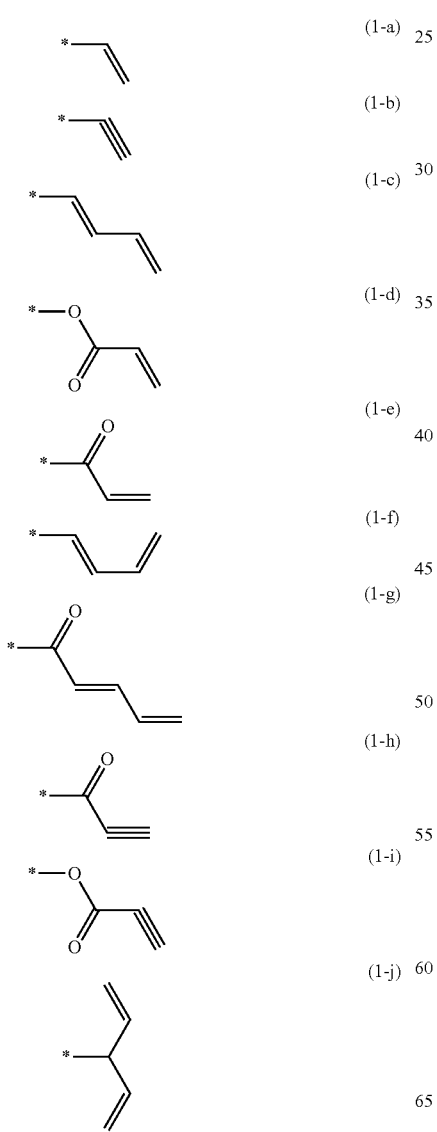

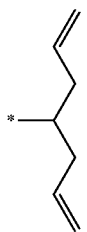

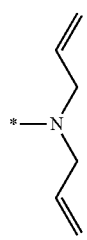

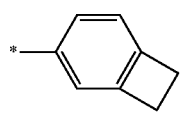

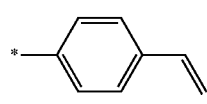

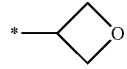

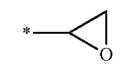

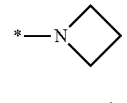

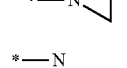

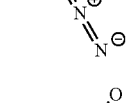

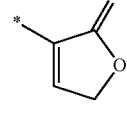

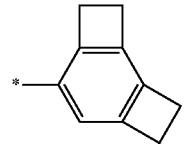

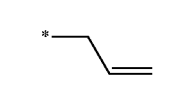

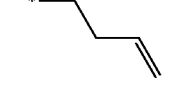

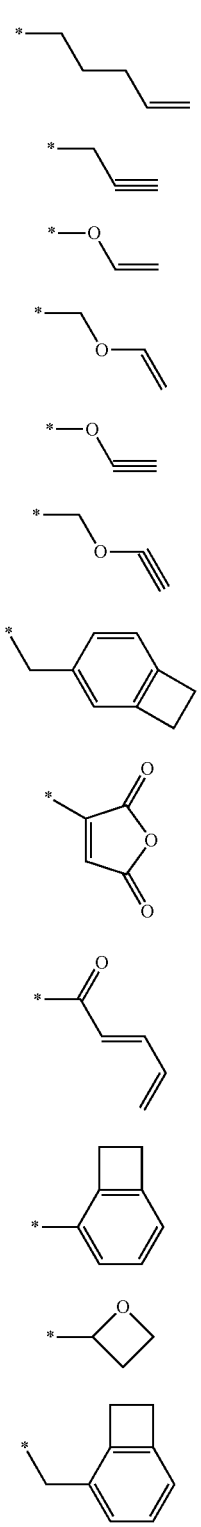

(1-x)
(1-y)
(1-z)
(1-A)
(1-B)
(1-C)
(1-D)
(1-E)
(1-g')
(1-m')
(1-o')
(1-D')

[wherein the cross-linkable group may have a substituent. * represents a linkage position.].

In a second aspect, the present invention provides the above-described polymer compound wherein the constituent unit represented by the above-described formula (1') is a constituent unit represented by the following formula (1):

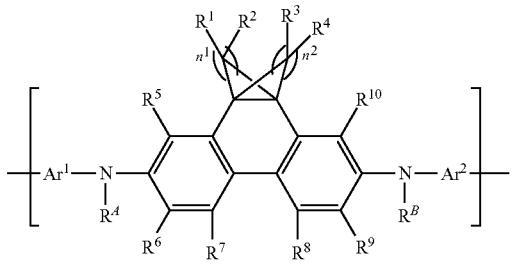

(1)

[wherein
$R^5$, $R^6$, $R^7$, $R^8$, $R^9$, $R^{10}$, $R^A$, $R^B$, $Ar^1$ and $Ar^2$ represent the same meaning as described above.

$n^1$ and $n^2$ represent each independently an integer of 1 to 5.

$R^1$, $R^2$, $R^3$ and $R^4$ represent each independently a hydrogen atom, an alkyl group, an alkoxy group, an aryl group, an aryloxy group or a mono-valent heterocyclic group and these groups may have a substituent. When there exist a plurality of each of $R^1$, $R^2$, $R^3$ and $R^4$, the plurality of $R^1$, $R^2$, $R^3$ and $R^4$ may each be mutually the same or different.

Adjacent groups of $R^1$, $R^2$, $R^3$ and $R^4$ may be mutually linked to form a ring structure together with carbon atoms to which they are linked.

$Ar^1$ and $R^A$ may be mutually linked to form a ring structure together with a nitrogen atom to which they are linked, $Ar^2$ and $R^B$ may be mutually linked to form a ring structure together with a nitrogen atom to which they are linked.].

In a third aspect, the present invention provides a composition comprising the above-described polymer compound and at least one material selected from the group consisting of a hole transporting material, a hole injection material, an electron transporting material, an electron injection material, a light emitting material, an antioxidant and a solvent.

In a fourth aspect, the present invention provides a film comprising the above-described polymer compound.

In a fifth aspect, the present invention provides an insolubilized film obtained by insolubilizing the above-described film in a solvent.

In a sixth aspect, the present invention provides a light emitting device having the above-described film or the above-described insolubilized film.

Effect of the Invention

The present invention can provide a polymer compound which is useful for producing a light emitting device excellent in luminance life. Further, the present invention can provide a composition and a film comprising the polymer compound, an insolubilized film obtained by insolubilizing the film in a solvent, and a light emitting device having the film or the insolubilized film.

MODES FOR CARRYING OUT THE INVENTION

Terms commonly used in the present specification will be explained, if necessary, with examples mentioned below.

"Me" represents a methyl group, "Et" represents an ethyl group, "Ph" represents a phenyl group, and "t-Bu" and "tBu" represent a tert-butyl group.

"Constituent unit" denotes a unit structure found once or more in a polymer compound. "Constituent unit" is preferably contained as "repeating unit" (namely, a unit structure found twice or more in a polymer compound) in a polymer compound.

"n-Valent heterocyclic group" (n is an integer of 1 or more) denotes an atomic group remaining after removing from a single-ring or condensed-ring heterocyclic compound (An aromatic heterocyclic compound is preferable. Namely, the n-valent heterocyclic group is preferably an n-valent aromatic heterocyclic group.) n hydrogen atoms linked directly to carbon atoms constituting the ring. "Heterocyclic compound" denotes an organic compound having a cyclic structure in which elements constituting a ring include not only a carbon atom but also a hetero atom such as an oxygen atom, a sulfur atom, a nitrogen atom, a phosphorus atom, a boron atom and the like contained in the ring.

"n-Valent aromatic hydrocarbon group" (n is an integer of 1 or more) denotes an atomic group remaining after removing from a single-ring or condensed-ring aromatic hydrocarbon n hydrogen atoms linked directly to carbon atoms constituting the ring.

"Arlene group" denotes an atomic group remaining after removing from a single-ring or condensed-ring aromatic hydrocarbon two hydrogen atoms linked directly to carbon atoms constituting the ring.

"Aryl group" denotes an atomic group remaining after removing from a single-ring or condensed-ring aromatic hydrocarbon one hydrogen atom linked directly to a carbon atom constituting the ring.

"Halogen atom" denotes a fluorine atom, a chlorine atom, a bromine atom or an iodine atom.

[Polymer Compound]

The polymer compound of the present invention will be illustrated below.

The polymer compound of the present invention comprises a constituent unit represented by the above-described formula (1') and a constituent unit having at least one mono-valent cross-linkable group selected from the above-described Group A of cross-linkable group.

(Constituent Unit Represented by the Formula (1'))

$R^{1'}$, $R^{2'}$, $R^{3'}$ and $R^{4'}$ represent preferably an alkyl group or an aryl group, more preferably an alkyl group, because when the polymer compound of the present embodiment is used for production of a light emitting device, the resulting light emitting device is excellent in luminance life.

$R^5$, $R^6$, $R^7$, $R^8$, $R^9$ and $R^{10}$ represent preferably a hydrogen atom, an alkyl group or an aryl group, more preferably a hydrogen atom or an alkyl group, further preferably a hydrogen atom, because when the polymer compound of the present embodiment is used for production of a light emitting device, the resulting light emitting device is excellent in luminance life.

The alkyl group represented by $R^{1'}$, $R^{2'}$, $R^{3'}$, $R^{4'}$, $R^5$, $R^6$, $R^7$, $R^8$, $R^9$ and $R^{10}$ may be any of linear, branched or cyclic, and the number of carbon atoms of the linear alkyl group is, not including the number of carbon atoms of a substituent, usually 1 to 50, preferably 3 to 30, more preferably 4 to 20. The number of carbon atoms of the branched or cyclic alkyl groups is, not including the number of carbon atoms of a substituent, usually 3 to 50, preferably 3 to 30, more preferably 4 to 20.

The alkyl group includes, for example, a methyl group, an ethyl group, a n-propyl group, an isopropyl group, a n-butyl group, an isobutyl group, a tert-butyl group, a n-pentyl group, an isoamyl group, a n-hexyl group, a cyclohexyl group, a n-heptyl group, a cyclohexylmethyl group, a n-octyl group, a 2-ethylhexyl group, a n-decyl group, a 3,7-dimethyloctyl group, a 2-ethyloctyl group and a 2-n-hexyldecyl group.

The number of carbon atoms of the aryl group represented by $R^{1'}$, $R^{2'}$, $R^{3'}$, $R^{4'}$, $R^5$, $R^6$, $R^7$, $R^8$, $R^9$ and $R^{10}$ is, not including the number of carbon atoms of a substituent, usually 6 to 60, preferably 6 to 48, more preferably 6 to 30.

The aryl group includes, for example, a phenyl group, a 1-naphthyl group, a 2-naphthyl group, a 1-anthracenyl group, a 2-anthracenyl group, a 9-anthracenyl group, a 1-pyrenyl group, a 2-pyrenyl group, a 4-pyrenyl group, a 2-fluorenyl group, a 3-fluorenyl group, a 4-fluorenyl group, a 2-phenylphenyl group, a 3-phenylphenyl group and a 4-phenylphenyl group.

The number of carbon atoms of the mono-valent heterocyclic group represented by $R^{1'}$, $R^{2'}$, $R^{3'}$, $R^{4'}$, $R^5$, $R^6$, $R^7$, $R^8$, $R^9$ and $R^{10}$ is, not including the number of carbon atoms of a substituent, usually 2 to 60, preferably 3 to 20.

The mono-valent heterocyclic group includes, for example, a thienyl group, a pyrrolyl group, a furyl group, a pyridyl group, a piperidyl group, a quinolyl group, an isoquinolyl group, a pyrimidyl group, a triazinyl group, and groups obtained by substituting a hydrogen atom in these groups with an alkyl group, an alkoxy group or the like. Of them, a thienyl group, a pyridyl group, a quinolyl group, an isoquinolyl group, a pyrimidyl group and a triazinyl group are preferable.

The alkoxy group represented by $R^{1'}$, $R^{2'}$, $R^{3'}$, $R^{4'}$, $R^5$, $R^6$, $R^7$, $R^8$, $R^9$ and $R^{10}$ may be any of linear, branched or cyclic. The number of carbon atoms of the linear alkoxy group is, not including the number of carbon atoms of a substituent, usually 1 to 40, preferably 3 to 20, more preferably 4 to 10. The number of carbon atoms of the branched or cyclic alkoxy groups is, not including the number of carbon atoms of a substituent, usually 3 to 40, preferably 3 to 20, more preferably 4 to 10.

The alkoxy group includes, for example, a methoxy group, an ethoxy group, a n-propyloxy group, an isopropyloxy group, a n-butyloxy group, an isobutyloxy group, a tert-butyloxy group, a n-pentyloxy group, a n-hexyloxy group, a cyclohexyloxy group, a n-heptyloxy group, a n-octyloxy group, a 2-ethylhexyloxy group, a n-nonyloxy group, a n-decyloxy group, a 3,7-dimethyloctyloxy group and a lauryloxy group.

The number of carbon atoms of the aryloxy group represented by $R^{1'}$, $R^{2'}$, $R^{3'}$, $R^{4'}$, $R^5$, $R^6$, $R^7$, $R^8$, $R^9$ and $R^{10}$ is, not including the number of carbon atoms of a substituent, usually 6 to 60, preferably 6 to 48.

The aryloxy group includes, for example, a phenoxy group, a 1-naphthyloxy group, a 2-naphthyloxy group, a 1-anthracenyloxy group, a 9-anthracenyloxy group and a 1-pyrenyloxy group.

$R^A$ and $R^B$ represent preferably an alkyl group, an aryl group or a mono-valent heterocyclic group, more preferably an aryl group or a mono-valent heterocyclic group, further preferably an aryl group, because the polymer compound of the present embodiment is excellent in stability and when the polymer compound is used for production of a light emitting device, the resulting luminance life is excellent.

The definition and examples of the alkyl group, the aryl group and the mono-valent heterocyclic group represented by $R^A$ and $R^B$ are the same as the definition and examples of the alkyl group, the aryl group and the mono-valent heterocyclic group represented by $R^{1'}$, $R^{2'}$, $R^{3'}$, $R^{4'}$, $R^5$, $R^6$, $R^7$, $R^8$, $R^9$ and $R^{10}$, respectively.

The aryl group represented by $R^A$ and $R^B$ represents preferably a phenyl group, more preferably a phenyl group substituted with an alkyl group, because solubility of the polymer compound of the present embodiment in an organic solvent and heat resistance thereof are improved in a balanced manner.

The phenyl group substituted with an alkyl group includes, for example, a 2,6-dimethyl-4-n-butylphenyl group, a 2,6-dimethyl-4-tert-butylphenyl group, a 2,6-dimethyl-4-n-hexylphenyl group, a 2,4,6-trimethylphenyl group, a 2-methylphenyl group, a 3-methylphenyl group, a 4-methylphenyl group, a 3-n-butylphenyl group, a 4-n-butylphenyl group, a 4-tert-butylphenyl group, a 3-n-hexylphenyl group, a 4-n-hexylphenyl group, a 4-n-octylphenyl group, a 3,5-dimethylphenyl group, a 3-n-hexyl-5-methylphenyl group and a 3,5-di-n-hexylphenyl group.

The number of carbon atoms of the arylene group represented by $Ar^1$ and $Ar^2$ is, not including the number of carbon atoms of a substituent, usually 6 to 60, preferably 6 to 30, more preferably 6 to 18.

The arylene group represented by $Ar^1$ and $Ar^2$ includes, for example, a 1,2-phenylenediyl group, a 1,3-phenylenediyl group, a 1,4-phenylenediyl group, a 1,4-naphthalenediyl group, a 1,5-naphthalenediyl group, a 2,6-naphthalenediyl group, a 2,7-naphthalenediyl group, a 2,6-anthracenediyl group, a 9,10-anthracenediyl group, a 9,10-dihydrophenanthrene-2,7-diyl group, a 5,12-naphthacenediyl group, a 2,7-fluorenediyl group, a 3,6-fluorenediyl group, a 1,6-pyrenediyl group, a 2,7-pyrenediyl group, a 3,9-perylenediyl group, a 3,10-perylenediyl group, a 6,12-chrysenediyl group and a 2,8-chrysenediyl group, preferably a 1,4-phenylenediyl group, a 2,7-fluorenediyl group, a 2,6-anthracenediyl group, a 9,10-anthracenediyl group, a 2,7-dihydrophenanthrenediyl group and 1,6-pyrenediyl group, more preferably a 1,4-phenylenediyl group.

The number of carbon atoms of the di-valent heterocyclic group represented by $Ar^1$ and $Ar^2$ is, not including the number of carbon atoms of a substituent, usually 2 to 60, preferably 3 to 30, more preferably 3 to 15.

The di-valent heterocyclic group represented by $Ar^1$ and $Ar^2$ includes, for example, a 2,5-thiophenediyl group, a 2,5-pyrrolediyl group, a 2,5-furandiyl group, a 2,5-pyridinediyl group, a 2,6-pyridinediyl group, a 2,6-quinolinediyl group, a 1,4-isoquinolinediyl group, a 1,5-isoquinolinediyl group, a 5,8-quinoxalinediyl group, a 2,7-carbazolediyl group, a 3,6-carbazolediyl group, a 3,7-phenoxazinediyl group, a 3,7-phenothiazinediyl group, a 2,8-phenothiazinediyl group, a 4,6-phenothiazinediyl group, a 2,1,3-benzothiadiazole-4,7-diyl group, a 2,7-dibenzofurandiyl group and a 2,7-dibenzothiophenediyl group.

The group represented by $R^{1\prime}$, $R^{2\prime}$, $R^{3\prime}$, $R^{4\prime}$, $R^5$, $R^6$, $R^7$, $R^8$, $R^9$, $R^{10}$, $R^A$, $R^B$, $Ar^1$ and $Ar^2$ may have a substituent. The substituent includes an alkyl group, an alkoxy group, an aryl group, an aryloxy group, a halogen atom, a mono-valent heterocyclic group and a cyano group, preferably an alkyl group and an aryl group.

The definition and examples of the alkyl group, the alkoxy group, the aryl group, the aryloxy group and the mono-valent heterocyclic group are the same as the definition and examples of the alkyl group, the alkoxy group, the aryl group, the aryloxy group and the mono-valent heterocyclic group represented by $R^{1\prime}$, $R^{2\prime}$, $R^{3\prime}$, $R^{4\prime}$, $R^5$, $R^6$, $R^7$, $R^8$, $R^9$ and $R^{10}$, respectively.

"Adjacent groups of $R^6$, $R^7$, $R^8$ and $R^9$ may be mutually linked to form a ring structure together with carbon atoms to which they are linked" means that groups linking to carbon atoms at adjacent positions may be mutually linked to form a ring structure together with carbon atoms to which they are linked, and means that $R^6$ and $R^7$ may be linked to form a ring structure together with carbon atoms to which they are linked and that $R^8$ and $R^9$ may be linked to form a ring structure together with carbon atoms to which they are linked.

The above-described ring structure formed may have a substituent, and the substituent includes an alkyl group, an alkoxy group, an aryl group, an aryloxy group, a halogen atom, a mono-valent heterocyclic group and a cyano group.

The definition and examples of the alkyl group, the alkoxy group, the aryl group, the aryloxy group and the mono-valent heterocyclic group are the same as the definition and examples of the alkyl group, the alkoxy group, the aryl group, the aryloxy group and the mono-valent heterocyclic group represented by $R^{1\prime}$, $R^{2\prime}$, $R^{3\prime}$, $R^{4\prime}$, $R^5$, $R^6$, $R^7$, $R^8$, $R^9$ and $R^{10}$, respectively.

"$Ar^1$ and $R^A$ may be mutually linked to form a ring structure together with a nitrogen atom to which they are linked, $Ar^2$ and $R^B$ may be mutually linked to form a ring structure together with a nitrogen atom to which they are linked" means that $Ar^1$ and $R^A$ (or $Ar^2$ and $R^B$) may be linked via a single bond or a group represented by —O—, —S—, —C(=O)—, —C(=O)—O—, —N($R^{29}$)—, —C(=O)—N($R^{29}$)— or $C(R^{29})_2$— ($R^{29}$ represents an alkyl group or an aryl group, and these groups may have a substituent, and when there exist a plurality of $R^{29}$, these may be mutually the same or different.) to form a ring structure.

The definition and examples of the alkyl group and the aryl group represented by $R^{29}$ are the same as the definition and examples of the alkyl group and the aryl group represented by $R^{1\prime}$, $R^{2\prime}$, $R^{3\prime}$, $R^{4\prime}$, $R^5$, $R^6$, $R^7$, $R^8$, $R^9$ and $R^{10}$, respectively.

The above-described ring structure formed may have a substituent, and the substituent includes an alkyl group, an alkoxy group, an aryl group, an aryloxy group, a halogen atom, a mono-valent heterocyclic group and a cyano group.

The definition and examples of the alkyl group, the alkoxy group, the aryl group, the aryloxy group and the mono-valent heterocyclic group are the same as the definition and examples of the alkyl group, the alkoxy group, the aryl group, the aryloxy group and the mono-valent heterocyclic group represented by $R^{1\prime}$, $R^{2\prime}$, $R^{3\prime}$, $R^{4\prime}$, $R^5$, $R^6$, $R^7$, $R^8$, $R^9$ and $R^{10}$, respectively.

In the constituent unit represented by the formula (1'), it is preferable for the combination of $R^{1\prime}$, $R^{2\prime}$, $R^{3\prime}$, $R^{4\prime}$, $R^5$, $R^6$, $R^7$, $R^8$, $R^9$, $R^{10}$, $R^A$, $R^B$, $Ar^1$ and $Ar^2$ that $R^{1\prime}$, $R^{2\prime}$, $R^{3\prime}$ and $R^{4\prime}$ represent an alkyl group or an aryl group, $R^5$, $R^6$, $R^7$, $R^8$, $R^9$ and $R^{10}$ represent a hydrogen atom, an alkyl group or an aryl group, $R^A$ and $R^B$ represent an alkyl group, an aryl group or a mono-valent heterocyclic group and $Ar^1$ and $Ar^2$ represent an arylene group, it is more preferable that $R^{1\prime}$, $R^{2\prime}$, $R^{3\prime}$ and $R^{4\prime}$ represents an alkyl group, $R^5$, $R^6$, $R^7$, $R^8$, $R^9$ and $R^{10}$ represent a hydrogen atom or an alkyl group, $R^A$ and $R^B$ represent an aryl group or a mono-valent heterocyclic group and $Ar^1$ and $Ar^2$ represent a 1,4-phenylenediyl group, a 2,7-fluorenediyl group, a 2,6-anthracenediyl group, a 9,10-anthracenediyl group, a 2,7-dihydrophenanthrenediyl group or a 1,6-pyrenediyl group, it is further preferable that $R^{1\prime}$, $R^{2\prime}$, $R^{3\prime}$ and $R^{4\prime}$ represent an alkyl group, $R^5$, $R^6$, $R^7$, $R^8$, $R^9$ and $R^{10}$ represent a hydrogen atom, $R^A$ and $R^B$ represent an aryl group and $Ar^1$ and $Ar^2$ represent a 1,4-phenylenediyl group.

(Constituent Unit Represented by the Formula (1))

The constituent unit represented by the above-described formula (1') is preferably a constituent unit represented by the above-described formula (1), because when the polymer compound of the present embodiment is used for production of a light emitting device, the resulting luminance life is excellent.

$n^1$ and $n^2$ represent preferably an integer of 3 to 5, more preferably 3 or 4, further preferably 3, because when the polymer compound of the present embodiment is used for production of a light emitting device, the resulting luminance life is excellent.

$n^1$ and $n^2$ may be mutually the same or different, and it is preferable that $n^1$ and $n^2$ are mutually the same because production of the polymer compound of the present embodiment is easy.

The definition and examples of the alkyl group, the alkoxy group, the aryl group, the aryloxy group and the mono-valent heterocyclic group represented by $R^1$, $R^2$, $R^3$ and $R^4$ are the same as the definition and examples of the alkyl group, the alkoxy group, the aryl group, the aryloxy group and the mono-valent heterocyclic group represented by $R^{1'}$, $R^{2'}$, $R^{3'}$, $R^{4'}$, $R^5$, $R^6$, $R^7$, $R^8$, $R^9$ and $R^{10}$, respectively.

$R^1$, $R^2$, $R^3$ and $R^4$ represent preferably a hydrogen atom, an alkyl group or an aryl group, further preferably a hydrogen atom or an alkyl group, because when the polymer compound of the present embodiment is used for production of a light emitting device, the resulting light emitting device is excellent in luminance life.

"Adjacent groups of $R^1$, $R^2$, $R^3$ and $R^4$ may be mutually linked to form a ring structure together with carbon atoms to which they are linked." means, for example, that groups of $R^1$, $R^2$, $R^3$ and $R^4$ linking to the same carbon atom may be mutually linked to form a ring structure, and when $n^1$ and/or $n^2$ is 2 or more, groups linking to carbon atoms at adjacent positions may be mutually linked to form a ring structure together with carbon atoms to which they are linked.

The above-described ring structure formed may have a substituent, and the substituent includes an alkyl group, an alkoxy group, an aryl group, an aryloxy group, a halogen atom, a mono-valent heterocyclic group and a cyano group.

The definition and examples of the alkyl group, the alkoxy group, the aryl group, the aryloxy group and the mono-valent heterocyclic group are the same as the definition and examples of the alkyl group, the aryl group, the aryloxy group and the mono-valent heterocyclic group represented by $R^{1'}$, $R^{2'}$, $R^{3'}$, $R^{4'}$, $R^5$, $R^6$, $R^7$, $R^8$, $R^9$ and $R^{10}$, respectively.

In the constituent unit represented by the formula (1), it is preferable for the combination of $n^1$, $n^2$, $R^1$, $R^2$, $R^3$, $R^4$, $R^5$, $R^6$, $R^7$, $R^8$, $R^9$, $R^{10}$, $R^A$, $R^B$, $Ar^1$ and $Ar^2$ that $n^1$ and $n^2$ represent an integer of 3 to 5, $R^1$, $R^2$, $R^3$ and $R^4$ represent a hydrogen atom, an alkyl group or an aryl group, $R^5$, $R^6$, $R^7$, $R^8$, $R^9$ and $R^{10}$ represent a hydrogen atom, an alkyl group or an aryl group, $R^A$ and $R^B$ represent an alkyl group, an aryl group or a mono-valent heterocyclic group and $Ar^1$ and $Ar^2$ represent an arylene group, it is more preferable that $n^1$ and $n^2$ represent 3 or 4, $R^1$, $R^2$, $R^3$ and $R^4$ represent a hydrogen atom or an alkyl group, $R^5$, $R^6$, $R^7$, $R^8$, $R^9$ and $R^{10}$ represent a hydrogen atom or an alkyl group, $R^A$ and $R^B$ represents an aryl group or a mono-valent heterocyclic group and $Ar^1$ and $Ar^2$ represent a 1,4-phenylenediyl group, a 2,7-fluorenediyl group, a 2,6-anthracenediyl group, a 9,10-anthracenediyl group, a 2,7-dihydrophenanthrenediyl group or a 1,6-pyrenediyl group, it is further preferable that $n^1$ and $n^2$ represent 3, $R^1$, $R^2$, $R^3$ and $R^4$ represent a hydrogen atom or an alkyl group, $R^5$, $R^6$, $R^7$, $R^8$, $R^9$ and $R^{10}$ represent a hydrogen atom, $R^A$ and $R^B$ represents an aryl group and $Ar^1$ and $Ar^2$ represent a 1,4-phenylenediyl group.

In the constituent unit represented by the formula (1), stereoisomerism can arise, for example, when $n^1$ and/or $n^2$ is 2 or more and a substituent is carried, when $R^1$ and $R^2$ are mutually different, and when $R^3$ and $R^4$ are mutually different. The polymer compound may have only a constituent unit having the same stereoisomerism or may have several constituent units having mutually different stereoisomerisms, as the constituent unit represented by the formula (1). The stereoisomerism includes diastereomer and enantiomer.

When the constituent unit represented by the formula (1) contains, for example, a skeleton portion represented by the following formula (1-Z), examples of its stereoisomerism are represented by the following formula (1-I), formula (1-II), formula (1-III) and formula (1-IV). In the following formulae, $R^m$ and $R^n$ represent each independently an alkyl group.

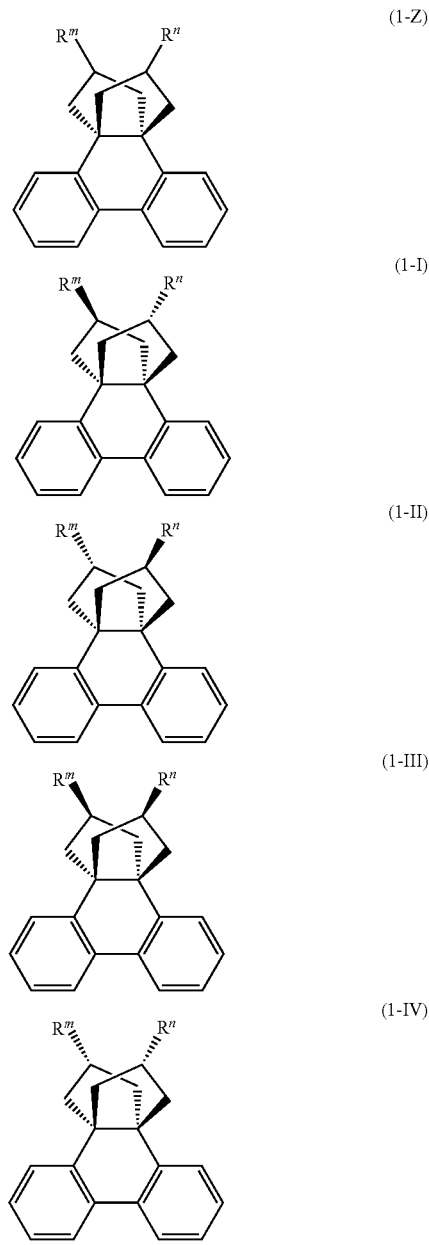

The skeleton portion represented by the formula (1-I), the skeleton portion represented by the formula (1-II), the skeleton portion represented by the formula (1-III) and the skeleton portion represented by the formula (1-IV) are mutually in the relation of diastereomer.

The total content of the constituent unit represented by the formula (1') (may also be the constituent unit represented by the formula (1)) is preferably 20 to 90 mol %, more preferably 25 to 70 mol %, further preferably 30 to 50 mol % with respect to the total content of constituent units contained in the polymer compound, because the polymer compound of the present embodiment is excellent in stability.

The constituent unit represented by the formula (1') (may also be the constituent unit represented by the formula (1)) includes, for example, constituent units represented by the following formula (1'-1) to formula (1'-8) and constituent units represented by the following formula (1-1) to formula (1-22), preferably constituent units represented by any of the formula (1'-1) to formula (1'-6) and formula (1-1) to formula (1-13), more preferably constituent units represented by any of the formula (1'-1) to formula (1'-3) and formula (1-1) to formula (1-9), further preferably constituent units represented by any of the formula (1-1) to formula (1-9), particularly preferably constituent units represented by any of the formula (1-1) to formula (1-8). * represents a linkage position.

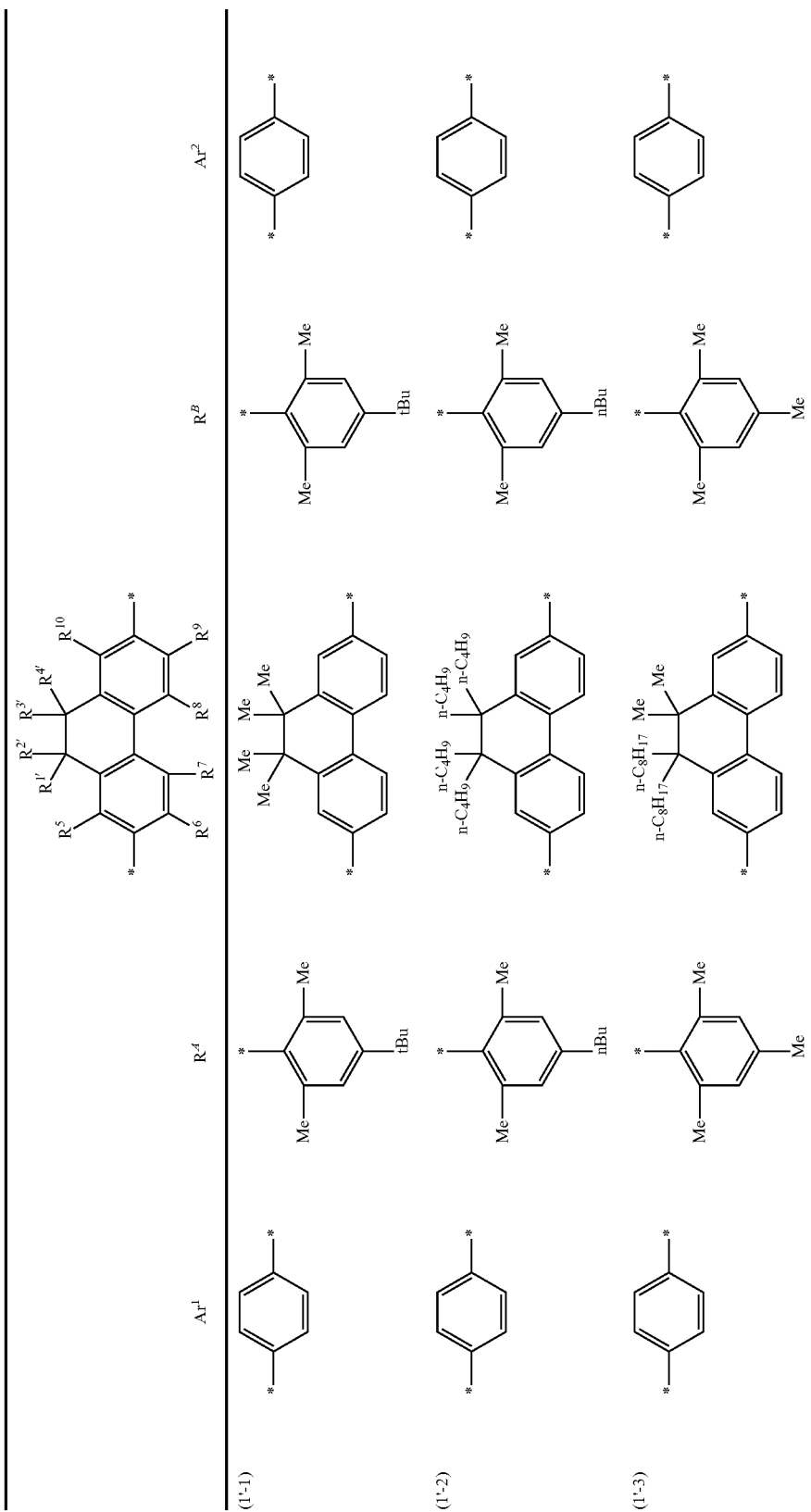

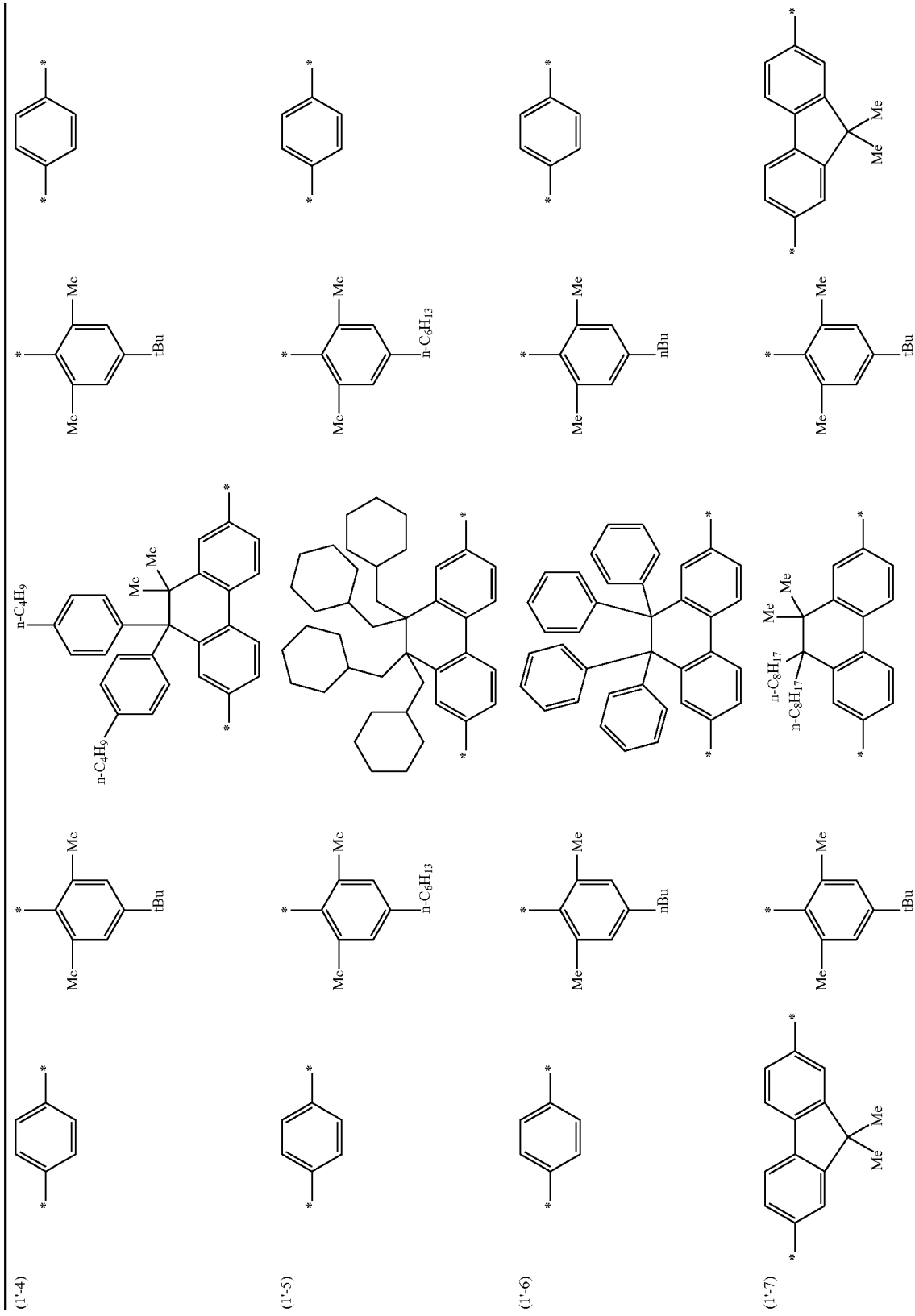

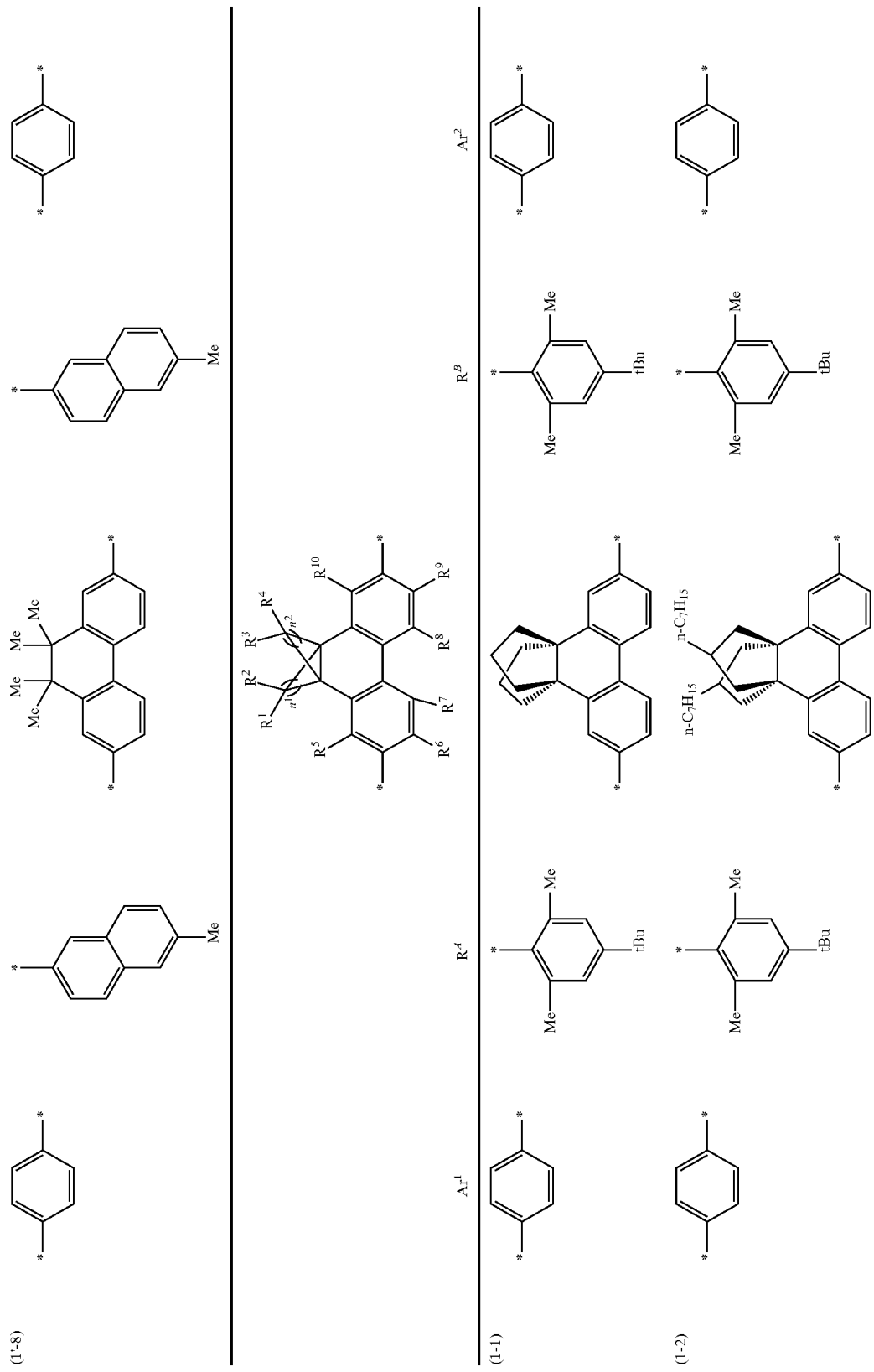

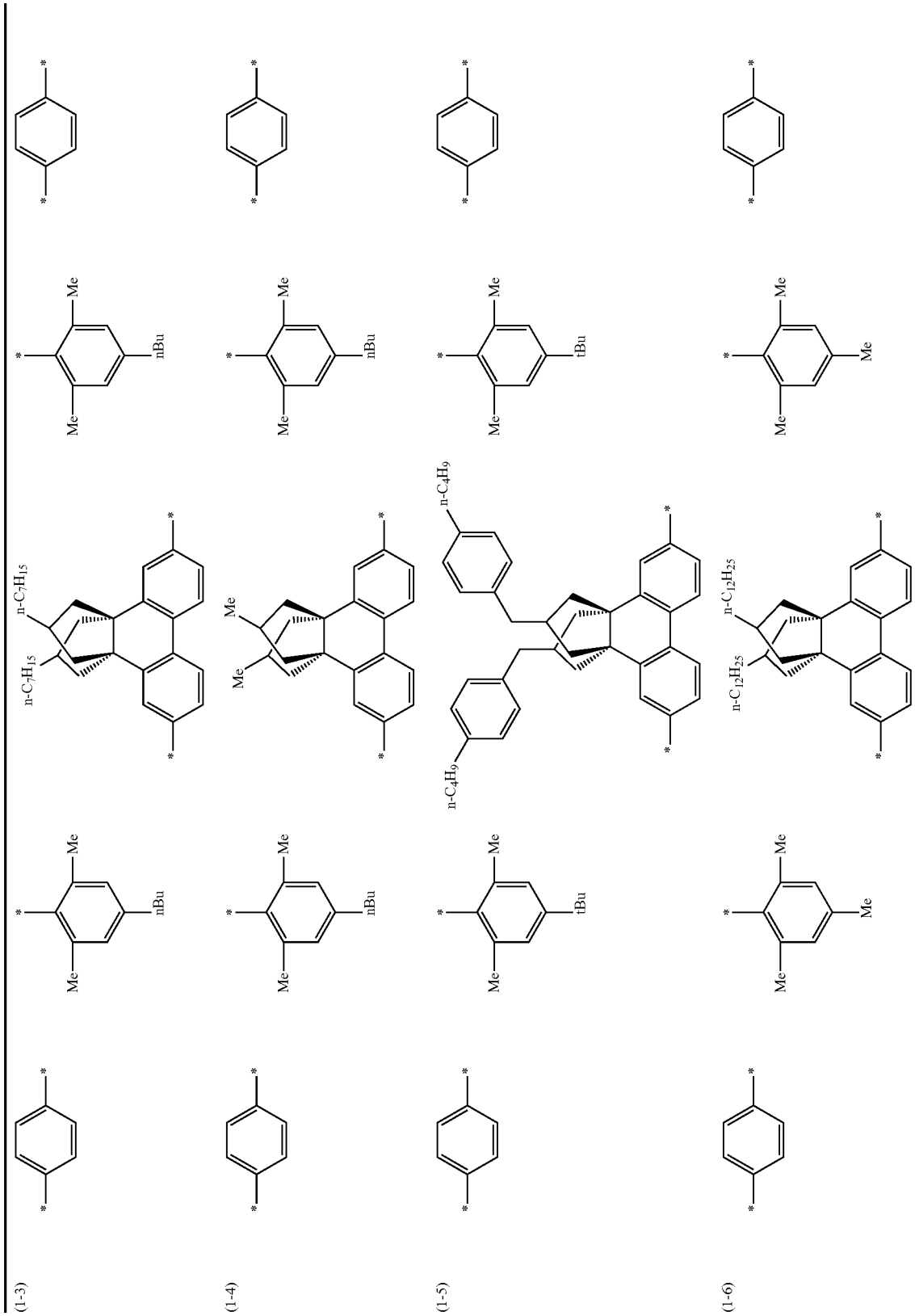

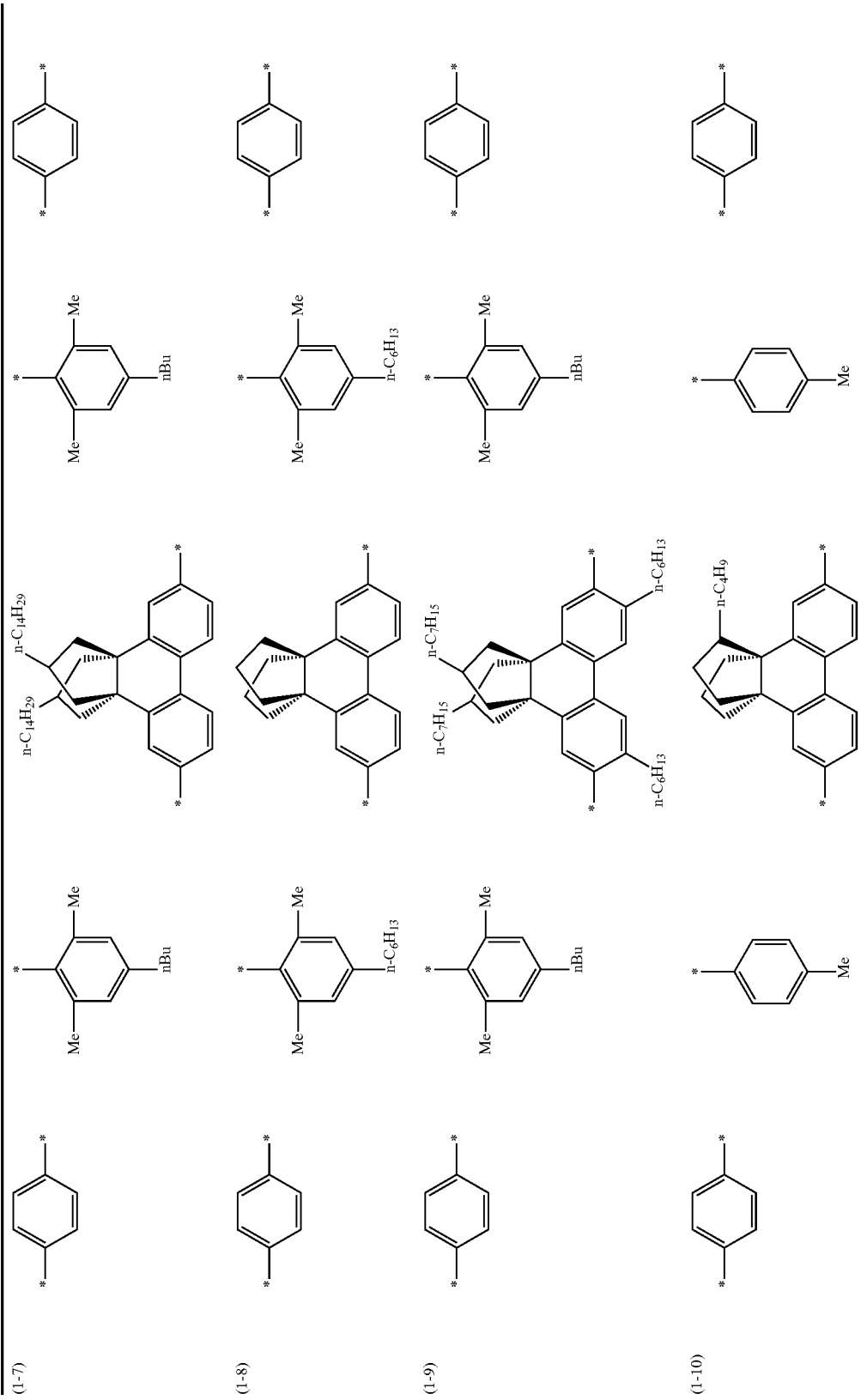

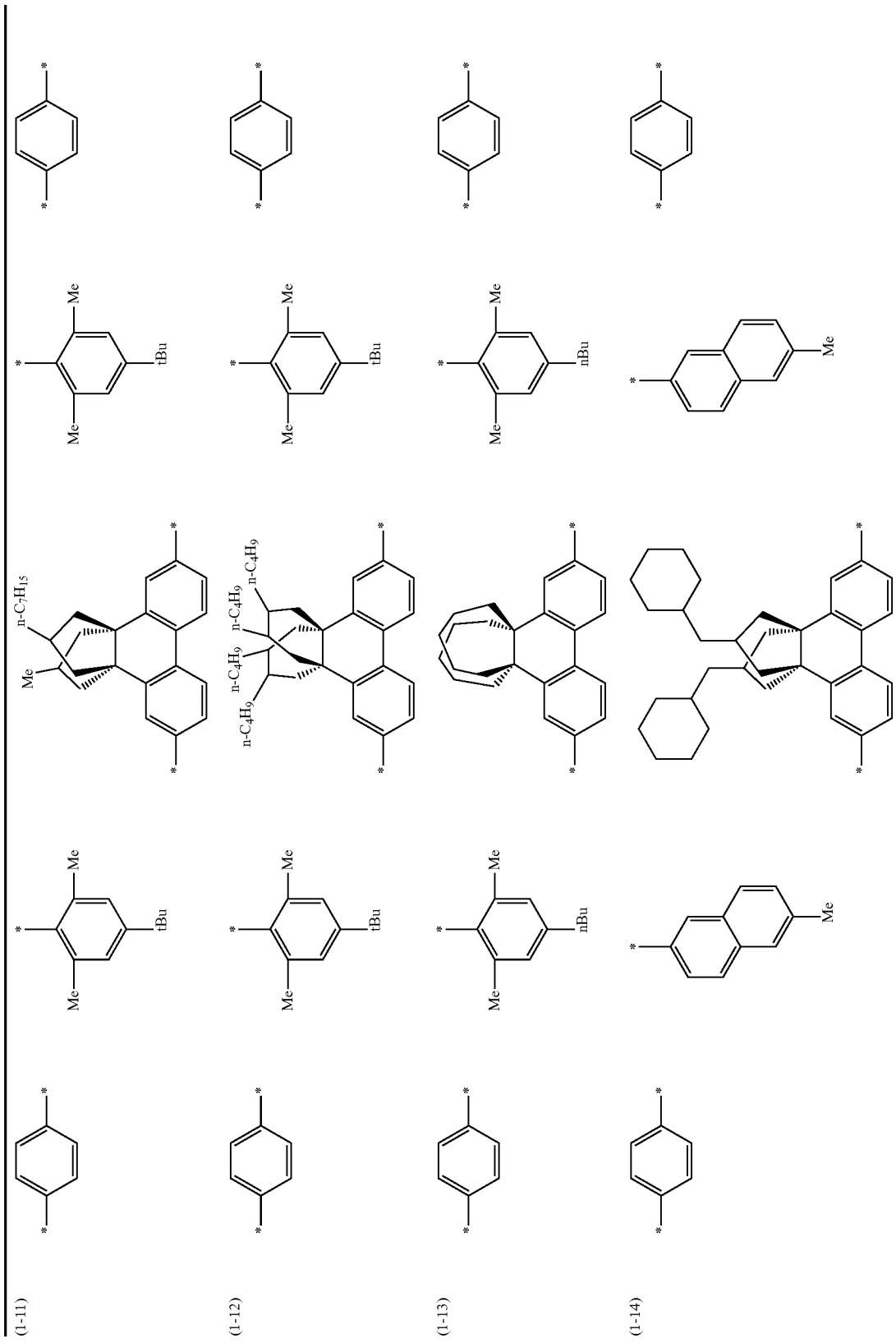

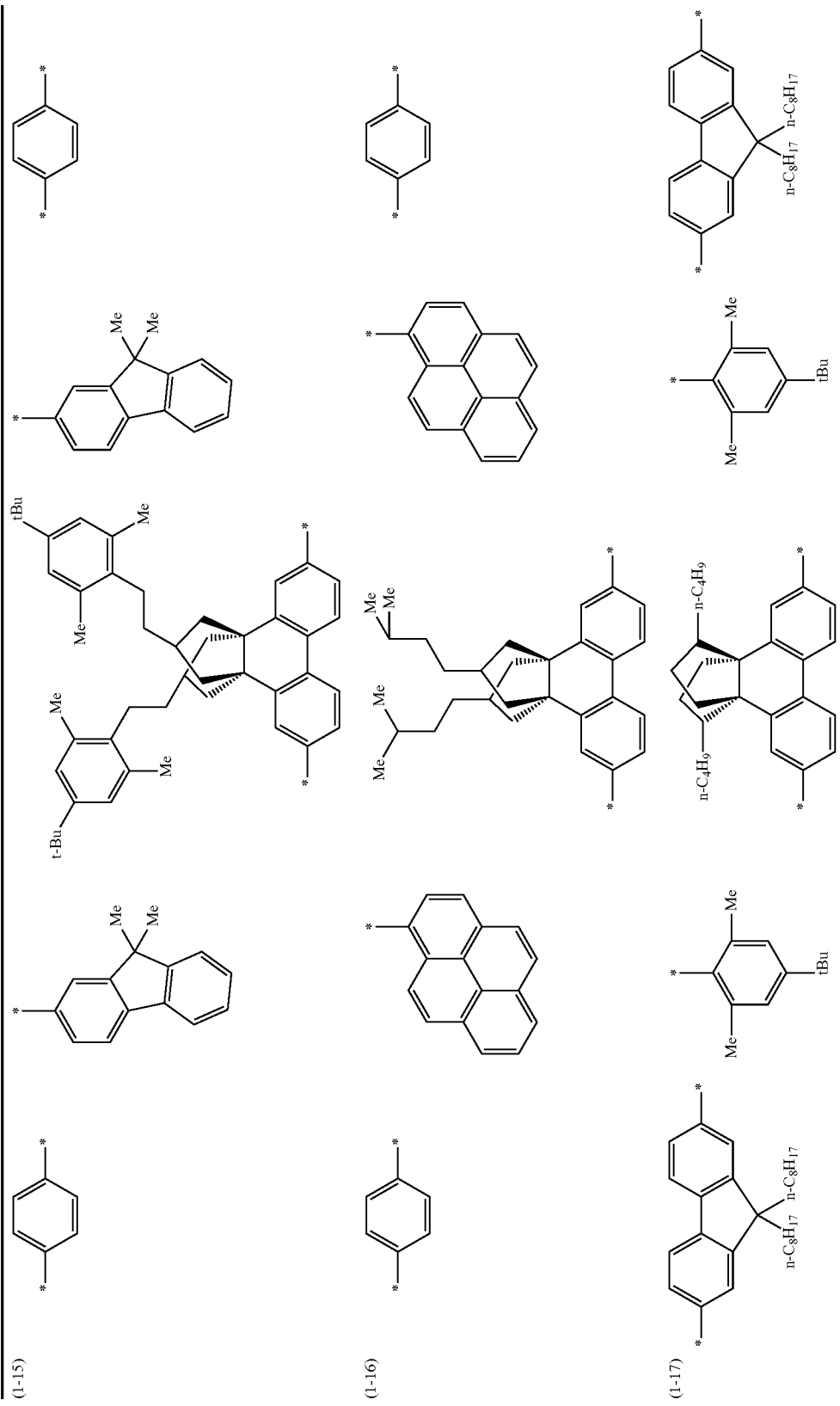

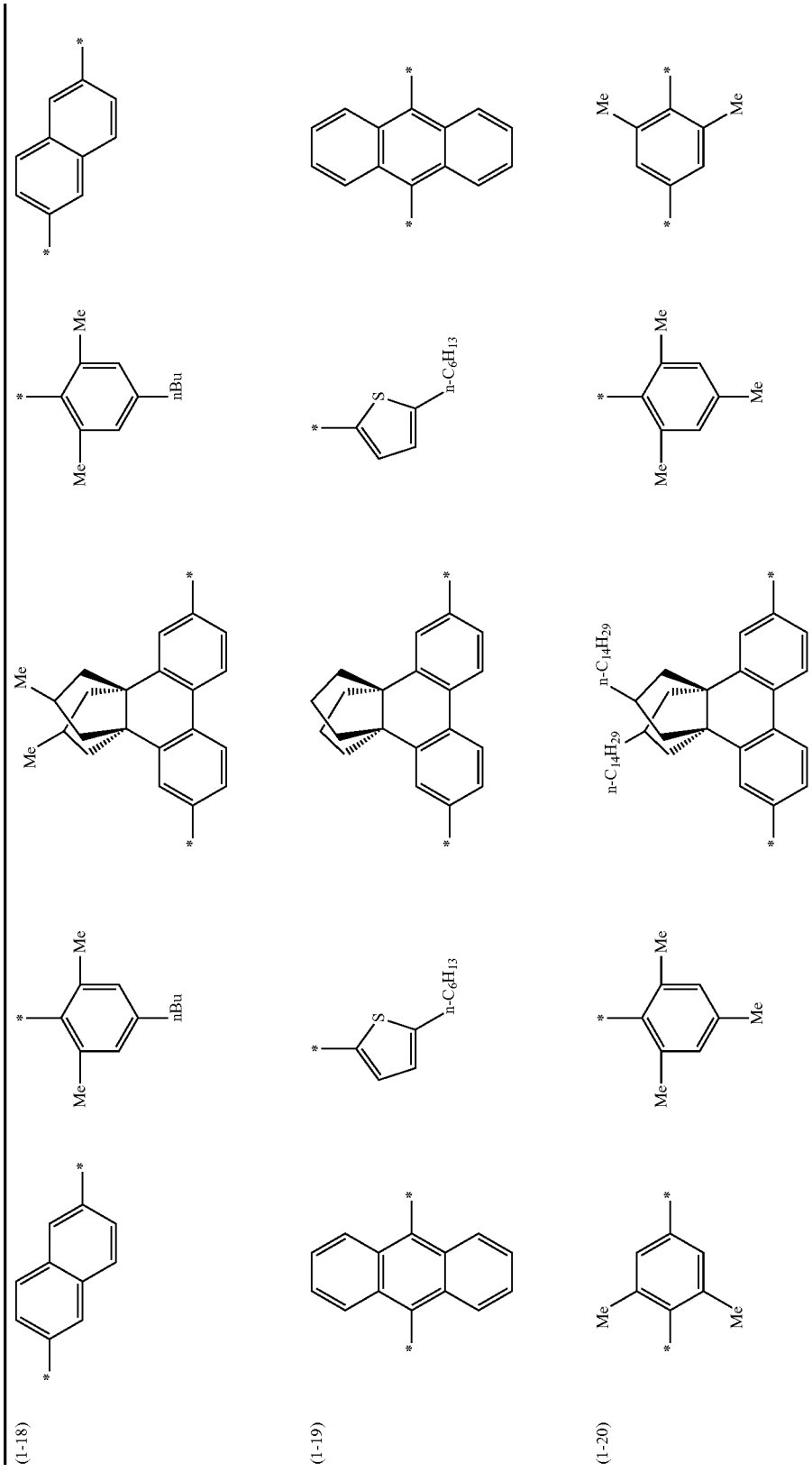

The constituent unit represented by the formula (1') (may also be the constituent unit represented by the formula (1)) may be comprised only singly or two or more constituent units thereof may be comprised in the polymer compound.
(Group A of Cross-Linkable Group)

The substituent which the mono-valent cross-linkable group represented by (1-a) to (1-E), (1 g'), (1-m'), (1-o') and (1-D') may have includes an alkyl group, an alkoxy group, an aryl group, an aryloxy group, a halogen atom, a mono-valent heterocyclic group and a cyano group.

The definition and examples of the alkyl group, the alkoxy group, the aryl group, the aryloxy group and the mono-valent heterocyclic group are the same as the definition and examples of the alkyl group, the alkoxy group, the aryl group, the aryloxy group and the mono-valent heterocyclic group represented by $R^{1'}$, $R^{2'}$, $R^{3'}$, $R^{4'}$, $R^5$, $R^6$, $R^7$, $R^8$, $R^9$ and $R^{10}$, respectively.

As the mono-valent cross-linkable group, mono-valent cross-linkable groups represented by (1-a), (1-c), (1-f), (1-m), (1-m'), (1-n), (1-v), (1-w), (1-x), (1-D) or (1-D') are preferable, and from the standpoint of cross-linkability of the polymer compound of the present embodiment, mono-valent cross-linkable groups represented by the formula (1-m), (1-m'), (1-D) or (1-D') are more preferable, mono-valent cross-linkable groups represented by the formula (1-m) or (1-m') are further preferable, and from the standpoint of stability of the polymer compound of the present embodiment, mono-valent cross-linkable groups represented by the formula (1-a), (1-c), (1-f), (1-n), (1-v), (1-w) or (1-x) are more preferable, mono-valent cross-linkable groups represented by the formula (1-a), (1-v), (1-w) or (1-x) are further preferable, a mono-valent cross-linkable group represented by the formula (1-a) is particularly preferable.

Of the mono-valent cross-linkable group represented by the formula (1-m) and the mono-valent cross-linkable group represented by the formula (1-m'), the mono-valent cross-linkable group represented by the formula (1-m) is preferable. Of the mono-valent cross-linkable group represented by the formula (1-D) and the mono-valent cross-linkable group represented by the formula (1-D'), the mono-valent cross-linkable group represented by the formula (1-D) is preferable.

As the constituent unit having at least one mono-valent cross-linkable group selected form Group A of cross-linkable group, a constituent unit represented by the formula (2) or a constituent unit represented by the formula (2') is preferable, and constituent units represented by the following formulae may also be permissible.

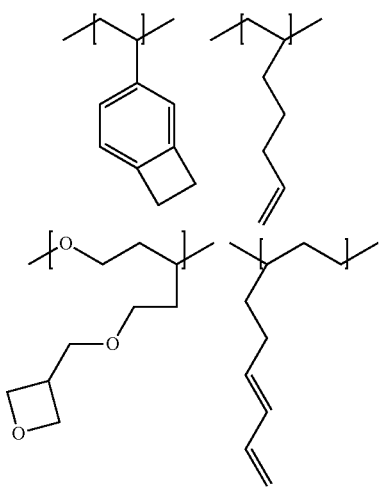

(Constituent Unit Represented by the Formula (2) and Constituent Unit Represented by the Formula (2'))

As the constituent unit having at least one mono-valent cross-linkable group selected form Group A of cross-linkable group, a constituent unit represented by the formula (2) or (2') is preferable

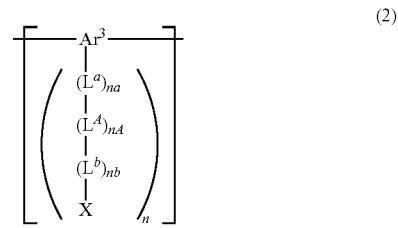

[wherein
na represents an integer of 0 to 3, nb represents an integer of 0 to 12, nA represents 0 or 1 and n represents 1 or 2.

$Ar^3$ represents a (2+n)-valent aromatic hydrocarbon group or a (2+n)-valent heterocyclic group and these groups may have a substituent.

$L^a$ and $L^b$ represent each independently an alkylene group or a phenylenediyl group and these groups may have a substituent. When there exist a plurality of $L^a$, these may be the same or different. When there exist a plurality of $L^b$, these may be the same or different.

$L^A$ represents an oxygen atom or a sulfur atom. When there exist a plurality of $L^A$, these may be the same or different.

X represents a mono-valent cross-linkable group selected from the above-described Group A of cross-linkable group. When there exist a plurality of X, these may be the same or different.].

na is preferably an integer of 0 to 2, more preferably 0 or 1, further preferably 0, because the polymer compound of the present embodiment is more easily produced.

nb is preferably an integer of 0 to 10, more preferably an integer of 0 to 8, because the polymer compound of the present embodiment is more easily produced.

nA is preferably 0, because when the polymer compound of the present embodiment is used for production of a light emitting device, the resulting luminance life is excellent.

n is preferably 2, because when the polymer compound of the present embodiment is used for production of a light emitting device, the resulting luminance life is excellent.

$Ar^3$ is preferably a (2+n)-valent aromatic hydrocarbon group, because when the polymer compound of the present embodiment is used for production of a light emitting device, the resulting luminance life is excellent.

The number of carbon atoms of the (2+n)-valent aromatic hydrocarbon group represented by $Ar^3$ is, not including the number of carbon atoms of a substituent, usually 6 to 60, preferably 6 to 30, more preferably 6 to 18.

The arylene group portion obtained by removing n substituents of the (2+n)-valent aromatic hydrocarbon group represented by $Ar^3$ includes, for example, a 1,3-phenylenediyl group, a 1,4-phenylenediyl group, a 1,4-naphthalenediyl group, a 1,5-naphthalenediyl group, a 2,6-naphthalenediyl group, a 2,7-naphthalenediyl group, a 2,6-anthracenediyl group, a 9,10-anthracenediyl group, a 2,7-phenanthrenediyl group, a 2,7-dihydrophenanthrenediyl group, a 5,12-naphthacenediyl group, a 2,7-fluorenediyl group, a 3,6-fluorenediyl group, a 1,6-pyrenediyl group, a 2,7-pyrenediyl group, a 3,9-perylenediyl group, a 3,10- perylenediyl group, a 6,12-chrysenediyl group and a 2,8-chrysenediyl group, preferably a 1,4-phenylenediyl group, a 2,6-naphthalenediyl group, a 2,7-fluorenediyl group, a 2,6-anthracenediyl group, a 9,10-anthracenediyl group, a 2,7-phenanthrenediyl group, a 9,10-dihydrophenanthrene-2,7-diyl group and a 1,6-pyrenediyl group, more preferably a 1,4-phenylenediyl group, a 2,6-naphthalenediyl group and a 2,7-fluorenediyl group, further preferably a 2,7-fluorenediyl group.

The number of carbon atoms of the (2+n)-valent heterocyclic group represented by $Ar^3$ is, not including the number of carbon atoms of a substituent, usually 2 to 60, preferably 3 to 30, more preferably 3 to 15.

The di-valent heterocyclic group portion obtained by removing n substituents of the (2+n)-valent heterocyclic group represented by $Ar^3$ includes, for example, a 2,5-thiophenediyl group, a 2,5-pyrrolediyl group, a 2,5-furandiyl group, a 2,5-pyridinediyl group, a 2,6-pyridinediyl group, a 2,6-quinolinediyl group, a 1,4-isoquinolinediyl group, a 1,5-isoquinolinediyl group, a 5,8-quinoxalinediyl group, a 2,7-carbazolediyl group, a 3,6-carbazolediyl group, a 3,7-phenoxazinediyl group, a 3,7-phenothiazinediyl group, a 2,8-phenothiazinediyl group, a 4,6-phenothiazinediyl group, a 2,1,3-benzothiadiazole-4,7-diyl group, a 2,7-dibenzofurandiyl group and a 2,7-dibenzothiophenediyl group.

The (2+n)-valent aromatic hydrocarbon group and the (2+n)-valent heterocyclic group represented by $Ar^3$ may have a substituent, and the substituent includes an alkyl group, an alkoxy group, an aryl group, an aryloxy group, a halogen atom, a mono-valent heterocyclic group and a cyano group.

The definition and examples of the alkyl group, the alkoxy group, the aryl group, the aryloxy group and the mono-valent heterocyclic group are the same as the definition and examples of the alkyl group, the alkoxy group, the aryl group, the aryloxy group and the mono-valent heterocyclic group represented by $R^{1'}$, $R^{2'}$, $R^{3'}$, $R^{4'}$, $R^5$, $R^6$, $R^7$, $R^8$, $R^9$ and $R^{10}$, respectively.

The alkylene group represented by $L^a$ and $L^b$ may be any of linear, branched or cyclic, and may have a substituent. It is preferably a linear alkylene group, because the polymer compound of the present embodiment is more easily produced. The number of carbon atoms of the linear alkylene group is usually 1 to 20, preferably 1 to 10, more preferably 1 to 6. The number of carbon atoms of the branched alkylene group or the cyclic alkylene group is usually 3 to 20, preferably 3 to 10, more preferably 3 to 6.

The alkylene group includes, for example, a methylene group, a 1,2-ethylene group, a 1,3-propylene group, a 1,3-butylene group, a 1,3-pentylene group, a 1,4-pentylene group, a 1,5-pentylene group, a 1,4-hexylene group, a 1,6-hexylene group, a 1,7-heptylene group, a 1,6-octylene group and a 1,8-octylene group, preferably a methylene group. The substituent which the alkylene group may have includes, for example, an alkoxy group, a halogen atom and a cyano group.

The definition and examples of the alkoxy group are the same as the definition and examples of the alkoxy group represented by $R^{1'}$, $R^{2'}$, $R^{3'}$, $R^{4'}$, $R^5$, $R^6$, $R^7$, $R^8$, $R^9$ and $R^{10}$, respectively.

The phenylenediyl group represented by $L^a$ and $L^b$ may have a substituent. The phenylenediyl group includes an o-phenylenediyl group, a m-phenylenediyl group and a p-phenylenediyl group. The substituent which the phenylenediyl group may have includes, for example, an alkyl group, an alkoxy group, a halogen atom and a cyano group.

The definition and examples of the alkyl group and the alkoxy group are the same as the definition and examples of the alkyl group and the alkoxy group represented by $R^{1'}$, $R^{2'}$, $R^{3'}$, $R^{4'}$, $R^5$, $R^6$, $R^7$, $R^8$, $R^9$ and $R^{10}$, respectively.

$L^a$ represents preferably a phenylenediyl group, because the polymer compound of the present embodiment is more easily produced.

$L^b$ represents preferably an alkylene group, more preferably a methylene group, because the polymer compound of the present embodiment is more easily produced.

$L^A$ represents preferably an oxygen atom, because the polymer compound of the present embodiment is more easily produced.

As the mono-valent cross-linkable group represented by X, mono-valent cross-linkable groups represented by the formula (1-a), (1-c), (1-f), (1-m), (1-m'), (1-n), (1-v), (1-w), (1-x), (1-D) or (1-D') are preferable, mono-valent cross-linkable groups represented by the formula (1-a), (1-m), (1-m'), (1-v), (1-w), (1-x), (1-D) or (1-D') are more preferable, mono-valent cross-linkable groups represented by the formula (1-a), (1-m) or (1-m') are further preferable, because the polymer compound of the present embodiment is excellent in cross-linkability.

Of the mono-valent cross-linkable group represented by the formula (1-m) and the mono-valent cross-linkable group represented by the formula (1-m') as the mono-valent cross-linkable group by X, the mono-valent cross-linkable group represented by the formula (1-m) is preferable. Of the mono-valent cross-linkable group represented by the formula (1-D) and the mono-valent cross-linkable group represented by the formula (1-D') as the mono-valent cross-linkable group by X, the mono-valent cross-linkable group represented by the formula (1-D) is preferable.

The content of the constituent unit represented by the formula (2) is preferably 0.5 to 40 mol %, more preferably 3 to 30 mol %, further preferably 3 to 20 mol %, particularly preferably 3 to 15 mol % with respect to the total content of constituent units contained in the polymer compound, because the polymer compound of the present embodiment is more excellent in stability and the polymer compound of the present embodiment is excellent in cross-linkability The constituent unit represented by the formula (2) may be comprised only singly or two or more units thereof may be comprised in the polymer compound.

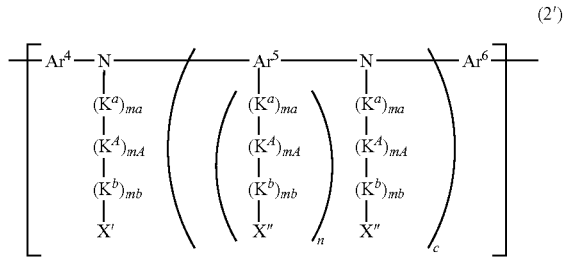

(2')

[wherein
ma represents an integer of 0 to 3, mb represents an integer of 0 to 12, mA represents 0 or 1, m represents 1 or 2 and c represents 0 or 1. When there exist a plurality of each of ma, mb and mA, the plurality of ma, mb and mA may each be mutually the same or different.

$Ar^5$ represents a (2+m)-valent aromatic hydrocarbon group, a (2+m)-valent heterocyclic group or a (2+m)-valent group having a structure of linkage of two or more identical or different rings selected from the group consisting of aromatic rings and heterocycles and these groups may have a substituent.

$Ar^4$ and $Ar^6$ represent each independently an arylene group or a di-valent heterocyclic group and these groups may have a substituent.

$Ar^4$, $Ar^5$ and $Ar^6$ may each form a ring structure by mutual linkage of each group with other group than the each group linked to a nitrogen atom to which the each group is linked.

$K^a$ and $K^b$ represent each independently an alkylene group or a phenylenediyl group and these groups may have a substituent. When there exist a plurality of $K^a$, these may be the same or different. When there exist a plurality of $K^b$, these may be the same or different.

$K^A$ represents an oxygen atom or a sulfur atom. When there exist a plurality of $K^A$, these may be the same or different.

X' represents a mono-valent cross-linkable group selected from the above-described Group A of cross-linkable group, an alkyl group, an aryl group or a mono-valent heterocyclic group and these groups may have a substituent.

X" represents a mono-valent cross-linkable group selected from the above-described Group A of cross-linkable group, an alkyl group, an aryl group or a mono-valent heterocyclic group and these groups may have a substituent. When there exist a plurality of X", these may be the same or different.

Here, at least one group selected from the group consisting of X' and X" is a mono-valent cross-linkable group selected from the above-described Group A of cross-linkable group, and the constituent unit represented by the formula (2') is different from the constituent unit represented by the above-described formula (1).].

ma is preferably an integer of 0 to 2, more preferably 0 or 1, further preferably 0, because the polymer compound of the present embodiment is more easily produced.

mb is preferably an integer of 0 to 10, more preferably an integer of 0 to 8, because the polymer compound of the present embodiment is more easily produced.

mA is preferably 0, because when the polymer compound of the present embodiment is used for production of a light emitting device, the resulting luminance life is excellent.

m is preferably 2, because when the polymer compound of the present embodiment is used for production of a light emitting device, the resulting luminance life is excellent.

c is preferably 0, because the polymer compound of the present embodiment is more easily produced and when the polymer compound of the present embodiment is used for production of a light emitting device, the resulting luminance life is excellent.

$Ar^5$ represents preferably a (2+m)-valent aromatic hydrocarbon group, because when the polymer compound of the present embodiment is used for production of a light emitting device, the resulting luminance life is excellent.

The definition and examples of the arylene group portion obtained by removing m substituents of the (2+m)-valent aromatic hydrocarbon group represented by $Ar^5$ are the same as the definition and examples of the arylene group represented by $Ar^9$ in the formula (4) described below.

The definition and examples of the di-valent heterocyclic group portion obtained by removing m substituents of the (2+m)-valent heterocyclic group represented by $Ar^3$ are the same as the definition and examples of the di-valent heterocyclic group portion represented by $Ar^9$ in the formula (4) described below.

The definition and examples of the di-valent group obtained by removing m substituents of the (2+m)-valent group having a structure of linkage of two or more identical or different rings selected from the group consisting of aromatic rings and heterocycles represented by $Ar^5$ are the same as the definition and examples of the di-valent group having a structure of linkage of two or more identical or different groups selected from the group consisting of the di-valent heterocyclic group and the arylene group represented by $Ar^9$ in the formula (4) described below.

$Ar^4$ and $Ar^6$ represent preferably an arylene group, because when the polymer compound of the present embodiment is used for production of a light emitting device, the resulting luminance life is excellent.

The definition and examples of the arylene group represented by $Ar^4$ and $Ar^6$ are the same as the definition and examples of the arylene group represented by $Ar^8$ and $Ar^{10}$ in the formula (4) described below.

The definition and examples of the di-valent heterocyclic group represented by $Ar^4$ and $Ar^6$ are the same as the definition and examples of the di-valent heterocyclic group represented by $Ar^8$ and $Ar^{10}$ in the formula (4) described below.

The group represented by $Ar^4$, $Ar^5$ and $Ar^6$ may have a substituent, and the substituent includes an alkyl group, an alkoxy group, an aryl group, an aryloxy group, a halogen atom, a mono-valent heterocyclic group and a cyano group.

The definition and examples of the alkyl group, the alkoxy group, the aryl group, the aryloxy group and the mono-valent heterocyclic group are the same as the definition and examples of the alkyl group, the alkoxy group, the aryl group, the aryloxy group and the mono-valent heterocyclic group represented by $R^{1\dagger}$, $R^{2\dagger}$, $R^{3\dagger}$, $R^{4\dagger}$, $R^5$, $R^6$, $R^7$, $R^8$, $R^9$ and $R^{10}$, respectively.

$K^a$ represents preferably a phenylenediyl group, because the polymer compound of the present embodiment is more easily produced.

The definition and examples of the alkylene group and the phenylenediyl group represented by $K^a$ are the same as the definition and examples of the alkylene group and the phenylenediyl group represented by $L^a$, respectively.

$K^b$ represents preferably an alkylene group, more preferably a methylene group, because the polymer compound of the present embodiment is more easily produced.

The definition and examples of the alkylene group and the phenylenediyl group represented by $K^b$ are the same as the definition and examples of the alkylene group and the phenylenediyl group represented by $L^b$, respectively.

$K^A$ represents preferably an oxygen atom, because the polymer compound of the present embodiment is more easily produced.

As the mono-valent cross-linkable group represented by X' and X", mono-valent cross-linkable groups represented by the formula (1-a), (1-c), (1-f), (1-m), (1-m'), (1-n), (1-v), (1-w), (1-x), (1-D) or (1-D') are preferable, mono-valent cross-linkable groups represented by the formula (1-a), (1-m), (1-m'), (1-v), (1-w), (1-x), (1-D) or (1-D') are more preferable, mono-valent cross-linkable groups represented by the formula (1-a), (1-m) or (1-m') are further preferable, because the polymer compound of the present embodiment is excellent in cross-linkability.

Of the mono-valent cross-linkable group represented by the formula (1-m) and the mono-valent cross-linkable group represented by the formula (1-m') as the mono-valent cross-linkable group represented by X' and X", the mono-valent cross-linkable group represented by the formula (1-m) is preferable. Of the mono-valent cross-linkable group represented by the formula (1-D) and the mono-valent cross-linkable group represented by the formula (1-D') as the mono-valent cross-linkable group represented by X' and X", the mono-valent cross-linkable group represented by the formula (1-D) is preferable.

When both X' and X" represent a mono-valent cross-linkable group, it is preferable that they are the same mono-valent cross-linkable groups, because the polymer compound of the present embodiment is more easily produced and the polymer compound of the present embodiment is excellent in cross-linkability.

The definition and examples of the alkyl group, the aryl group and the mono-valent heterocyclic group represented by X' and X" are the same as the definition and examples of the alkyl group, the aryl group and the mono-valent heterocyclic group represented by $R^{1\prime}$, $R^{2\prime}$, $R^{3\prime}$, $R^{4\prime}$, $R^5$, $R^6$, $R^7$, $R^8$, $R^9$ and $R^{10}$, respectively.

The content of the constituent unit represented by the formula (2') is preferably 0.5 to 40 mol %, more preferably 3 to 30 mol %, further preferably 3 to 20 mol %, particularly preferably 3 to 15 mol % with respect to the total content of constituent units contained in the polymer compound, because the polymer compound of the present embodiment is more excellent in stability and the polymer compound of the present embodiment is excellent in cross-linkability.

The constituent unit represented by the formula (2') may be comprised only singly or two or more units thereof may be comprised in the polymer compound.

The constituent unit represented by the formula (2) includes, for example, constituent units represented by the following formula (2-1) to formula (2-29), and the constituent unit represented by the formula (2') includes, for example, constituent units represented by any of the following formula (2'-1) to formula (2'-9). Of them, constituent units represented by any of the formula (2-1) to formula (2-29) are preferable, constituent units represented by any of the formula (2-1) to formula (2-15), formula (2-19), formula (2-20), formula (2-23) and formula (2-25) are more preferable, constituent units represented by any of the formula (2-1) to formula (2-13) are further preferable, constituent units represented by any of the formula (2-1) to formula (2-9) are particularly preferable, because the polymer compound of the present embodiment is excellent in cross-linkability.

(2-1)

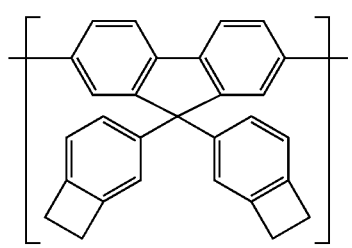

(2-2)

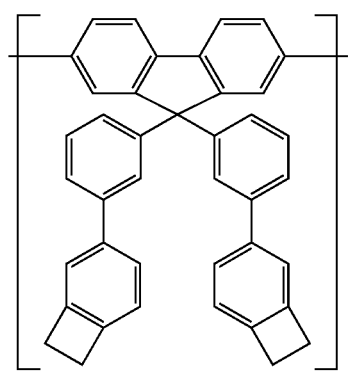

(2-3)

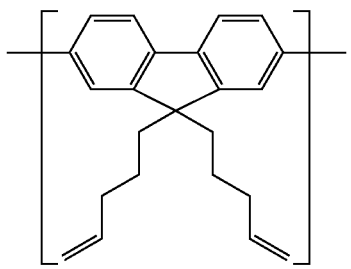

(2-4)

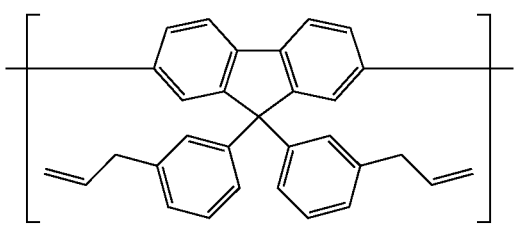

(2-5)

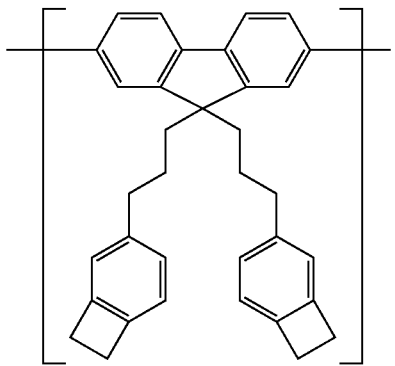

(2-6)

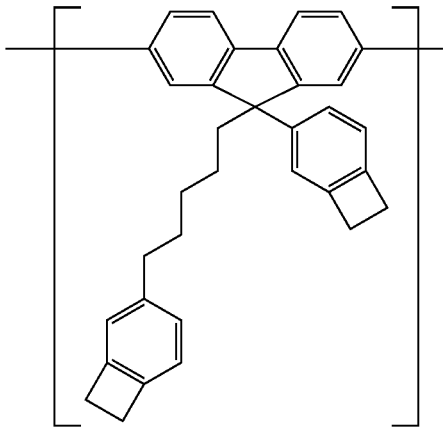

(2-7)
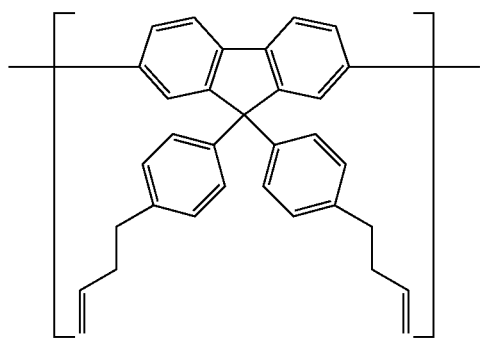
(2-8)
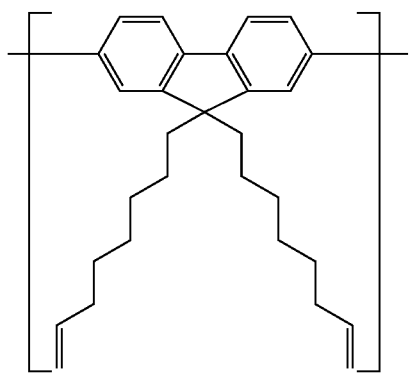
(2-9)
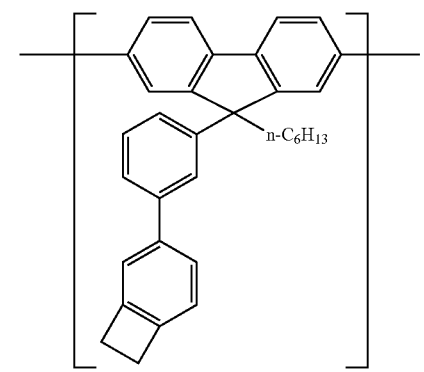
(2-10)
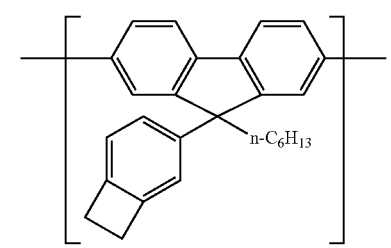
(2-11)
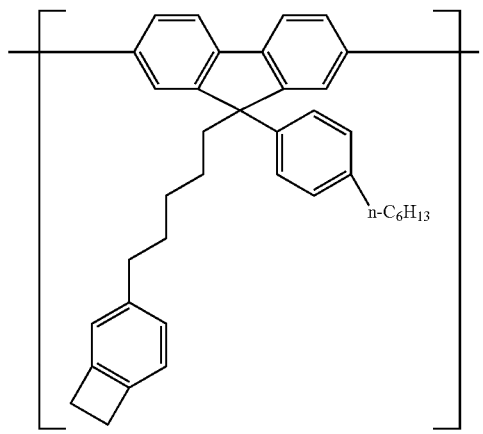
(2-12)
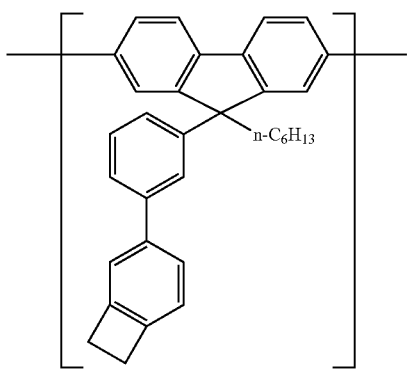
(2-13)
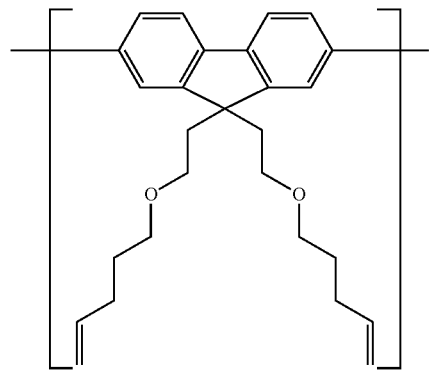
(2-14)
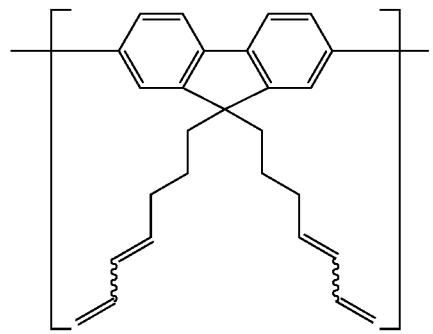

(2-15)
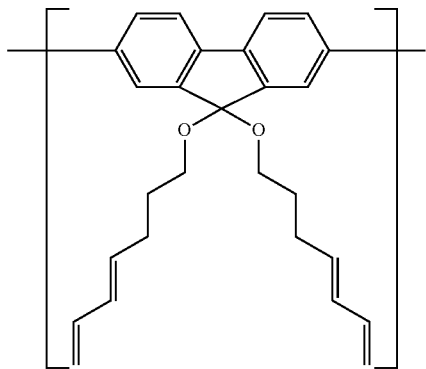
(2-19)
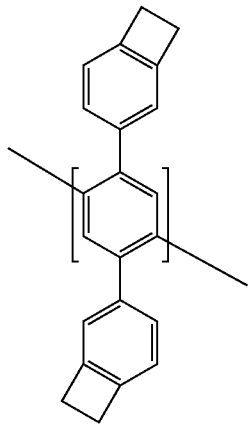
(2-16)
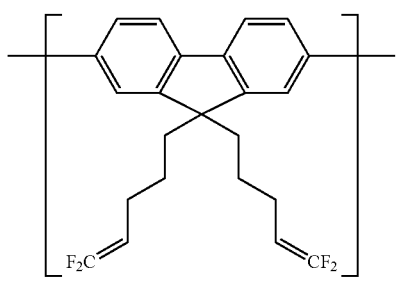
(2-17)
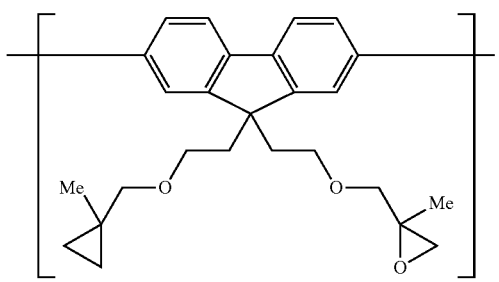
(2-20)
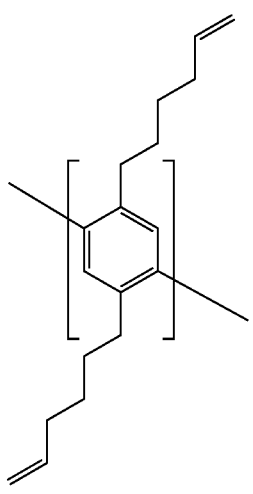
(2-18)
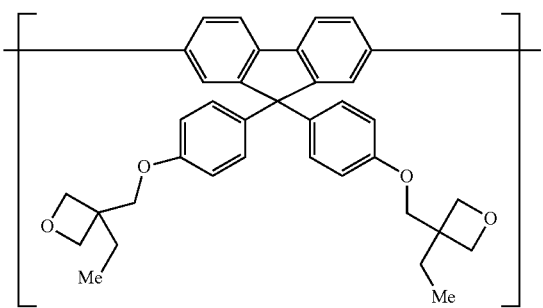
(2-21)
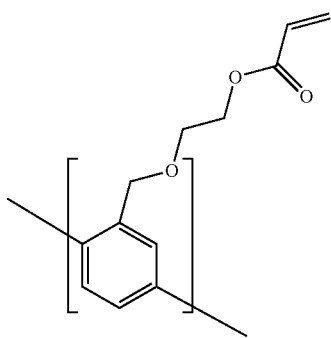

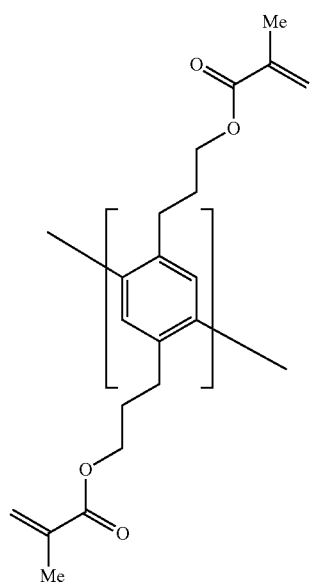
(2-22)
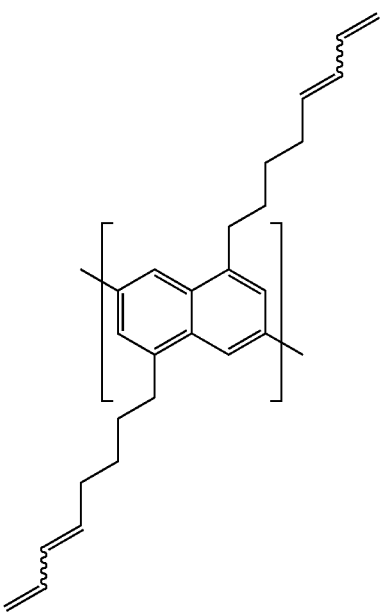
(2-24)
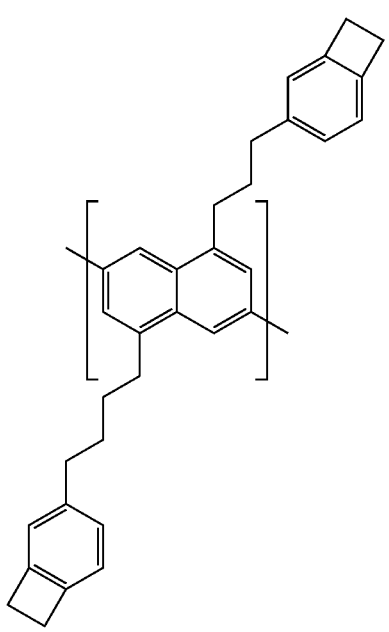
(2-23)
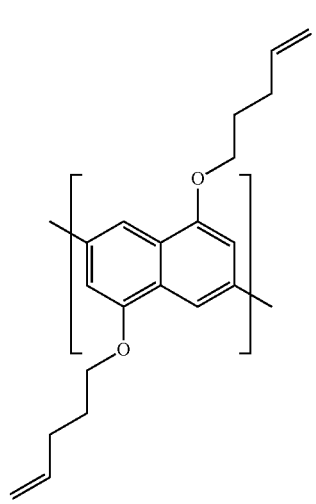
(2-25)

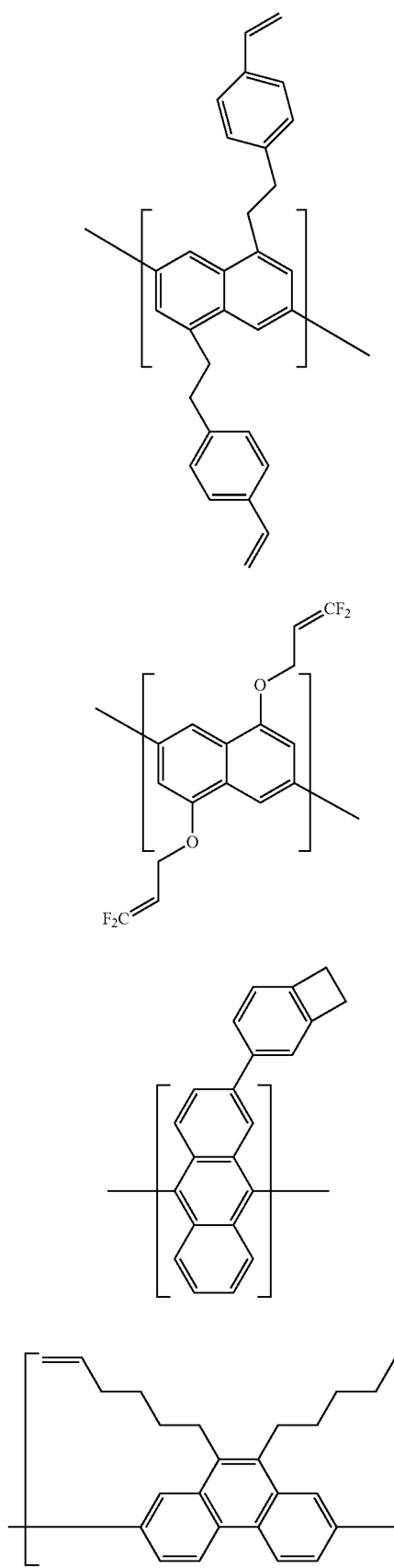
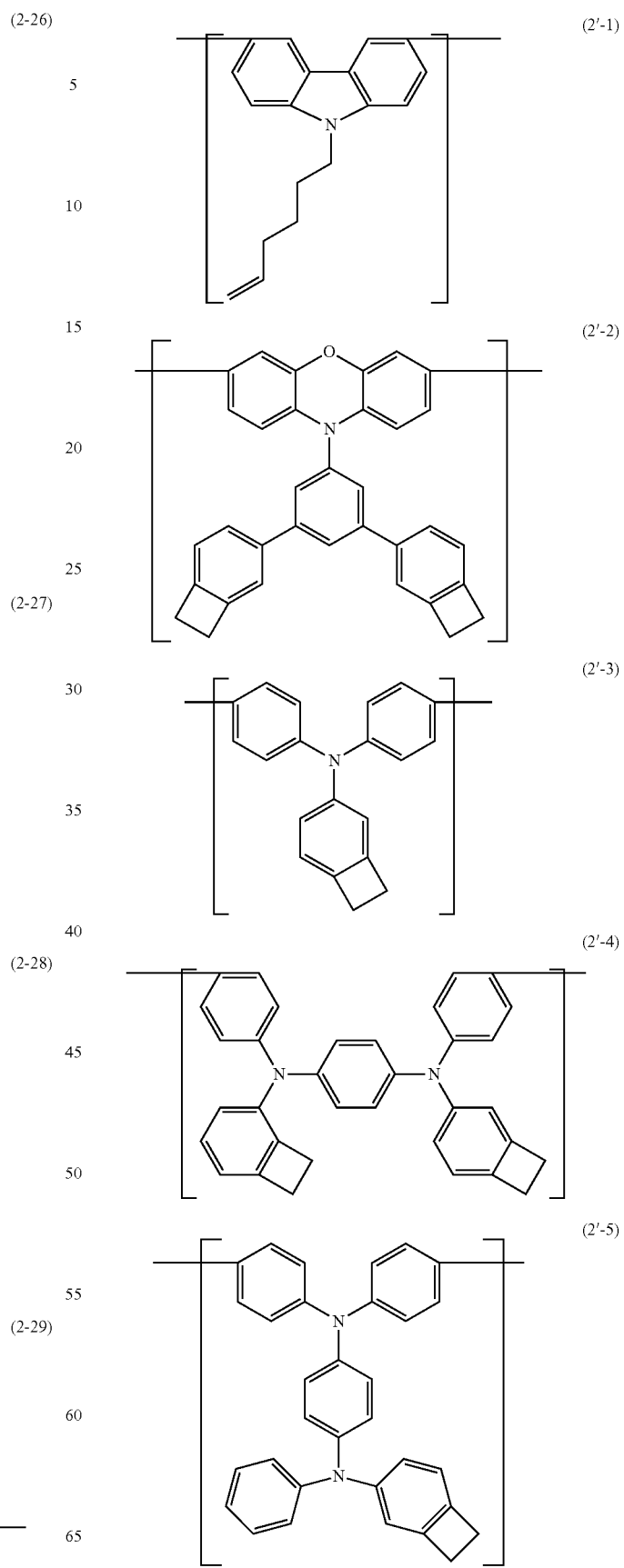

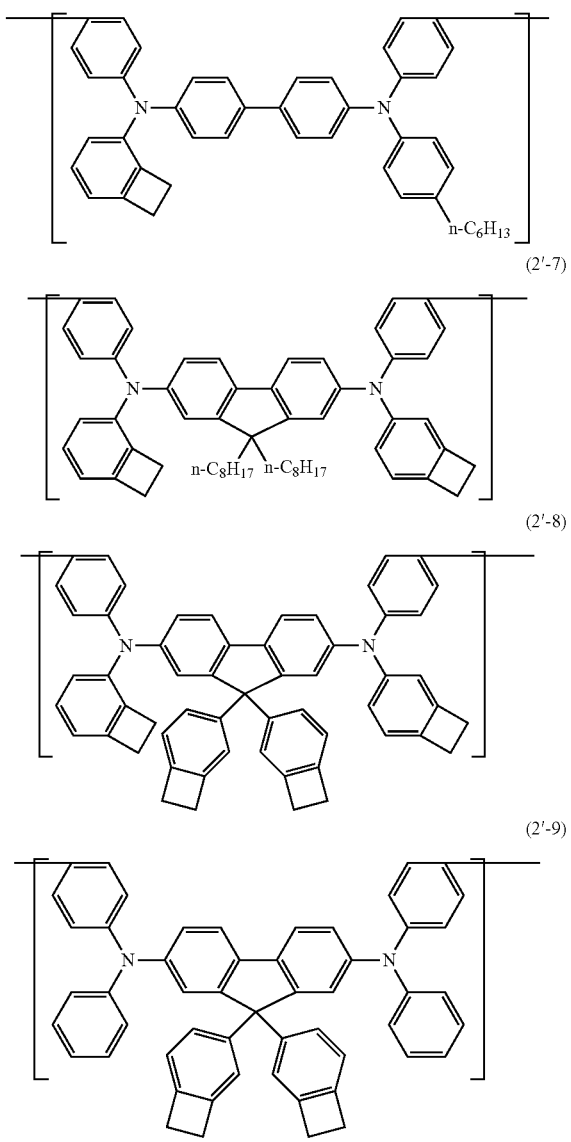

(2'-6)

(2'-7)

(2'-8)

(2'-9)

(Constituent Unit Represented by the Formula (3))

The polymer compound of the present embodiment preferably comprises a constituent unit represented by the formula (3), in addition to the constituent unit represented by the formula (1') (may also be the constituent unit represented by the formula (1)) and the constituent unit having at least one mono-valent cross-linkable group selected from the above-described Group A of cross-linkable group.

(3)

[wherein $Ar^7$ represents an arylene group or a di-valent heterocyclic group and these groups may have a substituent.

Here, the constituent unit represented by the formula (3) is different from the constituent unit represented by the above-described formula (2).].

The number of carbon atoms of the arylene group represented by $Ar^7$ is, not including the number of carbon atoms of a substituent, preferably 6 to 60, more preferably 6 to 30, further preferably 6 to 18.

The arylene group represented by $Ar^7$ includes, for example, a 1,2-phenylenediyl group, a 1,3-phenylenediyl group, a 1,4-phenylenediyl group, a 1,4-naphthalenediyl group, a 1,5-naphthalenediyl group, a 2,6-naphthalenediyl group, a 2,7-naphthalenediyl group, a 2,6-anthracenediyl group, a 9,10-anthracenediyl group, a 2,7-phenanthrenediyl group, a 9,10-dihydrophenanthrene-2,7-diyl group, a 5,12-naphthacenediyl group, a 2,7-fluorenediyl group, a 3,6-fluorenediyl group, a 1,6-pyrenediyl group, a 2,7-pyrenediyl group, a 3,9-perylenediyl group, a 3,10-perylenediyl group, a 6,12-chrysenediyl group and a 2,8-chrysenediyl group.

The arylene group represented by $Ar^7$ is preferably a 1,4-phenylenediyl group, a 2,7-fluorenediyl group, a 2,6-anthracenediyl group, a 9,10-anthracenediyl group, a 2,7-phenanthrenediyl group, a 2,7-dihydrophenanthrenediyl group, a 2,6-naphthalenediyl group or a 1,6-pyrenediyl group, more preferably a 1,4-phenylenediyl group or a 2,7-fluorenediyl group, because when the polymer compound of the present embodiment is used for production of a light emitting device, the resulting light emitting device is excellent in luminance life.

The number of carbon atoms of the di-valent heterocyclic group represented by $Ar^7$ is, not including the number of carbon atoms of a substituent, preferably 3 to 30, more preferably 3 to 15, further preferably 4 to 15.

The di-valent heterocyclic group represented by $Ar^4$ includes, for example, a 2,5-thiophenediyl group, a 2,5-pyrrolediyl group, a 2,5-furandiyl group, a 2,5-pyridinediyl group, a 2,6-pyridinediyl group, a 2,6-quinolinediyl group, a 1,4-isoquinolinediyl group, a 1,5-isoquinolinediyl group, a 5,8-quinoxalinediyl group, a 2,7-carbazolediyl group, a 3,6-carbazolediyl group, a 3,7-phenoxazinediyl group, a 3,7-phenothiazinediyl group, a 2,8-phenothiazinediyl group, a 4,6-phenothiazinediyl group, a 2,1,3-benzothiadiazole-4,7-diyl group, a 2,7-dibenzofurandiyl group and a 2,7-dibenzothiophenediyl group.

The arylene group and the di-valent heterocyclic group represented by $Ar^7$ may have a substituent. The substituent includes an alkyl group, an alkoxy group, an aryl group, an aryloxy group, a halogen atom, a mono-valent heterocyclic group and a cyano group, preferably an alkyl group and an aryl group.

The definition and examples of the alkyl group, the alkoxy group, the aryl group, the aryloxy group and the mono-valent heterocyclic group are the same as the definition and examples of the alkyl group, the alkoxy group, the aryl group, the aryloxy group and the mono-valent heterocyclic group represented by $R^{1'}$, $R^{2'}$, $R^{3'}$, $R^{4'}$, $R^5$, $R^6$, $R^7$, $R^8$, $R^9$ and $R^{10}$, respectively.

It is preferable that the polymer compound of the present embodiment comprises a fluorenediyl group which may have a substituent or a phenylenediyl group which may have a substituent, as the constituent unit represented by the formula (3).

The constituent unit represented by the formula (3) includes, for example, constituent units represented by the following formulae (3-1) to (3-62), and because when the polymer compound of the present embodiment is used for production of a light emitting device, the resulting luminance life is excellent, constituent units represented by any of the following formulae (3-1) to (3-48), (3-58) to (3-62) are preferable, constituent units represented by any of the following formulae (3-1) to (3-30), (3-58), (3-61) to (3-62)

are more preferable, constituent units represented by any of the following formulae (3-1), (3-7), (3-15), (3-24), (3-58) and (3-62) are further preferable.
(3-1)
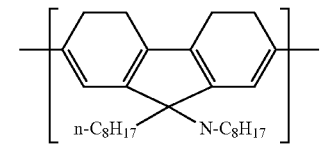
(3-2)
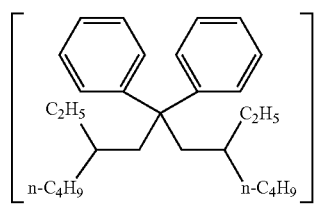
(3-3)
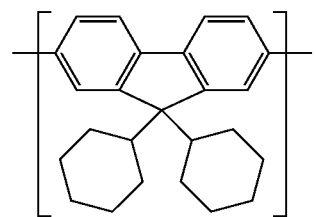
(3-4)
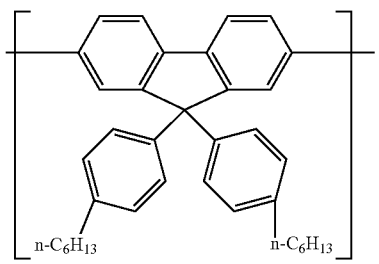
(3-5)
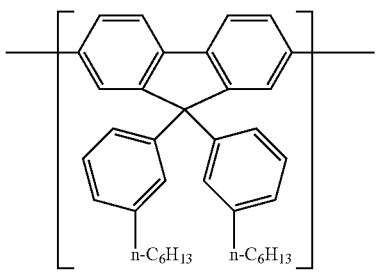
(3-6)
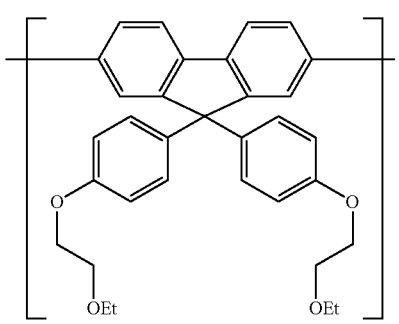
-continued
(3-7)
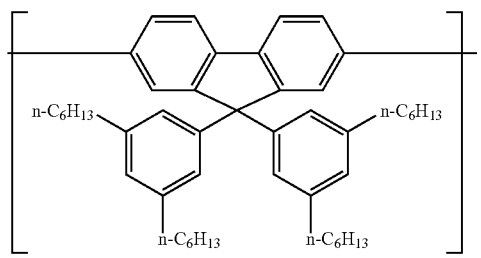
(3-8)
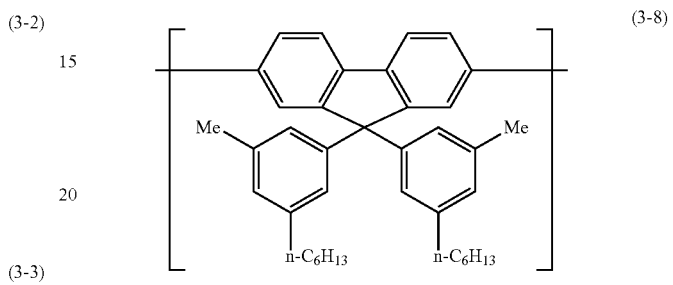
(3-9)
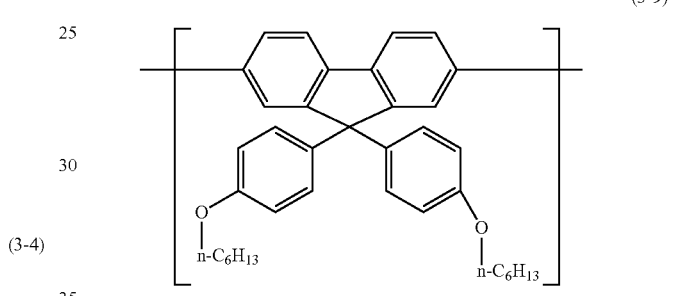
(3-10)
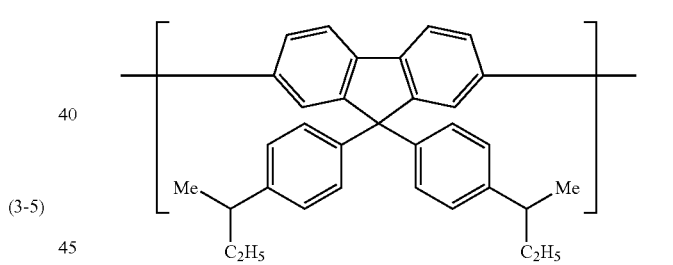
(3-11)
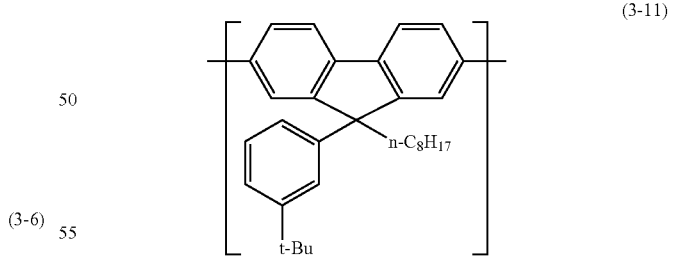
(3-12)
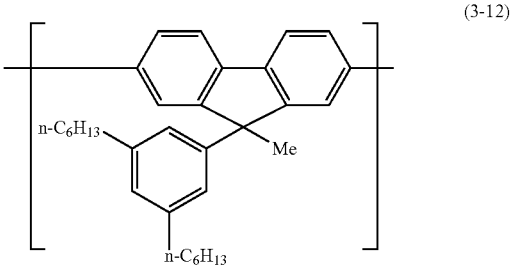

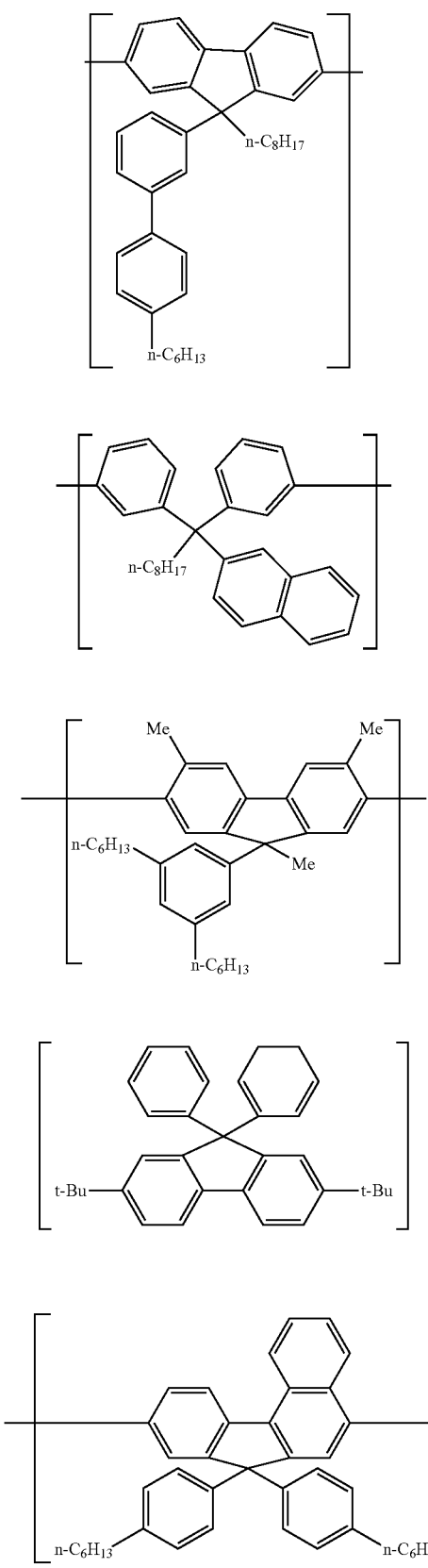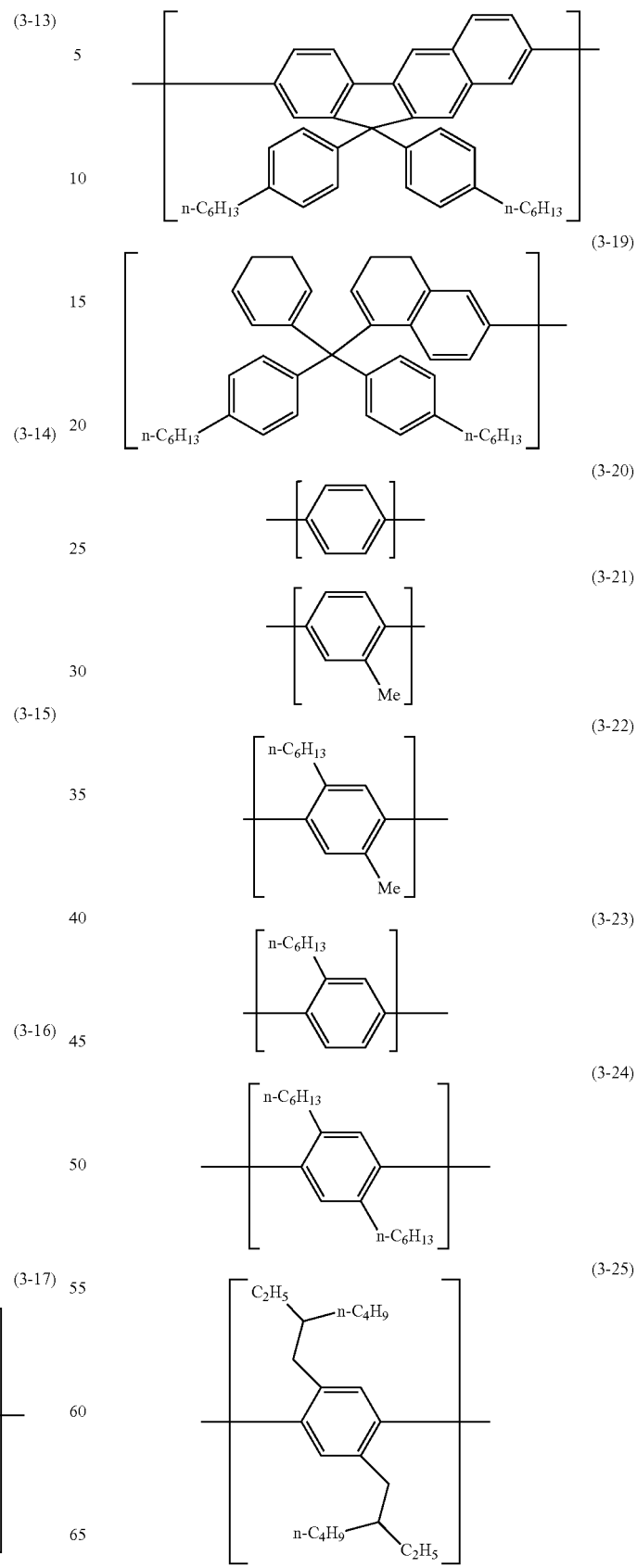

(3-26) 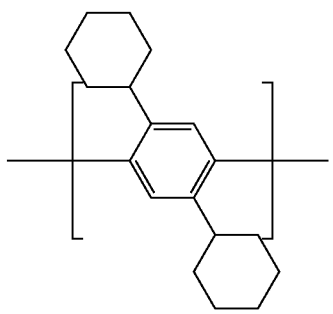
(3-27) 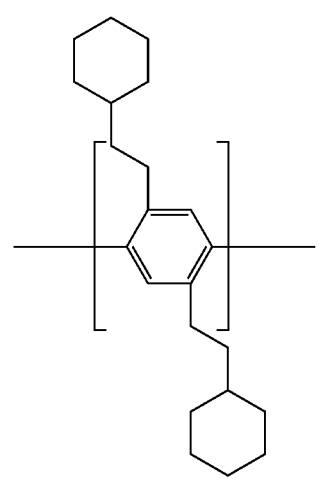
(3-28) 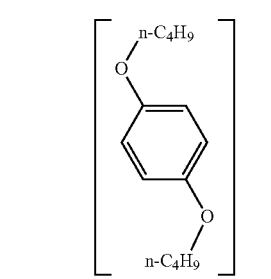
(3-29) 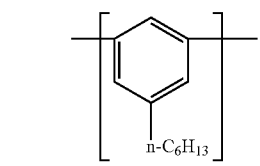
(3-30) 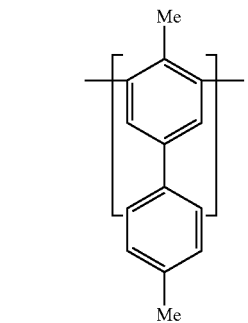
(3-31) 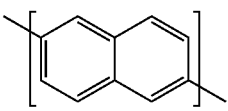
(3-32) 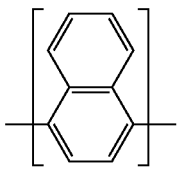
(3-33) 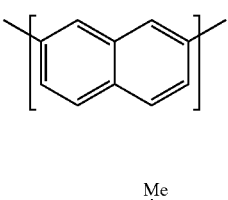
(3-34) 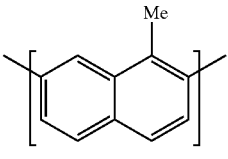
(3-35) 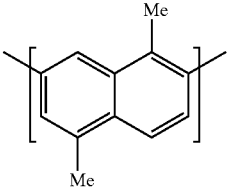
(3-36) 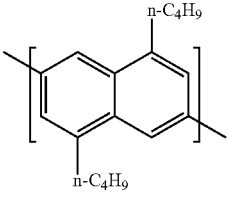
(3-37) 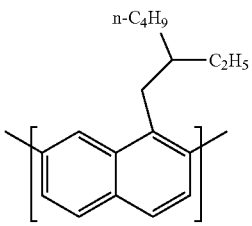
(3-38) 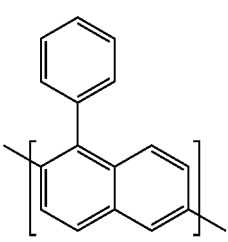

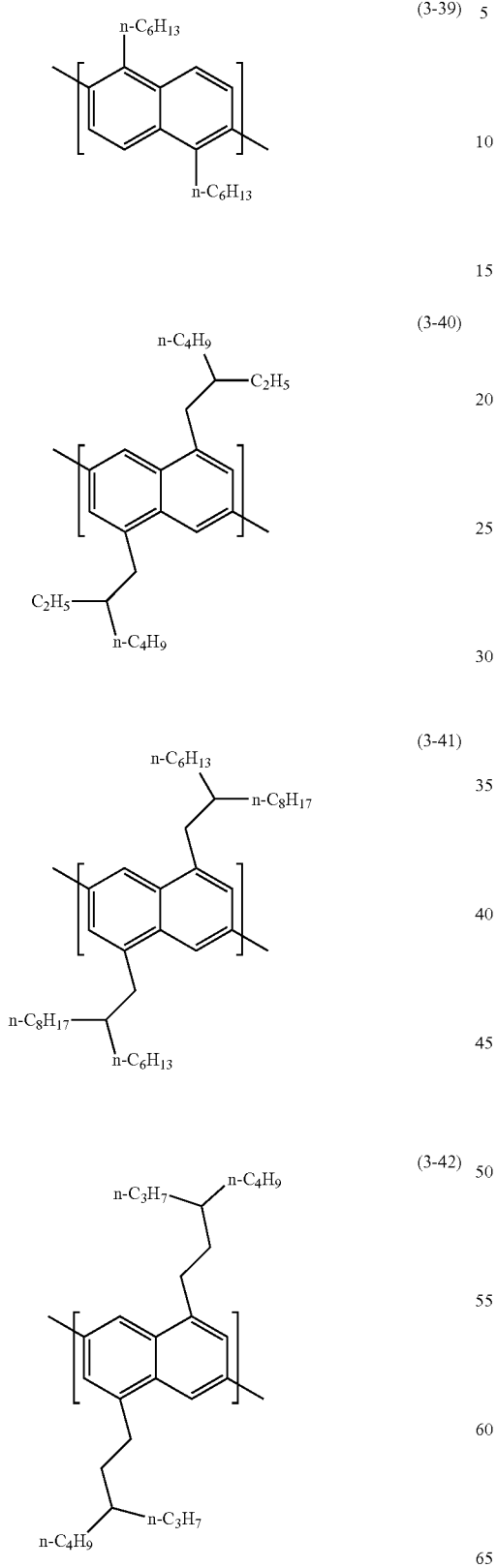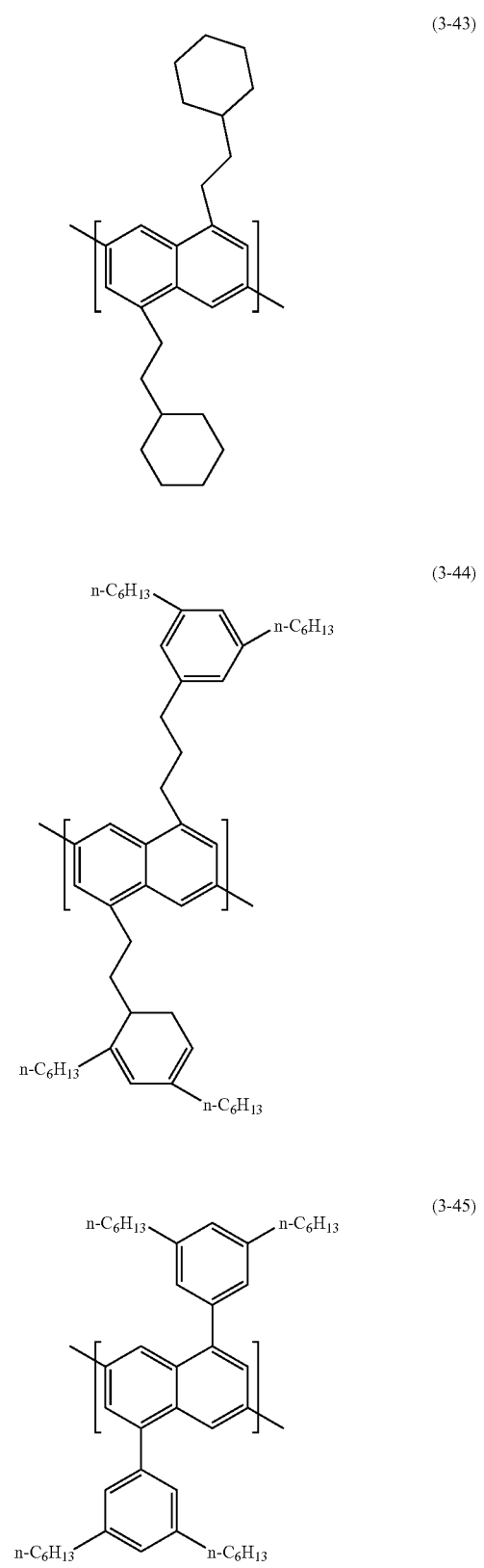

(3-46)
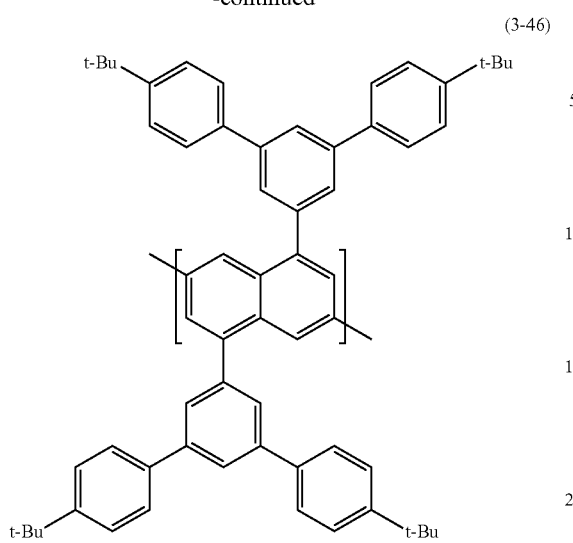
(3-47)
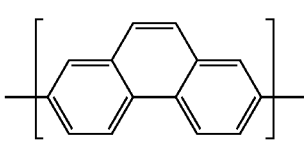
(3-48)
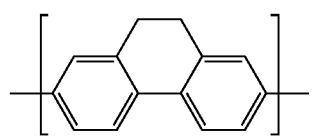
(3-49)
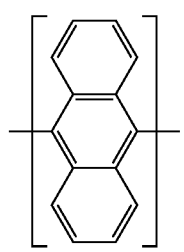
(3-50)
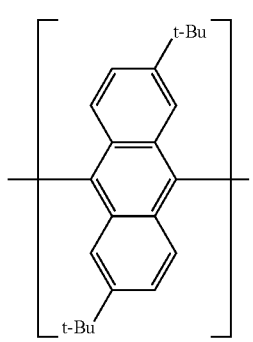
(3-51)
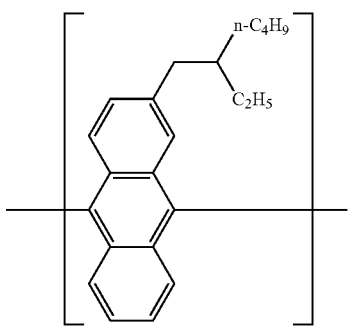
(3-52)
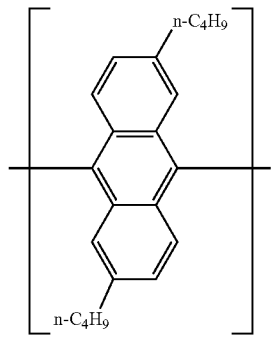
(3-53)
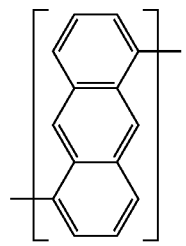
(3-54)
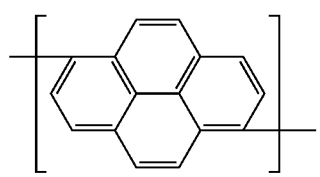
(3-55)
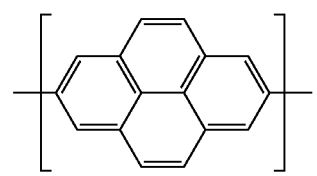
(3-56)
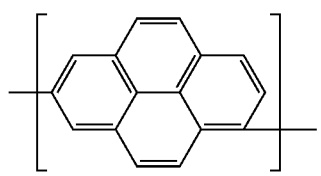

-continued (3-57)
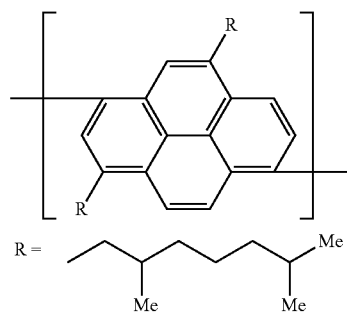

(3-58)
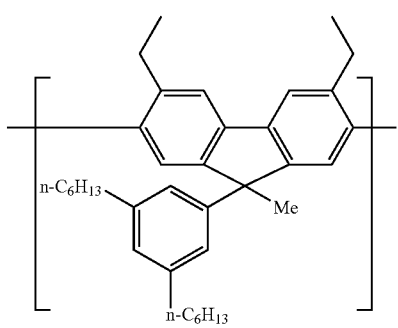

(3-59)
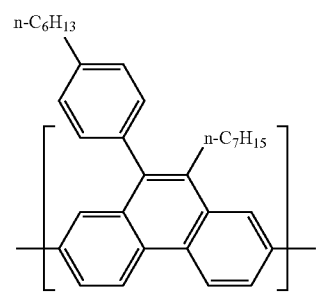

(3-60)
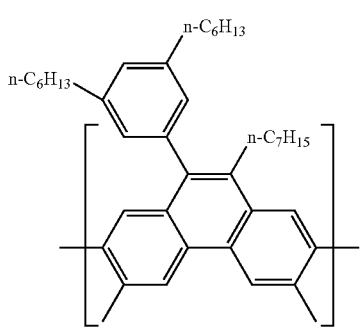

(3-61)
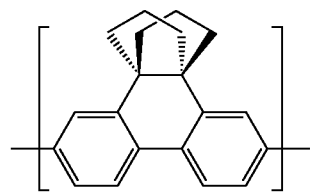

-continued (3-62)
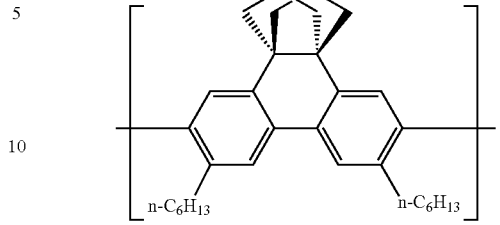

The content of the constituent unit represented by the formula (3) is preferably 0.5 to 80 mol %, more preferably 20 to 70 mol %, further preferably 30 to 60 mol % with respect to the total content of constituent units contained in the polymer compound, because when the polymer compound of the present embodiment is used for production of a light emitting device, the resulting luminance life is excellent.

The constituent unit represented by (3) may be comprised only singly or two or more units thereof may be comprised in the polymer compound.

(Constituent Unit Represented by the Formula (4))

The polymer compound of the present embodiment may comprise a constituent unit represented by the formula (4), in addition to the constituent unit represented by the formula (1') (may also be the constituent unit represented by the formula (1)) and the constituent unit having at least one mono-valent cross-linkable group selected from the above-described Group A of cross-linkable group. Further, the constituent unit represented by the above-described formula (3) may also be comprised.

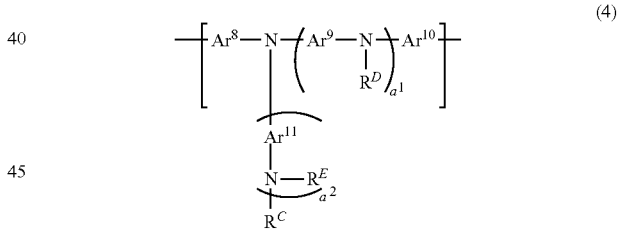

(4)

[wherein $a^1$ and $a^2$ represent each independently 0 or 1.

$Ar^8$ and $Ar^{10}$ represent each independently an arylene group or a di-valent heterocyclic group and these groups may have a substituent.

$Ar^9$ and $Ar^{11}$ represent each independently an arylene group, a di-valent heterocyclic group or a di-valent group obtained by linking two or more identical or different groups selected from the group consisting of arylene groups and di-valent heterocyclic groups and these groups may have a substituent.

$R^C$, $R^D$ and $R^E$ represent each independently a hydrogen atom, an alkyl group, an aryl group or a mono-valent heterocyclic group and these groups may have a substituent.

$Ar^8$, $Ar^9$, $Ar^{10}$ and $Ar^{11}$ may each form a ring structure by mutual linkage of each group with other group than the each group linked to a nitrogen atom to which the each group is linked.

Here, the constituent unit represented by the formula (4) is different from the constituent unit represented by the above-described formula (1) and the constituent unit represented by the above-described formula (2').].

$a^1$ is more preferably 1, because when the polymer compound of the present embodiment is used for production of a light emitting device, the resulting luminance life is excellent $a^2$ is preferably 0, because the polymer compound of the present embodiment is easily produced and when the polymer compound is used for production of a light emitting device, the resulting luminance life is excellent.

The number of carbon atoms of the arylene group represented by $Ar^8$, $Ar^9$, $Ar^{10}$ and $Ar^{11}$ is, not including the number of carbon atoms of a substituent, usually 6 to 60, preferably 6 to 30, more preferably 6 to 18.

The arylene group represented by $Ar^8$, $Ar^9$, $Ar^{10}$ and $Ar^{11}$ includes, for example, a 1,2-phenylenediyl group, a 1,3-phenylenediyl group, a 1,4-phenylenediyl group, a 1,4-naphthalenediyl group, a 1,5-naphthalenediyl group, a 2,6-naphthalenediyl group, a 2,7-naphthalenediyl group, a 2,6-anthracenediyl group, a 9,10-anthracenediyl group, a 2,7-phenanthrenediyl group, a 2,7-dihydrophenanthrenediyl group, a 5,12-naphthacenediyl group, a 2,7-fluorenediyl group, a 3,6-fluorenediyl group, a 1,6-pyrenediyl group, a 2,7-pyrenediyl group, a 3,9-perylenediyl group, a 3,10-perylenediyl group, a 6,12-chrysenediyl group and a 2,8-chrysenediyl group, preferably a 1,4-phenylenediyl group, a 2,7-fluorenediyl group, a 2,6-anthracenediyl group, a 9,10-anthracenediyl group, a 2,7-phenanthrenediyl group, a 9,10-dihydrophenanthrene-2,7-diyl group and a 1,6-pyrenediyl group, more preferably a 1,4-phenylenediyl group and a 2,7-fluorenediyl group, further preferably a 1,4-phenylenediyl group.

The number of carbon atoms of the di-valent heterocyclic group represented by $Ar^8$, $Ar^9$, $Ar^{10}$ and $Ar^{11}$ is, not including the number of carbon atoms of a substituent, preferably 4 to 60, more preferably 4 to 30, further preferably 4 to 15.

The di-valent heterocyclic group represented by $Ar^8$, $Ar^9$, $Ar^{10}$ and $Ar^{11}$ includes, for example, a 2,5-thiophenediyl group, a 2,5-pyrrolediyl group, a 2,5-furandiyl group, a 2,5-pyridinediyl group, a 2,6-pyridinediyl group, a 2,6-quinolinediyl group, a 1,4-isoquinolinediyl group, a 1,5-isoquinolinediyl group, a 5,8-quinoxalinediyl group, a 2,7-carbazolediyl group, a 3,6-carbazolediyl group, a 3,7-phenoxazinediyl group, a 3,7-phenothiazinediyl group, a 2,8-phenothiazinediyl group, a 4,6-phenothiazinediyl group, a 2,1,3-benzothiadiazole-4,7-diyl group, a 2,7-dibenzofurandiyl group, a 2,7-dibenzothiophenediyl group and a 2,7-dibenzosilolediyl group and the like.

The di-valent group obtained by linking two or more identical or different groups selected from the group consisting of arylene groups and di-valent heterocyclic groups represented by $Ar^9$ and $Ar^{11}$ includes, for example, groups represented by the following formulae (1a-1), (1a-2), (1a-3), (1a-4), (1a-5), (1a-6) and (1a-7), preferably a group represented by the formula (1a-1).

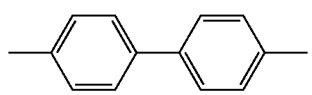
(1a-1)

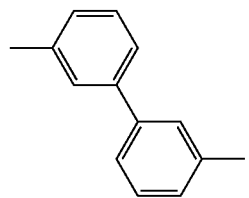
(1a-2)

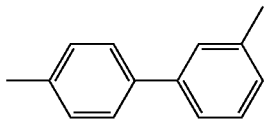
(1a-3)

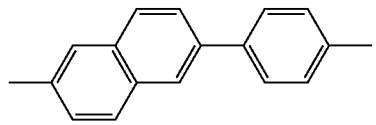
(1a-4)

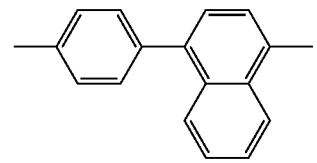
(1a-5)

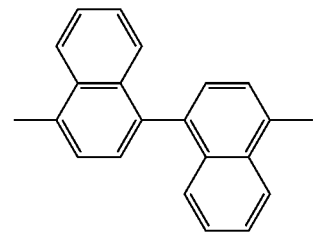
(1a-6)

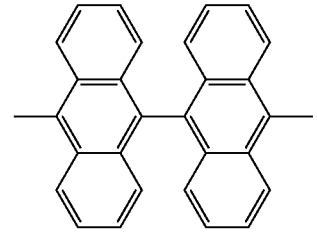
(1a-7)

The group represented by $Ar^8$, $Ar^9$, $Ar^{10}$ and $Ar^{11}$ may have a substituent.

The substituent includes an alkyl group, an alkoxy group, an aryl group, an aryloxy group, a halogen atom, a mono-valent heterocyclic group and a cyano group, preferably an alkyl group and an aryl group.

The definition and examples of the alkyl group, the alkoxy group, the aryl group, the aryloxy group and the mono-valent heterocyclic group are the same as the definition and examples of the alkyl group, the aryl group, the aryloxy group and the mono-valent heterocyclic group represented by $R^{1'}$, $R^{2'}$, $R^{3'}$, $R^{4'}$, $R^5$, $R^6$, $R^7$, $R^8$, $R^9$ and $R^{10}$, respectively.

$Ar^8$, $Ar^9$, $Ar^{10}$ and $Ar^{11}$ represent preferably an arylene group, because the polymer compound of the present embodiment shows good stability and when the polymer compound is used for production of a light emitting device, the resulting light emitting device is excellent in luminance life.

$R^C$, $R^D$ and $R^E$ represent preferably a substituted alkyl group, an aryl group or a mono-valent heterocyclic group, more preferably an aryl group, because the polymer compound of the present embodiment shows good stability and when the polymer compound is used for production of a light emitting device, the resulting luminance life is excellent.

The definition and examples of the alkyl group, the aryl group and the mono-valent heterocyclic group represented by $R^C$, $R^D$ and $R^E$ are the same as the definition and examples of the alkyl group, the aryl group and the mono-valent heterocyclic group represented by $R^A$ and $R^B$, respectively.

The content of the constituent unit represented by the formula (4) is preferably 0.1 to 40 mol %, more preferably 0.5 to 30 mol %, further preferably 1 to 20 mol % with respect to the total content of constituent units contained in the polymer compound, because the polymer compound of the present embodiment is excellent in stability.

The constituent unit represented by the formula (4) includes, for example, constituent units represented by the following formula (4-1) to formula (4-9), preferably constituent units represented by any of the formula (4-1) to formula (4-3), more preferably constituent units represented by any of the formula (4-2) and formula (4-3).

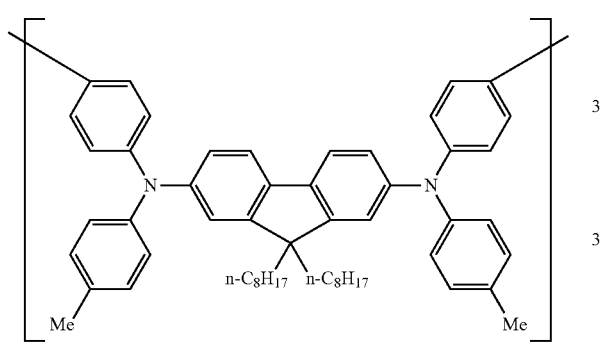

(4-1)

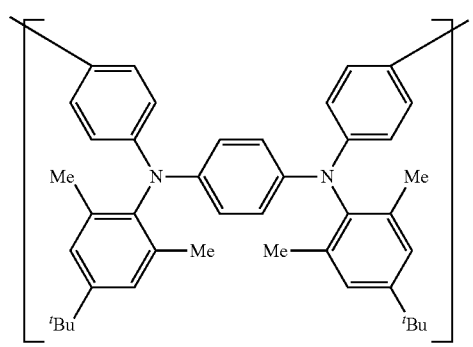

(4-2)

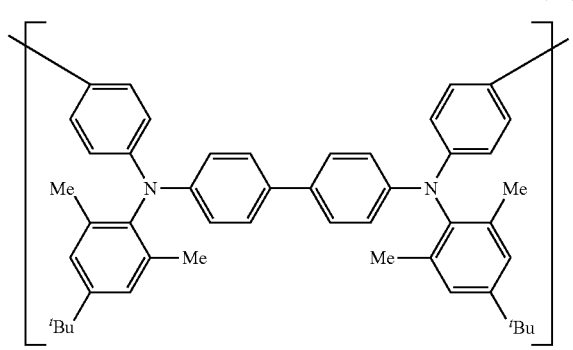

(4-3)

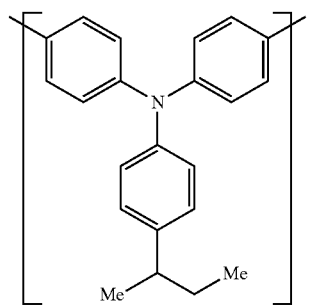

(4-4)

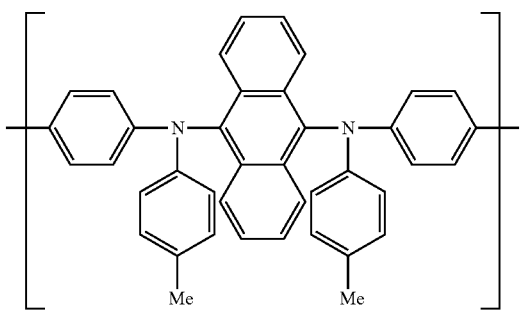

(4-5)

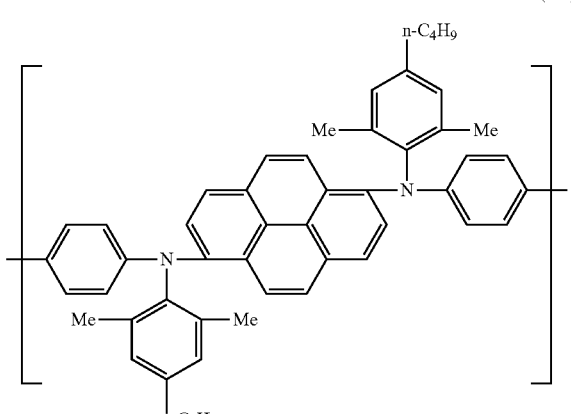

(4-6)

(4-7)

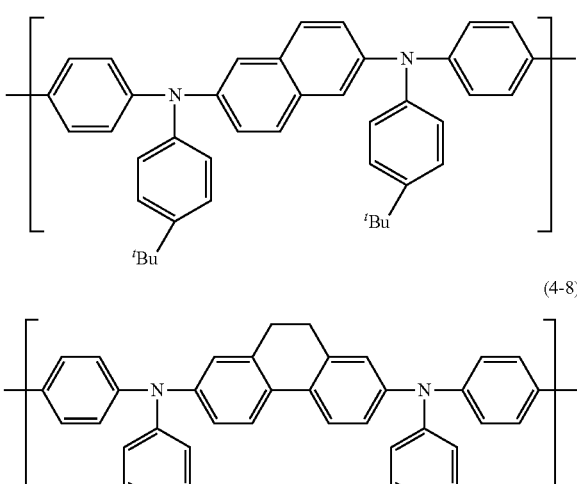

(4-8)

-continued

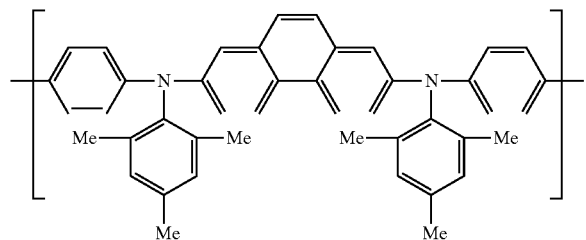

(4-9)

The constituent unit represented by the formula (4) may be comprised only singly or two or more units thereof may be comprised in the polymer compound.

Examples of the polymer compound of the present embodiment include polymer compounds P-1 to P-12 in Table 1 below. Here, "other" constituent unit denotes a constituent unit other than the constituent unit represented by the formula (1'), the constituent unit represented by the formula (2), the constituent unit represented by the formula (2'), the constituent unit represented by the formula (3) and the constituent unit represented by the formula (4).

TABLE 1

| | constituent unit and mole fraction thereof | | | | | |
|---|---|---|---|---|---|---|
| polymer compound | formula (1) p | formula (2) q | formula (2') r | formula (3) s | formula (4) t | other u |
| P-1 | 0.1 to 99.9 | 0.1 to 99.9 | 0 | 0 | 0 | 0 to 30 |
| P-2 | 0.1 to 99.8 | 0.1 to 99.8 | 0 | 0.1 to 99.8 | 0 | 0 to 30 |
| P-3 | 0.1 to 99.8 | 0.1 to 99.8 | 0 | 0 | 0.1 to 99.8 | 0 to 30 |
| P-4 | 0.1 to 99.7 | 0.1 to 99.7 | 0 | 0.1 to 99.7 | 0.1 to 99.7 | 0 to 30 |
| P-5 | 0.1 to 99.9 | 0 | 0.1 to 99.9 | 0 | 0 | 0 to 30 |
| P-6 | 0.1 to 99.8 | 0 | 0.1 to 99.8 | 0.1 to 99.8 | 0 | 0 to 30 |
| P-7 | 0.1 to 99.8 | 0 | 0.1 to 99.8 | 0 | 0.1 to 99.8 | 0 to 30 |
| P-8 | 0.1 to 99.7 | 0 | 0.1 to 99.7 | 0.1 to 99.7 | 0.1 to 99.7 | 0 to 30 |
| P-9 | 0.1 to 99.8 | 0.1 to 99.8 | 0.1 to 99.8 | 0 | 0 | 0 to 30 |
| P-10 | 0.1 to 99.7 | 0.1 to 99.7 | 0.1 to 99.7 | 0.1 to 99.7 | 0 | 0 to 30 |
| P-11 | 0.1 to 99.7 | 0.1 to 99.7 | 0.1 to 99.7 | 0 | 0.1 to 99.7 | 0 to 30 |
| P-12 | 0.1 to 99.6 | 0.1 to 99.6 | 0.1 to 99.6 | 0.1 to 99.6 | 0.1 to 99.6 | 0 to 30 |

[In the table, p, q, r, s, t and u represent the mole fraction of each constituent unit. $p+q+r+s+t+u=100$, and $100 \geq p+q+r+s+t \geq 70$.].

Specific examples and preferable embodiments of the constituent unit represented by the formula (1') (may also be the constituent unit represented by the formula (1)), the constituent unit represented by the formula (2), the constituent unit represented by the formula (2'), the constituent unit represented by the formula (3) and the constituent unit represented by the formula (4) in polymer compounds P-1 to P-12 are as described above.

The polymer compound of the present embodiment has a polystyrene-equivalent number average molecular weight (Mn) of usually $1\times10^3$ to $1\times10^8$, preferably $1\times10^4$ to $1\times10^6$, according to gel permeation chromatography (hereinafter, referred to as "GPC") The polymer compound of the present embodiment has a polystyrene-equivalent weight average molecular weight (Mw) of usually $2\times10^3$ to $2\times10^8$, and because of enhanced film formability, it is preferably $2\times10^4$ to $2\times10^6$, more preferably $3\times10^4$ to $1\times10^6$, further preferably $5\times10^4$ to $5\times10^5$.

The end group of the polymer compound of the present embodiment is preferably a stable group because if a polymerization active group remains intact at the end, when the polymer compound is used for fabrication of a light emitting device, the light emitting property or luminance life may possibility lower. This end group is preferably a group having a conjugated bond to the main chain, and includes groups bonding to an aryl group or a mono-valent heterocyclic group via a carbon-carbon bond (specifically, substituents described in JP-A No. 9-45478, and the like).

The polymer compound of the present embodiment may be any of a block (co)polymer, a random (co)polymer, an alternate (co)polymer and a graft (co)polymer, and may also be another form.

[Production Method of Polymer Compound]

Next, the method of producing the polymer compound of the present embodiment will be illustrated.

In production of the polymer compound of the present embodiment, for example, the polymer compound can be produced by condensation-polymerizing a compound represented by the following formula (1'M) (hereinafter, also referred to as "compound 1'M"), a compound represented by the following formula (2M) (hereinafter, also referred to as "compound 2M") and/or a compound represented by the following formula (2'M) (hereinafter, also referred to as "compound 2'M"), and other compounds (for example, a compound represented by the following formula (3M) (hereinafter, also referred to as "compound 3M") and/or a compound represented by the following formula (4M) (hereinafter, also referred to as "compound 4M")). The compound 1'M is preferably a compound represented by the following formula (1M) (hereinafter, also referred to as "compound 1M"). In the present specification, the compound 1'M, the compound 1M, the compound 2M, the compound 2'M, the compound 3M and the compound 4M are collectively termed "raw material monomer" in some cases.

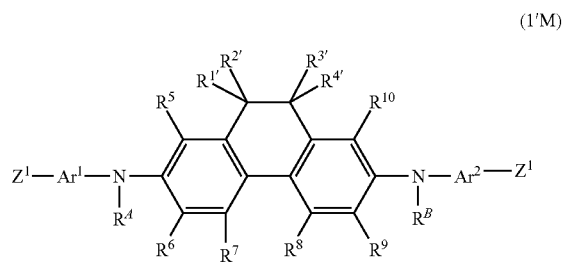

(1'M)

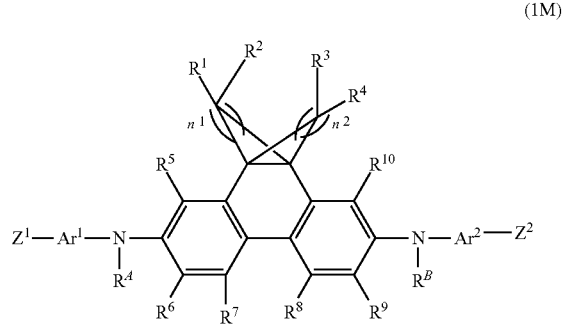

(1M)

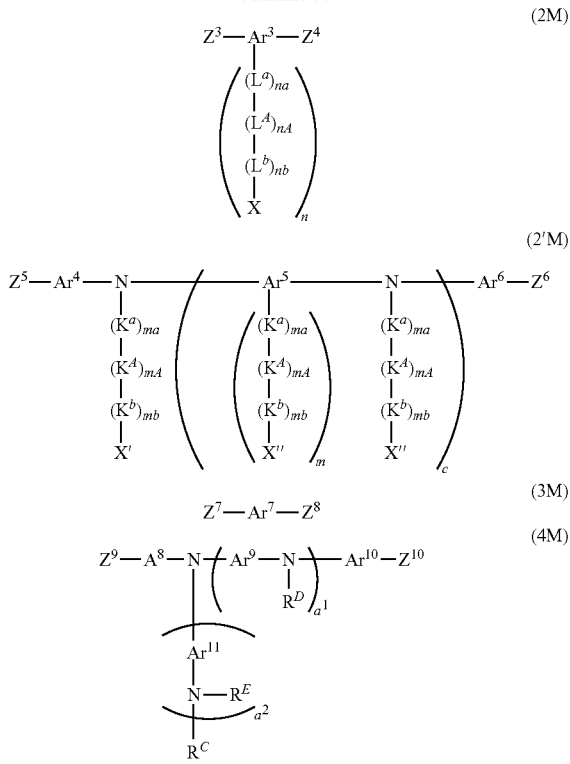

In the formula (1'M), $R^{1\prime}$, $R^{2\prime}$, $R^{3\prime}$, $R^{4\prime}$, $R^5$, $R^6$, $R^7$, $R^8$, $R^9$, $R^{10}$, $R^A$, $R^B$, $Ar^1$ and $Ar^2$ are as defined above, and $Z^1$ and $Z^2$ represent each independently a group selected from the following substituent group (the following Group A of substituent and the following Group B of substituent).

In the formula (1M), $n^1$, $n^2$, $R^1$, $R^2$, $R^3$, $R^4$, $R^5$, $R^6$, $R^7$, $R^8$, $R^9$, $R^{10}$, $R^A$, $R^B$, $Ar^1$ and $Ar^2$ are as defined above, and $Z^1$ and $Z^2$ represent each independently a group selected from the following substituent group (the following Group A of substituent and the following Group B of substituent).

In the formula (2M), na, nb, nA, n, $Ar^3$, $L^a$, $L^b$, $L^A$ and X are as defined above, and $Z^3$ and $Z^4$ represent each independently a group selected from the following substituent group (the following Group A of substituent and the following Group B of substituent).

In the formula (2'M), ma, mb, mA, m, c, $Ar^4$, $Ar^5$, $Ar^6$, $K^a$, $K^b$, $K^A$, X' and X" are as defined above, and $Z^5$ and $Z^6$ represent each independently a group selected from the following substituent group (the following Group A of substituent and the following Group B of substituent).

In the formula (3M), $Ar^7$ is as defined above, and $Z^7$ and $Z^8$ represent each independently a group selected from the following substituent group (the following Group A of substituent and the following Group B of substituent).

In the formula (4M), $a^1$, $a^2$, $Ar^8$, $Ar^9$, $Ar^{10}$, $Ar^{11}$, $R^C$, $R^D$ and $R^E$ are as defined above, and $Z^9$ and $Z^{10}$ represent each independently a group selected from the following substituent group (the following Group A of substituent or the following Group B of substituent).

<Group A of Substituent>

A chlorine atom, a bromine atom, an iodine atom, and a group represented by $O-S(=O)_2R^{41}$ ($R^{41}$ represents an alkyl group or an aryl group and these groups may have a substituent.).

<Group B of Substituent>

A group represented by $-B(OR^{42})_2$ ($R^{42}$ represents a hydrogen atom or an alkyl group, and the alkyl group may have a substituent, and a plurality of $R^{42}$ may be mutually the same or different, and may be mutually lined to form a ring structure together with an oxygen atom to which they are linked.), a group represented by $-BF_4Q^1$ ($Q^1$ represents a mono-valent cation selected from the group consisting of $Li^+$, $Na^+$, $K^+$, $Rb^+$ and $Cs^+$.), a group represented by $-MgY^1$ ($Y^1$ represents a chlorine atom, a bromine atom or an iodine atom.), a group represented by $-ZnY^2$ ($Y^2$ represents a chlorine atom, a bromine atom or an iodine atom.) and a group represented by $-Sn(R^{43})_3$ ($R^{43}$ represents a hydrogen atom or an alkyl group, and the alkyl group may have a substituent, and a plurality of $R^{43}$ may be mutually the same or different, and may be mutually linked to form a ring structure together with a tin atom to which they are linked.).

The definition and examples of the alkyl group and the aryl group represented by $R^{41}$ are the same as the definition and examples of the alkyl group and the aryl group represented by $R^{1\prime}$, $R^{2\prime}$, $R^{3\prime}$, $R^{4\prime}$, $R^5$, $R^6$, $R^7$, $R^8$, $R^9$ and $R^{10}$, respectively.

The definition and examples of the alkyl group represented by $R^{42}$ and $R^{43}$ are the same as the definition and examples of the alkyl group represented by $R^{1\prime}$, $R^{2\prime}$, $R^{3\prime}$, $R^{4\prime}$, $R^5$, $R^6$, $R^7$, $R^8$, $R^9$ and $R^{10}$, respectively.

The compound having a group selected from Group A of substituent and the compound having a group selected from Group B of substituent are known to undergo condensation polymerization by a known coupling reaction to give mutual bonding of carbon atoms linking the group selected from Group A of substituent and the group selected from Group B of substituent. Therefore, when a compound A having two groups selected from Group A of substituent and a compound B having two groups selected from Group B of substituent are subjected to a known coupling reaction, a condensed polymer of the compound A and the compound B can be obtained by condensation polymerization.

For example, if $Z^1$ and $Z^2$ in the compound 1'M (may also be the compound 1M) and $Z^3$ and $Z^4$ (or, $Z^5$ and $Z^6$) in the compound 2M (or, the compound 2'M) are groups selected from Group A of substituent, then, groups selected from Group B of substituent can be selected as $Z^7$ and $Z^8$ (or, $Z^9$ and $Z^{10}$) in the compound 3M (or, the compound 4M).

Further, if $Z^1$ and $Z^2$ in the compound 1'M (may also be the compound 1M) and $Z^3$ and $Z^4$ (or, $Z^5$ and $Z^6$) in the compound 2M (or, the compound 2'M) are groups selected from Group B of substituent, then, groups selected from Group A of substituent can be selected as $Z^7$ and $Z^8$ (or, $Z^9$ and $Z^{10}$) in the compound 3M (or, the compound 4M).

Condensation polymerization is conducted usually in the presence of a catalyst, a base and an organic solvent.

The catalyst includes, for example, catalysts composed of a transition metal complex such as palladium complexes such as dichlorobis(triphenylphosphine)palladium, dichlorobis(tris-o-methoxyphenylphosphine)palladium, palladium [tetrakis(triphenylphosphine)], [tris(dibenzylideneacetone)] dipalladium, palladium acetate and the like, nickel complexes such as nickel[tetrakis(triphenylphosphine)], [1,3-bis(diphenylphosphino)propane]dichloronickel, [bis(1, 4-cyclooctadiene)]nickel and the like, and if necessary, further, a ligand such as triphenylphosphine, tri(tert-butyl-phosphine), tricyclohexylphosphine, diphenylphosphinopropane, bipyridyl and the like. As the catalyst, those previously synthesized can be used, or those prepared in the reaction system can also be used as they are. These catalysts may be used singly or two or more of them may be used in combination. The use amount of the catalyst is preferably 0.00001 to 3 molar equivalent in terms of the amount of the transition metal with respect to the sum of the number of moles of raw material monomers.

The base includes, for example, inorganic bases such as sodium carbonate, potassium carbonate, cesium carbonate, potassium fluoride, cesium fluoride, tripotassium phosphate and the like, and organic bases such as tetrabutylammonium fluoride, tetrabutylammonium chloride, tetrabutylammonium bromide, tetrabutylammonium hydroxide and the like. These bases may be used singly or two or more of them may be used in combination. The use amount of the base is preferably 0.5 to 20 molar equivalent with respect to the sum of the number of moles of raw material monomers.

The organic solvent includes, for example, toluene, xylene, mesitylene, tetrahydrofuran, 1,4-dioxane, dimethoxyethane, N,N-dimethylacetamide and N,N-dimethylformamide. These organic solvents may be used singly or two or more of them may be used in combination. The use amount of the organic solvent is preferably such an amount that the total concentration of raw material monomers is 0.1 to 90% by weight.

The reaction temperature of condensation polymerization is preferably −100 to 200° C. The reaction time is usually 1 hour or longer, preferably 2 to 500 hours.

The post treatment of the polymerization reaction can be conducted by a known method, and for example, can be carried out by using a method of removing water-soluble impurities by liquid separation, a method in which the reaction solution after the polymerization reaction is added to a lower alcohol such as methanol and the like and the deposited precipitate is filtrated and dried, or another method singly, or conducted by combining these methods. When the polymer compound has low purity, it may be purified by a usual method such as recrystallization, reprecipitation, continuous extraction by a Soxhlet extractor, column chromatography and the like.

(Compound)

The compound represented by the formula (1'M) (may also be the compound represented by the formula (1M)) can be suitably used for production of the polymer compound of the present embodiment, as described above.

For example, when $n^1$ and/or $n^2$ in the formula (1M) is 2 or more and a substituent is carried, when $R^1$ and $R^2$ are mutually different and when $R^3$ and $R^4$ are mutually different, the compound represented by the formula (1M) can contain stereoisomers (diastereomer/enantiomer). The compound represented by the formula (1M) may be composed of a single stereoisomer, or may be a mixture of different stereoisomers.

The method of producing the compound represented by the formula (1'M) will be illustrated below. The method of producing the compound represented by the formula (1M) will be illustrated referring to a case in which $n^1$ and $n^2$ are 3.

The compound represented by the formula (1'M) can be produced, for example, by a method described in the following Scheme 2.

[Scheme 2]

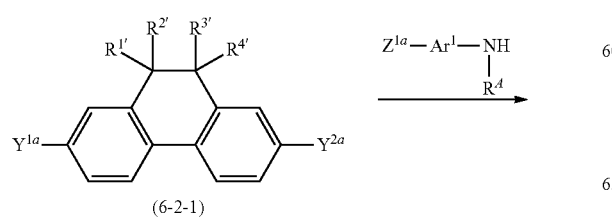

(6-2-1)

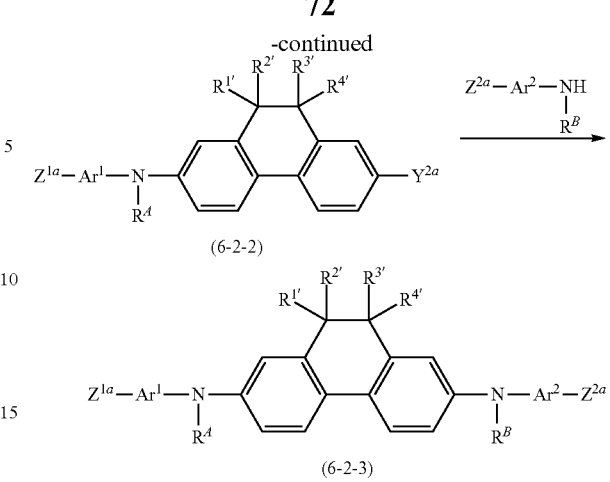

(6-2-2)

(6-2-3)

In Scheme 2, $Y^{1a}$ and $Y^{2a}$ represent each independently a hydrogen atom or a group selected from the above-described Group A of substituent, $Z^{1a}$ and $Z^{2a}$ represent a hydrogen atom or a group selected from the above-described Group A of substituent, and $R^{1'}$, $R^{2'}$, $R^{3'}$, $R^{4'}$, $Ar^1$, $Ar^2$, $R^A$ and $R^B$ are as defined above.

In Scheme 2, first, by conducting a coupling reaction of the compound represented by the formula (6-2-1) (hereinafter, also referred to as "compound (6-2-1)") with a prescribed amine compound, a compound represented by the formula (6-2-3) (hereinafter, also referred to as "compound (6-2-3)") is obtained via a compound represented by the formula (6-2-2) (hereinafter, also referred to as "compound (6-2-2)"). When $Z^{1a}$ and $Z^{2a}$ in the compound (6-2-3) are a hydrogen atom, the compound (6-2-3) can be subjected to, for example, a bromination reaction, to convert the hydrogen atom into a group selected from the above-described Group A of substituent. When $Z^{1a}$ and $Z^{2a}$ in the compound (6-2-3) are a group selected from the above-described Group A of substituent, the group can be converted into a group selected from Group B of substituent by a known reaction.

The compound represented by the formula (1M) can be produced, for example, by a method described in the following Scheme 1.

[Scheme 1]

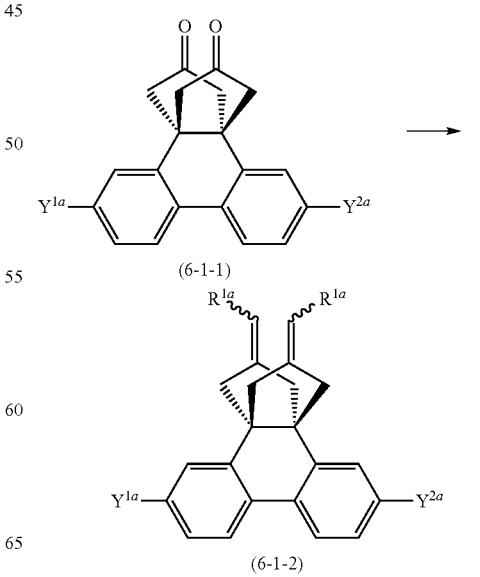

(6-1-1)

(6-1-2)

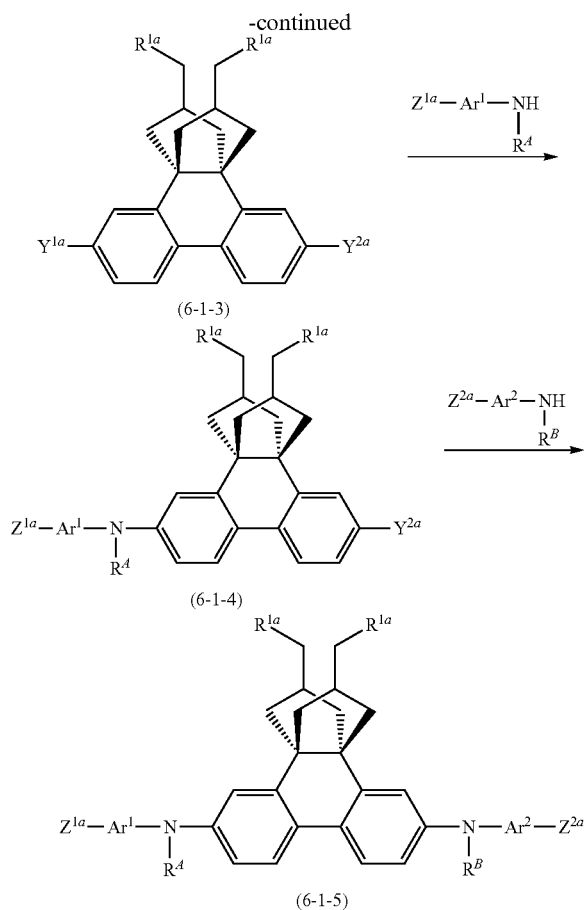

In Scheme 1, a wavy line means that a compound with the wavy line is a geometric isomer mixture.

In Scheme 1, $Y^{1a}$ and $Y^{2a}$ represent each independently a hydrogen atom or a group selected from the above-described Group A of substituent, $Z^{1a}$ and $Z^{2a}$ represent a hydrogen atom or a group selected from the above-described Group A of substituent, $R^{1a}$ represents an alkyl group, an aryl group or a mono-valent heterocyclic group and these groups may have a substituent. $Ar^1$, $Ar^2$, $R^A$ and $R^B$ are as defined above. A plurality of $R^{1a}$ may be mutually the same or different.

The definition and examples of the alkyl group, the aryl group and the mono-valent heterocyclic group represented by $R^{1a}$ are the same as the definition and examples of the alkyl group, the aryl group and the mono-valent heterocyclic group represented by $R^{1'}$, $R^{2'}$, $R^{3'}$, $R^{4'}$, $R^5$, $R^6$, $R^7$, $R^8$, $R^9$ and $R^{10}$, respectively.

In Scheme 1, first, by subjecting the compound represented by the formula (6-1-1) (hereinafter, also referred to as "compound (6-1-1)") to, for example, the Wittig reaction or the Horner-Wadsworth-Emmons reaction, a compound represented by the formula (6-1-2) (hereinafter, also referred to as "compound (6-1-2)") is obtained. Then, by subjecting the compound (6-1-2) to a reduction reaction, a compound represented by the formula (6-1-3) (hereinafter, also referred to as "compound (6-1-3)") is obtained.

Here, when $Y^{1a}$ and $Y^{2a}$ are a hydrogen atom, by subjecting the compound (6-1-3) to, for example, a bromination reaction, $Y^{1a}$ and $Y^{2a}$ are converted into a group selected from the above-described Group A of substituent.

Then, by a coupling reaction of the compound (6-1-3) with a prescribed amine compound, a compound represented by the formula (6-1-5) (hereinafter, also referred to as "compound (6-1-5)") is obtained via a compound represented by the formula (6-1-4) (hereinafter, also referred to as "compound (6-1-4)"). When $Z^{1a}$ and $Z^{2a}$ in the compound (6-1-5) are a hydrogen atom, the compound (6-1-5) can be subjected to, for example, a bromination reaction, to convert the hydrogen atom into a group selected from the above-described Group A of substituent. When $Z^{1a}$ and $Z^{2a}$ in the compound (6-1-5) are a group selected from the above-described Group A of substituent, the group can be converted into a group selected from Group B of substituent by a known reaction.

<Composition>

The composition of the present invention comprises the polymer compound of the present invention and at least one material selected from the group consisting of a hole transporting material, a hole injection material, an electron transporting material, an electron injection material, a light emitting material, an antioxidant and a solvent.

The composition comprising the polymer compound of the present invention and a solvent (hereinafter, referred to as "ink of the present invention" in some cases) is suitable for fabrication of a light emitting device using a printing method such as an inkjet print method, a nozzle print method and the like.

The viscosity of the ink of the present invention may be adjusted depending on the kind of the printing method, and when a solution goes through a discharge apparatus such as in an inkjet print method and the like, the viscosity is preferably in the range of 1 to 20 mPa·s at 25° C. for preventing curved aviation and clogging in discharging.

As the solvent contained in the ink of the present invention, those capable of dissolving or uniformly dispersing solid components in the ink are preferable. The solvent includes, for example, chlorine-based solvents such as 1,2-dichloroethane, 1,1,2-trichloroethane, chlorobenzene, o-dichlorobenzene and the like; ether solvents such as tetrahydrofuran, dioxane, anisole, 4-methylanisole and the like; aromatic hydrocarbon solvents such as toluene, xylene, mesitylene, ethylbenzene, n-hexylbenzene, cyclohexylbenzene and the like; aliphatic hydrocarbon solvents such as cyclohexane, methylcyclohexane, n-pentane, n-hexane, n-heptane, n-octane, n-nonane, n-decane, n-decane, bicyclohexyl and the like; ketone solvents such as acetone, methylethylketone, cyclohexanone, benzophenone, acetophenone and the like; ester solvents such as ethyl acetate, butyl acetate, ethylcellosolve acetate, methyl benzoate, phenyl acetate and the like; poly-hydric alcohols such as ethylene glycol, glycerin, 1,2-hexanediol and the like and derivatives thereof; alcohol solvents such as isopropanol, cyclohexanol and the like; sulfoxide solvents such as dimethyl sulfoxide and the like; and amide solvents such as N-methyl-2-pyrrolidone, N,N-dimethylformamide and the like. These solvents may be used singly or two or more of them may be used in combination.

In the ink of the present invention, the compounding amount of the above-described solvent is usually 1000 to 100000 parts by weight, preferably 5000 to 20000 parts by weight with respect to 100 parts by weight of the polymer compound of the present invention.

The hole transporting material may be a compound of low molecular weight or a compound of high molecular weight, and the compound of high molecular weight is preferable. As the hole transporting material, those having a cross-linkable group are preferable. As the compound of high molecular weight used in the hole transporting material, polyvinylcarbazole and derivatives thereof; polyarylene derivatives having an aromatic amine structure in the side chain or the main chain; and polymer compounds containing a residue of an aromatic amine such as an arylamine derivative, a triphenyldiamine derivative and the like are preferable.

In the composition of the present invention, the compounding amount of the above-described hole transporting material is usually 1 to 400 parts by weight, preferably 5 to 150 parts by weight with respect to 100 parts by weight of the polymer compound of the present invention.

The electron transporting material may be a compound of low molecular weight or a compound of high molecular weight. The compound of low molecular weight used in the electron transporting material includes, for example, oxadiazole derivatives, anthraquinodimethane and derivatives thereof, benzoquinone and derivatives thereof, naphthoquinone and derivatives thereof, anthraquinone and derivatives thereof, tetracyanoanthraquinodimethane and derivatives thereof, fluorenone derivatives, diphenyldicyanoethylene and derivatives thereof, diphenoquinone derivatives, and metal complexes of 8-hydroxyquinoline and derivatives thereof. The compound of high molecular weight used in the electron transporting material includes, for example, polyquinoline and derivatives thereof, polyquinoxaline and derivatives thereof and polyfluorene and derivatives thereof. These compounds of high molecular weight may be doped with a metal.

In the composition of the present invention, the compounding amount of the above-described electron transporting material is usually 1 to 400 parts by weight, preferably 5 to 150 parts by weight with respect to 100 parts by weight of the polymer compound of the present invention.

The hole injection material and the electron injection material may be a compound of low molecular weight or a compound of high molecular weight. The compound of high molecular weight used in the hole injection material and the electron injection material includes electrically conductive polymers such as, for example, polyaniline and derivatives thereof, polythiophene and derivatives thereof, polypyrrole and derivatives thereof, polyphenylenevinylene and derivatives thereof, polythienylenevinylene and derivatives thereof, polyquinoline and derivatives thereof, polyquinoxaline and derivatives thereof, polymers containing an aromatic amine structure in the main chain or the side chain, and the like.

The compound of low molecular weight used in the hole injection material and the electron injection material includes, for example, metallophthalocyanines such as copper phthalocyanine and the like; carbon; oxides of metals such as molybdenum, tungsten and the like; and metal fluorides such as lithium fluoride, sodium fluoride, cesium fluoride and the like.

In the composition of the present invention, the compounding amount of the above-described hole injection material and the above-described electron injection material is each usually 1 to 400 parts by weight, preferably 5 to 150 parts by weight with respect to 100 parts by weight of the polymer compound of the present invention.

When the hole injection material and/or the electron injection material contains an electrically conductive polymer, the electric conductivity of the electrically conductive polymer is preferably $1\times10^{-5}$ S/cm to $1\times10^{3}$ S/cm. For adjusting the electric conductivity of the electrically conductive polymer within such a range, the electrically conductive polymer can be doped with a suitable amount of ions.

The kind of the ion to be doped is an anion for a hole injection material and a cation for an electron injection material. The anion includes, for example, a polystyrenesulfonate ion, an alkylbenzenesulfonate ion and a camphorsulfonate ion. The cation includes, for example, a lithium ion, a sodium ion, a potassium ion and a tetrabutylammonium ion.

The light emitting material is divided into a compound of low molecular weight and a compound of high molecular weight. The light emitting material may have a cross-linkable group.

The compound of low molecular weight includes, for example, naphthalene and derivatives thereof, anthracene and derivatives thereof, perylene and derivatives thereof, and, triplet light emitting complexes having iridium, platinum or europium as the center metal.

The compound of high molecular weight includes, for example, polymer compounds comprising a phenylenediyl group, a naphthalenediyl group, an anthracenediyl group, a fluorenediyldiyl group, a phenanthrenediyl group, a dihydrophenanthrenediyl group, a di-valent aromatic amine residue, a carbazolediyl group, a phenoxazinediyl group, a phenothiazinediyl group, an anthracenediyl group, a pyrenediyl group and the like.

The light emitting material may contain a compound of low molecular weight and a compound of high molecular weight, and preferably, contains a triplet light emitting complex and a compound of high molecular weight.

As the triplet light emitting complex, iridium complexes represented by the formulae Ir-1 to Ir-3 are preferable.

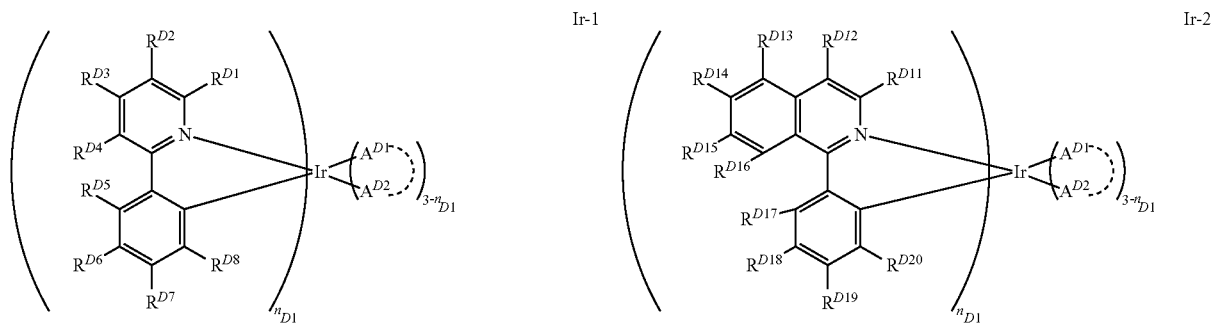

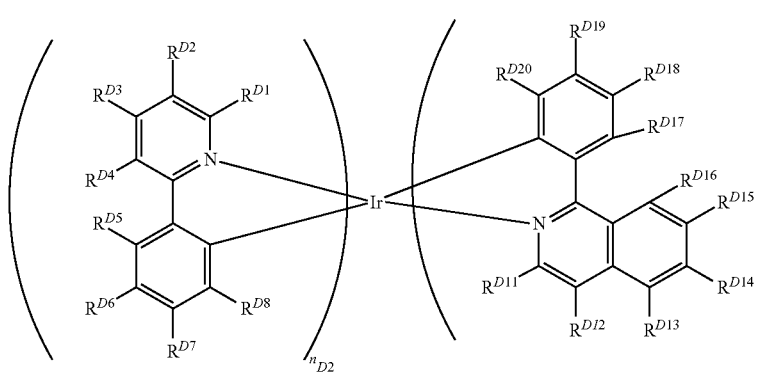

[wherein $R^{D1}$ to $R^{D8}$ and $R^{D11}$ to $R^{D20}$ represent each independently a hydrogen atom, an alkyl group, an alkoxy group, an aryl group, an aryloxy group, a mono-valent heterocyclic group or a halogen atom and these groups may have a substituent. $-A^{D1}$---$A^{D2}$- represents an anionic bidentate ligand, and $A^{D1}$ and $A^{D2}$ represent each independently a carbon atom, an oxygen atom or a nitrogen atom linking to an iridium atom. $n_{D1}$ represents 1, 2 or 3, and $n_{D2}$ represents 1 or 2.].

In the triplet light emitting complex represented by the Ir-1, at least one of $R^{D1}$ to $R^{D8}$ is preferably a group represented by the formula (Dend-A).

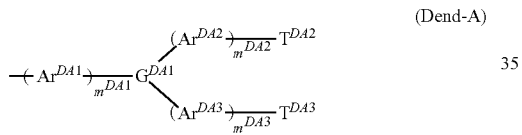

(Dend-A)

[wherein $m^{DA1}$, $m^{DA2}$ and $m^{DA3}$ represent each independently an integer of 0 or more. $G^{DA1}$ represents a nitrogen atom, an aromatic hydrocarbon groin or a heterocyclic group and these groups may have a substituent. $Ar^{DA1}$, $Ar^{DA2}$ and $Ar^{DA3}$ represent each independently an arylene group or a di-valent heterocyclic group and these groups may have a substituent. When there exist a plurality of $Ar^{DA1}$, $Ar^{DA2}$ and $Ar^{DA3}$, they may be the same or different. $T^{DA2}$ and $T^{DA3}$ represent each independently an aryl group or a mono-valent heterocyclic group and these groups may have a substituent.].

$m^{DA1}$, $m^{DA2}$ and $m^{DA3}$ represent usually an integer of 10 or less, preferably 0 or 1. It is preferable that $m^{DA1}$, $m^{DA2}$ and $m^{DA3}$ are the same integer.

$G^{DA1}$ includes preferably groups represented by the formulae (GDA-11) to (GDA-15) and these groups may have a substituent.

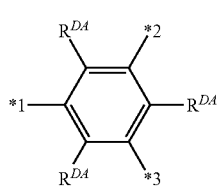

(GDA-11)

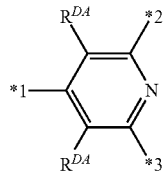

(GDA-12)

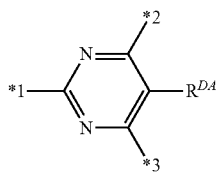

(GDA-13)

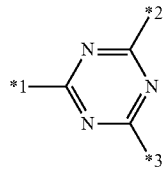

(GDA-14)

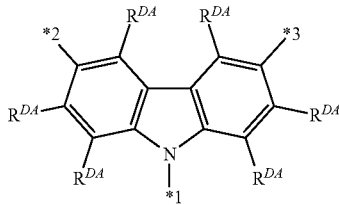

(GDA-15)

[wherein *1, *2 and *3 represent a linkage to $Ar^{DA1}$, $Ar^{DA2}$ and $Ar^{DA3}$, respectively. $R^{DA}$ represents a hydrogen atom, an alkyl group, an alkoxy group, an aryl group or a mono-valent heterocyclic group and these groups may have a substituent. When there exist a plurality of $R^{DA}$, they may be the same or different.].

$R^{DA}$ represents preferably a hydrogen atom, an alkyl group or an alkoxy group, more preferably a hydrogen atom or an alkyl group and these groups may have a substituent.

It is preferable that $Ar^{DA1}$, $Ar^{DA2}$ and $Ar^{DA3}$ are groups represented by the formulae (ArDA-1) to (ArDA-3), respectively.

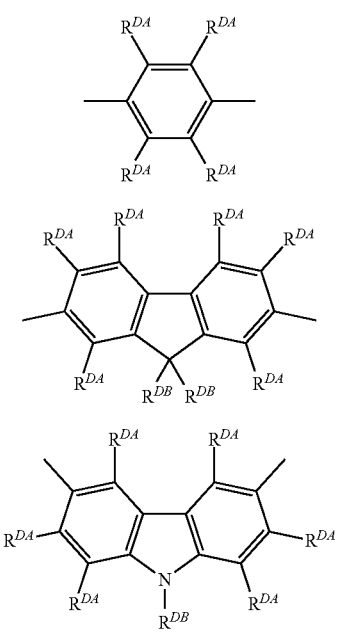

(ArDA-1)

(ArDA-2)

(ArDA-3)

[wherein $R^{DA}$ represents the same meaning as described above. $R^{DB}$ represents a hydrogen atom, an alkyl group, an aryl group or a mono-valent heterocyclic group and these groups may have a substituent. When there exist a plurality of $R^{DB}$, they may be the same or different.].

$T^{DA2}$ and $T^{DA3}$ are preferably groups represented by formulae (TDA-1) to (TDA-3).

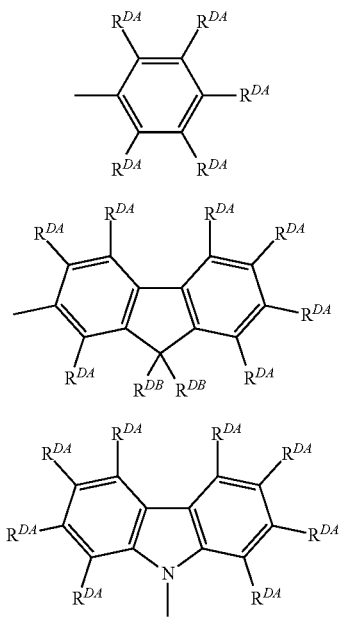

(TDA-1)

(TDA-2)

(TDA-3)

[wherein $R^{DA}$ and $R^{DB}$ represent the same meaning as described above.].

In the formula Ir-2, at least one of $R^{D11}$ to $R^{D20}$ is preferably a group represented by the formula (Dend-A).

In the formula Ir-3, at least one of $R^{D1}$ to $R^{D8}$ and $R^{D11}$ to $R^{D20}$ is preferably a group represented by the formula (Dend-A).

The group represented by the formula (Dend-A) is preferably a group represented by the formulae (Dend-A1) to (Dend-A3).

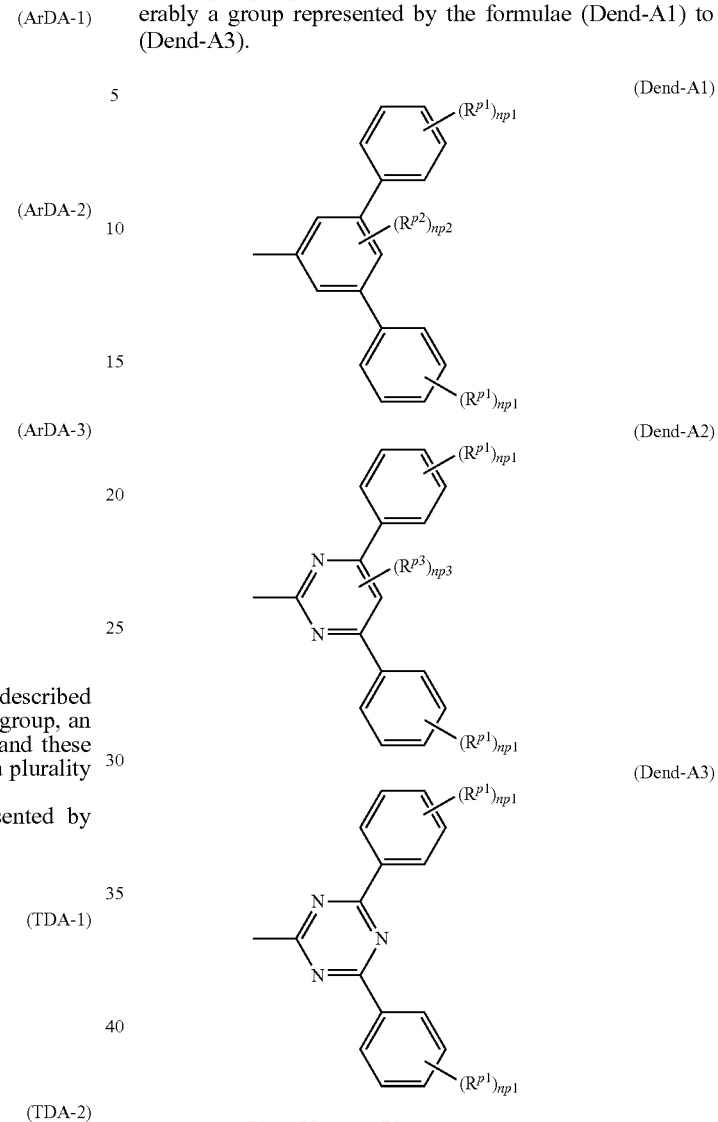

(Dend-A1)

(Dend-A2)

(Dend-A3)

[wherein $R^{D1}$, $R^{D2}$ and $R^{D3}$ represent each independently an alkyl group, an alkoxy group or halogen atom. When there exist a plurality of $R^{p1}$ and $R^{p2}$, they may be the same or different. np1 represents an integer of 0 to 5, np2 represents an integer of 0 to 3, and np3 represents 0 or 1. A plurality of np1 may be the same or different.].

np1 is preferably 0 or 1, more preferably 1. np2 is preferably 0 or 1, more preferably 0. np3 is preferably 0.

The anionic bidentate ligand represented by $-A^{D1}$---$A^{D2}$- includes, for example, ligands represented by the following formulae.

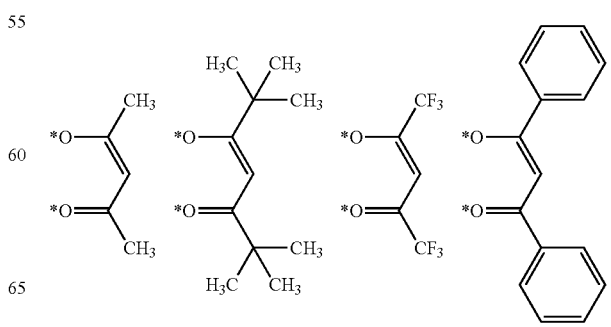

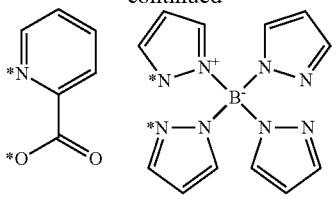

[wherein * represents a position linking to Ir.].

The metal complex represented by the formula Ir-1 includes preferably metal complexes represented by the formulae Ir-11 to Ir-13. The metal complex represented by the formula Ir-2 is preferably a metal complex represented by the formula Ir-21. The metal complex represented by the formula Ir-3 includes preferably metal complexes represented by the formulae Ir-31 to Ir-33.

Ir-11

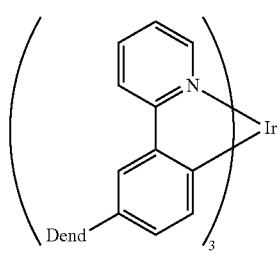

Ir-12

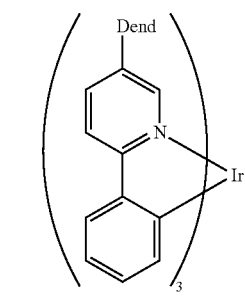

Ir-13

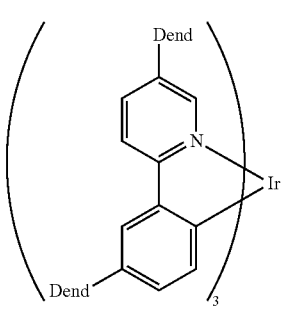

Ir-21

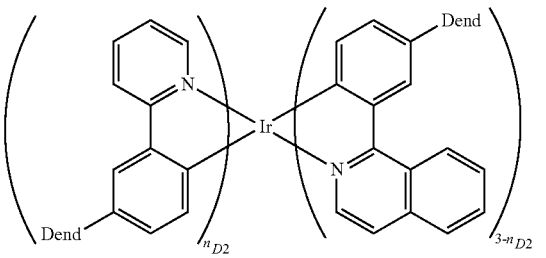

Ir-31

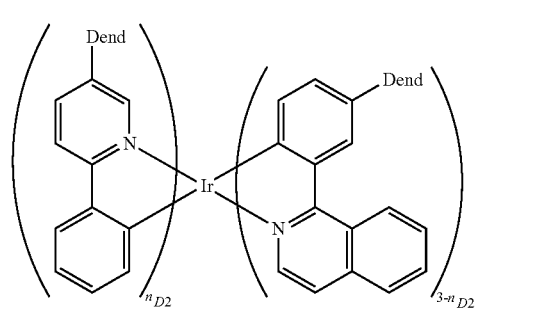

Ir-32

Ir-33

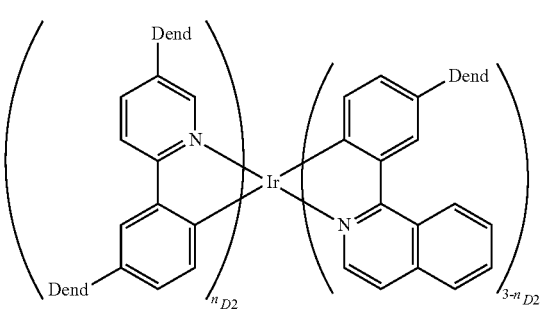

[wherein Dend represents a group represented by the formula (Dend-A). $n_{D2}$ represents 1 or 2.].

The triplet light emitting complex includes, for example, metal complexes listed below.

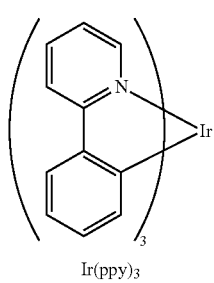

Ir(ppy)₃

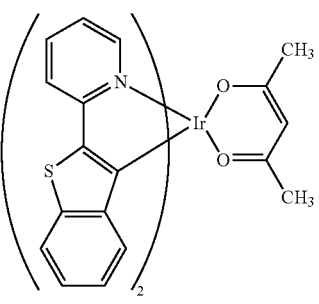

Btp₂Ir(acac)

-continued
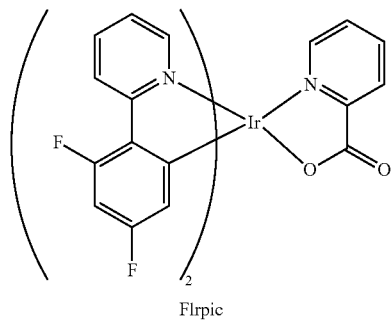
FIrpic
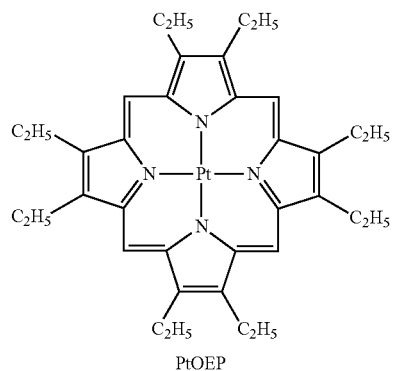
PtOEP
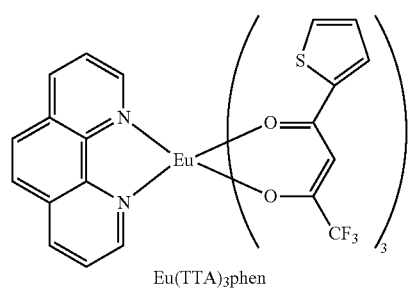
Eu(TTA)₃phen
COM-1
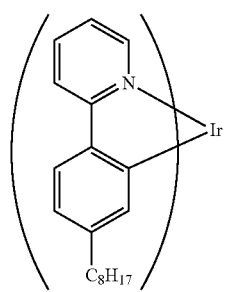
COM-2
COM-3
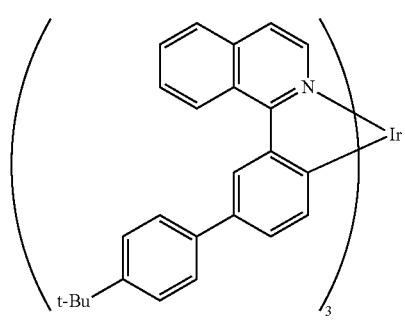
COM-4
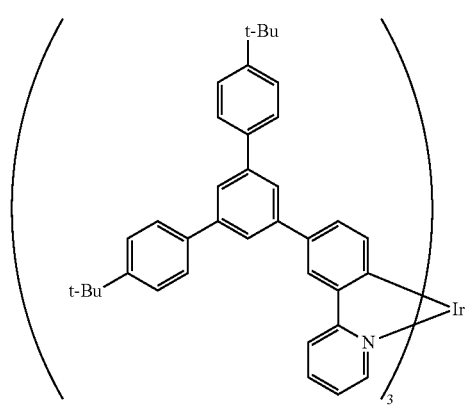

-continued

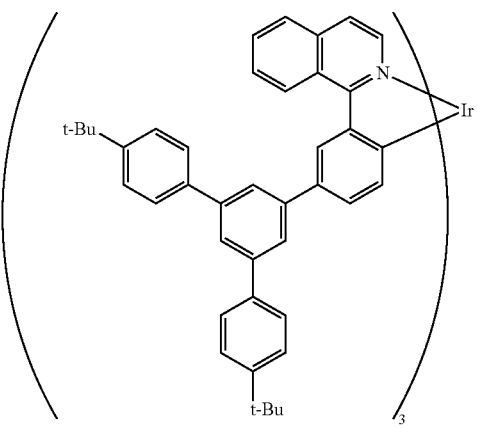
COM-5

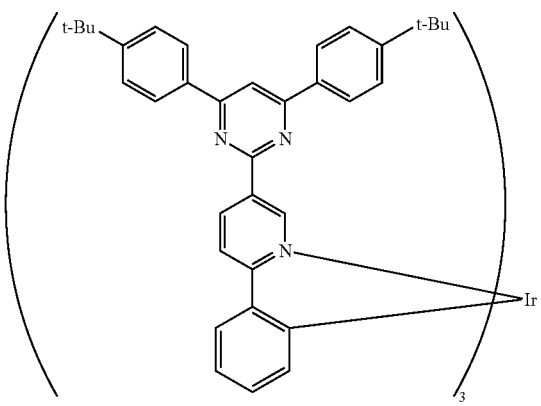
COM-6

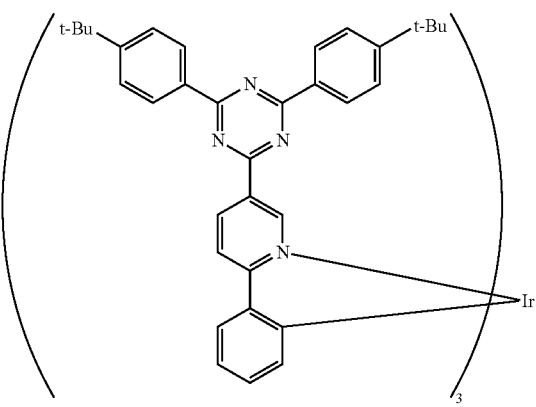
COM-7

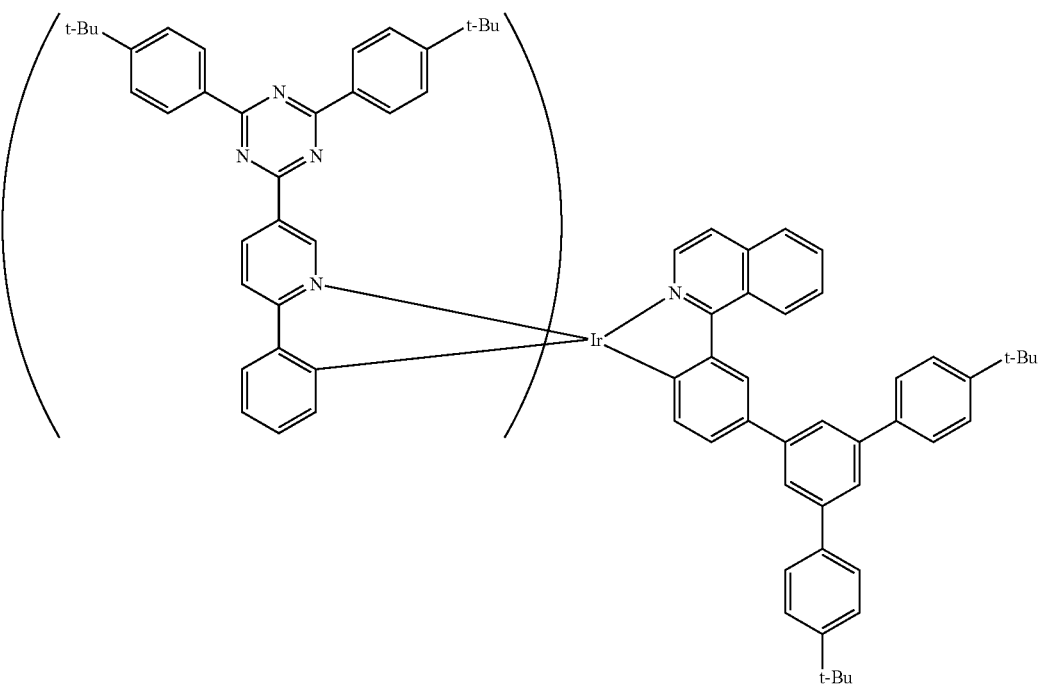
COM-8

In the composition of the present invention, the compounding amount of the above-described light emitting material is usually 0.1 to 400 parts by weight, preferably 1 to 400 parts by weight, more preferably 5 to 150 parts by weight with respect to 100 parts by weight of the polymer compound of the present invention.

The antioxidant may advantageously be one which is soluble in the same solvent as for the polymer compound of the present invention and does not disturb light emission and charge transportation, and the examples thereof include phenol antioxidants and phosphorus-based antioxidants.

In the composition of the present invention, the compounding amount of the above-described antioxidant is usually 0.001 to 10 parts by weight, preferably 0.01 to 1 part by weight with respect to 100 parts by weight of the polymer compound of the present invention.

<Film>

The film of the present invention comprises the polymer compound of the present invention. The film of the present invention is, for example, a luminescent film, an electrically conductive film or an organic semiconductor film.

The film of the present invention may also be an insolubilized film obtained by insolubilizing the polymer compound of the present invention in a solvent. The insolubilized film is usually obtained by cross-linking and hardening the polymer compound of the present invention by an external stimulus such as heating, irradiation with light and the like. The insolubilized film can be suitably used for lamination of a light emitting device described later because the insolubilized film is substantially insoluble in a solvent.

The heating temperature for cross-linking the film is generally in the range of 25° C. to 300° C., and its upper limit is preferably 250° C., further preferably 200° C., particularly preferably 180° C. from the standpoint of light emission efficiency. Its lower limit is preferably 50° C., further preferably 70° C., particularly preferably 100° C. from the standpoint of easiness of formation of the insolubilized film.

In irradiation with light for cross-linking the film, ultraviolet ray, near-ultraviolet ray and visible ray are generally used, and ultraviolet ray and near-ultraviolet ray are preferably used.

The film and the insolubilized film of the present invention can be suitably used as a hole transporting layer or a hole injection layer in a light emitting device described later.

The film of the present invention can be fabricated, for example, by a spin coat method, a casting method, a micro gravure coat method, a gravure coat method, a bar coat method, a roll coat method, a wire bar coat method, a dip coat method, a spray coat method, a screen printing method, a flexo printing method, an offset printing method, an inkjet printing method, a capillary coat method or a nozzle coat method, using the composition of the present invention.

The thickness of the film of the present invention is usually 1 nm to 10 μm.

<Light Emitting Device>

The light emitting device of the present invention has the film of the present invention or the insolubilized film of the present invention.

The film of the present invention or the insolubilized film of the present invention is preferably at least one of a light emitting layer, a hole transporting layer, a hole injection layer, an electron transporting layer and an electron injection layer, more preferably a hole transporting layer or a hole injection layer, further preferably a hole transporting layer. These layers contain a light emitting material, a hole transporting material, a hole injection material, an electron transporting material and an electron injection material, respectively. In forming these layers, a light emitting material, a hole transporting material, a hole injection material, an electron transporting material and an electron injection material are dissolved in the above-described solvent to prepare the ink of the present invention to be used. In forming these layers, the same method as for fabrication of the film of the present invention described above can be used.

The light emitting device has at least one light emitting layer between an anode and a cathode. In the light emitting device of the present invention, it is preferable that at least one of a hole injection layer and a hole transporting layer is present between an anode and a light emitting layer and/or at least one of an electron injection layer and an electron transporting layer is present between a cathode and a light emitting layer, for improving hole injectability and hole transportability.

When the light emitting device has a hole transporting layer, the material of the hole transporting layer includes the polymer compound of the present invention and hole transporting materials described above, and the polymer compound of the present invention is preferable. When this hole transporting material is dissolved in a solvent which is used in forming layer (usually, light emitting layer) adjacent to a hole transporting layer in fabrication of a light emitting device, it is preferable that the hole transporting material has a cross-linkable group for avoiding dissolution of the hole transporting material in the solvent. After forming a hole transporting layer using the hole transporting material having a cross-linkable group, it is possible that the cross-linkable group contained in the hole transporting material is cross-linked in the molecule or between molecules by heat, light and the like to insolubilize the hole transporting material.

When the light emitting device has an electron transporting layer, the material of the electron transporting layer includes electron transporting materials described above. When this electron transporting material is dissolved in a solvent used in forming a layer (usually, light emitting layer) adjacent to an electron transporting layer in fabrication of a light emitting device, it is preferable that the electron transporting material has a cross-linkable group for avoiding dissolution of the electron transporting material in the solvent. After forming an electron transporting layer using the electron transporting material having a cross-linkable group, it is possible that the cross-linkable group contained in the electron transporting material is cross-linked in the molecule or between molecules by heat, light and the like to insolubilize the electron transporting material.

When a compound of low molecular weight is used in a method of forming a hole transporting layer and an electron transporting layer in the light emitting device of the present invention, for example, a method of vacuum vapor deposition from powder and a method by film formation from solution or melted condition are mentioned. When a compound of high molecular weight is used, for example, a method by film formation from solution or melted condition is mentioned.

When the light emitting device has a hole injection layer and/or an electron injection layer, the material of the hole injection layer and the electron injection layer includes hole injection materials and electron injection materials described above.

The order and the number of layers to be laminated and the thickness of each layer may be controlled in view of light emission efficiency and device life.

The substrate in the light emitting device may advantageously be a substrate on which an electrode can be formed and which does not show chemical variation in forming an organic layer, and examples thereof include substrates made of a material such as glass, plastics, polymer films, silicon and the like. In the case of an opaque substrate, it is preferable that the opposite electrode is transparent or semi-transparent.

The material of the anode includes, for example, electrically conductive metal oxides and semi-transparent metals, preferably indium oxide, zinc oxide, tin oxide; and electrically conductive compounds composed of a composite thereof, that is, indium.tin.oxide (ITO), indium.zinc.oxide, and the like; NESA, gold, platinum, silver, copper, more preferably ITO, indium.zinc.oxide and tin oxide.

The anode may take a laminated structure composed of two or more layers.

As material of the cathode, materials of small work function are preferable, and examples thereof include metals such as lithium, sodium, potassium, rubidium, cesium, beryllium, magnesium, calcium, strontium, barium, aluminum, zinc, indium and the like; alloys composed of two or more of them; alloys composed of one or more of them and at least one of silver, copper, manganese, titanium, cobalt, nickel, tungsten and tin; and graphite and graphite intercalation compounds. The alloy includes, for example, a magnesium-silver alloy, a magnesium-indium alloy, a magnesium-aluminum alloy, an indium-silver alloy, a lithium-aluminum alloy, a lithium-magnesium alloy, a lithium-indium alloy and a calcium-aluminum alloy.

The cathode may take a laminated structure composed of two or more layers.

For obtaining planar light emission using a light emitting device, it may be advantageous that a planar anode and a planar cathode are disposed so as to overlap. For obtaining light emission in the form of pattern, there are a method in which a mask having a window in the form of pattern is placed on the surface of a planer light emitting device, a method in which a layer intending a non-luminous part is formed extremely thickly to give substantially no emission, and a method in which an anode or a cathode or both electrodes are formed in the form of pattern. By forming a pattern by any of these methods and by disposing several electrodes so that independent ON/OFF is possible, a segment type display capable of displaying numbers and letters, simple marks and the like is obtained. For obtaining a dot matrix display, it may be advantageous that both an anode and a cathode are formed in the form of stripe and disposed so as to cross. Partial color display and multi-color display are made possible by a method in which several kinds of polymer compounds showing different emission colors are painted separately and a method of using a color filter or a fluorescence conversion filter. The dot matrix display can be passively driven, or actively driven combined with TFT and the like. These displays can be used in computers, television sets, portable terminals, cellular telephones, car navigations, video camera view finders and the like. The planar light emitting device is of self-emission and thin type, and can be suitably used as a planer light source for backlight of a liquid display, or as a planar light source for illumination. If a flexible substrate is used, it can be used also as a curved light source and a curved display.

EXAMPLES

The present invention will be illustrated further in detail by examples below, but the present invention is not limited to these examples.

[Measurement Method of Number Average Molecular Weight and Weight Average Molecular Weight]

In the present examples, the polystyrene-equivalent number average molecular weight and the weight average molecular weight were measured by gel permeation chromatography (hereinafter, referred to as "GPC") (manufactured by Shimadzu Corp., trade name: LC-10Avp). A polymer compound to be measured was dissolved in tetrahydrofuran (hereinafter, referred to as "THF" in some cases) so as to give a concentration of about 0.5% by weight, and 30 µL of the solution was injected into GPC. Tetrahydrofuran was used as the mobile phase of GPC, and allowed to flow at a flow rate of 0.6 mL/min. As the column, two columns of TSKgel SuperHM-H (manufactured by Tosoh Corp.) and one column of TSKgel SuperH2000 (manufactured by Tosch Corp.) were connected serially. As a detector, a differential refractive index detector (manufactured by Shimadzu Corp., trade name: RID-10A) was used.

[Measurement Method of LC-MS]

In the present examples, measurement of LC-MS was conducted by the following method. A measurement sample was dissolved in chloroform or tetrahydrofuran so as to give a concentration of about 2 mg/mL, and about 1 µL of the solution was injected into LC-MS (manufactured by Agilent Technologies, trade name: 1100LCMSD).

As the mobile phase of LC-MS, acetonitrile and tetrahydrofuran were used while changing the ratio thereof and allowed to flow at a flow rate of 0.2 mL/min unless otherwise stated. As the column, L-column 2 ODS (3 µm) (manufactured by Chemicals Evaluation and Research Institute, internal diameter: 2.1 mm, length: 100 mm, particle size: 3 µm) was used.

[Measurement Method of NMR]

In the present examples, measurement of NMR was conducted by the following method. A measurement sample (5 to 10 mg) was dissolved in about 0.5 mL of deuterated chloroform or deuterated tetrahydrofuran, and measurement was performed using NMR (manufactured by Varian, trade name: MERCURY 300, or manufactured by Bruker, trade name: AVANCE600 TCI cryoprobe).

Synthesis Example 1

Synthesis of Compound B

Using a compound A, a compound B was synthesized as described below.

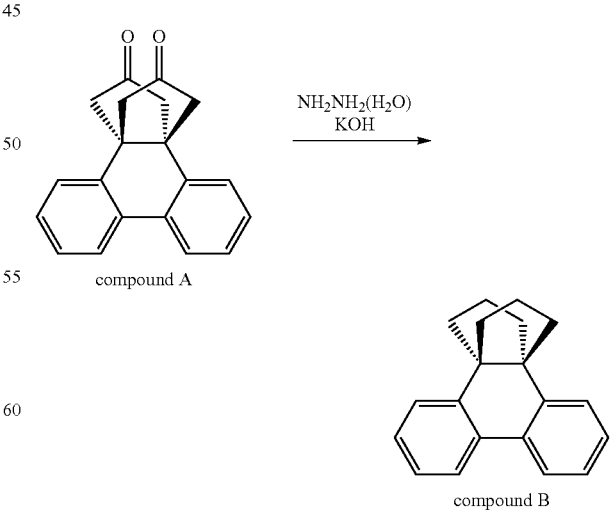

Into a 500 mL four-necked flask equipped with a stirrer were added a compound A (4.5 g) and ethylene glycol (180 g), and the gas in the flask was purged with an argon gas. Into this, hydrazine mono-hydrate (3.2 g) and potassium hydroxide (4.3 g) were added, the temperature was raised up to 180° C., and the mixture was stirred while thermally insulating for 28 hours at the same temperature. The resultant reaction solution was cooled down to room temperature, and water was added, to find deposition of a solid. The resultant solid was recovered by filtration-separation, then, dried under reduced pressure at room temperature, to obtain 3.9 g of a compound B as a white solid.

$^1$H-NMR (CDCl$_3$, 300 MHz) δ (ppm): 1.35 to 1.72 (4H, m), 1.89 to 2.24 (8H, m), 7.10 to 7.46 (6H, m), 7.90 (2H, d).

Synthesis Example 2

Synthesis of Compound 1

Using the compound B, a compound 1 was synthesized as described below.

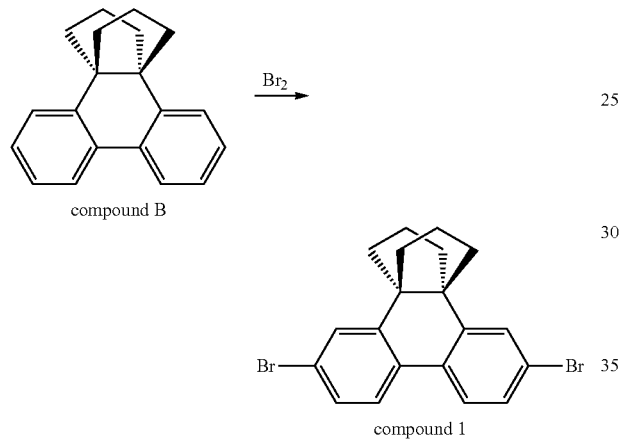

compound B compound 1

The gas in a 100 mL four-necked flask equipped with a stirrer was purged with an argon gas, then, the compound B (3.7 g), chloroform (45 g) and trifluoroacetic acid (7.5 mL) were added. The whole four-necked flask was light-shielded, and a mixture of bromine (5.7 g) and chloroform (11.2 g) was added at room temperature. The mixture was stirred while thermally insulating for 2.5 hours at room temperature, then, a 10 wt % sodium sulfite aqueous solution (20 g) was added. From the resultant reaction solution, the aqueous layer was separated, and the organic layer was washed with water, a 10 wt % dipotassium hydrogenphosphate solution and water in this order. The resultant organic layer was dried over magnesium sulfate, filtrated, and the resultant filtrate was concentrated to obtain a coarse product. The resultant coarse product was re-crystallized from a mixed solution of toluene and methanol, and the resultant solid was dissolved in chloroform, then, the solution was purified using a silica gel column (developing solvent: toluene/hexane mixed solution). The resultant solution was concentrated, then, activated carbon (3 g) was added, and the mixture was stirred while thermally insulating for 0.5 hours at 65° C. Thereafter, the solution was filtrated through a filter pre-coated with Celite at the same temperature, to obtain the filtrate and the residue. The resultant residue was washed with toluene several times, to obtain wash solutions. Here, the filtrate and the washing solutions after several operations were combined and concentrated partially, to obtain a toluene solution. To the resultant toluene solution was added hexane and re-crystallization was caused, to obtain 3.6 g of a compound 1 as a white solid. By conducting these synthesis procedures repeatedly, the necessary amount of the compound 1 was obtained.

LC-MS (ESI, positive): [M+H]$^+$ 417.

$^1$H-NMR (CDCl$_3$, 300 MHz) δ (ppm): 1.38 to 1.76 (4H, m), 1.85 to 2.24 (8H, m), 7.33 (2H, d), 7.50 (2H, s), 7.70 (2H, d).

Synthesis Example 3

Synthesis of Compound 2

Using the compound 1, a compound 2 was synthesized as described below.

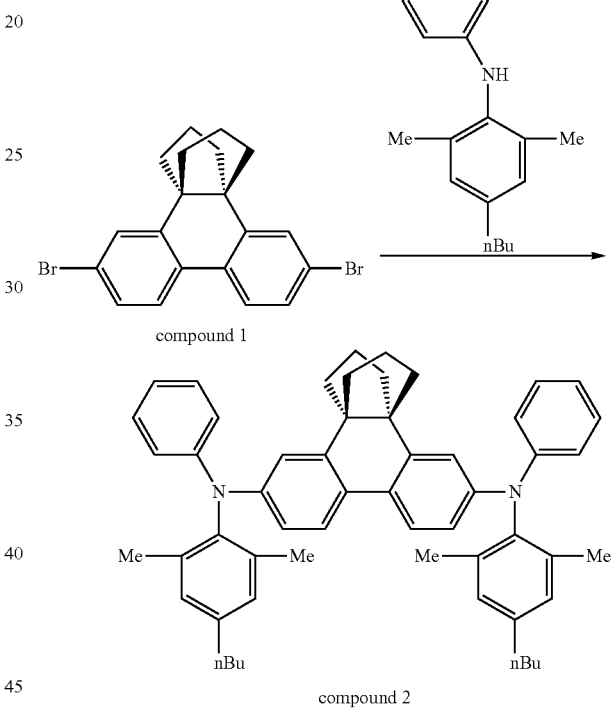

compound 1 compound 2

Into a 500 mL four-necked flask equipped with a stirrer were added N-phenyl-N-(4-n-butyl)-2,6-dimethylphenylamine (21.81 g), tris(dibenzylideneacetone)dipalladium (0) (1.31 g), tri-tert-butylphosphonium tetrafluoroborate (1.66 g) and sodium tert-butoxide (11.03 g), and the gas in the flask was purged with an argon gas. Into this, toluene (50 mL) and tert-butanol (4.8 g) were added, then, a mixture of the compound 1 (12.00 g) and toluene (100 mL) was dropped. Thereafter, the temperature was raised up to the reflux temperature, and the mixture was stirred while thermally insulating for 3 hours. The resultant reaction solution was cooled down to room temperature, water and toluene were added, the mixture was stirred at room temperature, then, the aqueous layer was separated, and the organic layer was washed with a saturated sodium chloride aqueous solution. To the resultant organic layer was added sodium sulfate, the mixture was filtrated, then, concentrated, to obtain a coarse product. The resultant coarse product was purified using a silica gel column (developing solvent: hexane/toluene mixed solution). The resultant solution was concentrated, recrystallized from a mixed solution of isopropanol and toluene, to obtain 18.6 g of a compound 2 as a white solid.

LC-MS (APCI, positive): [M+H]⁺ 763

Synthesis Example 4

Synthesis of Compound 3

Using the compound 2, a compound 3 was synthesized as described below.

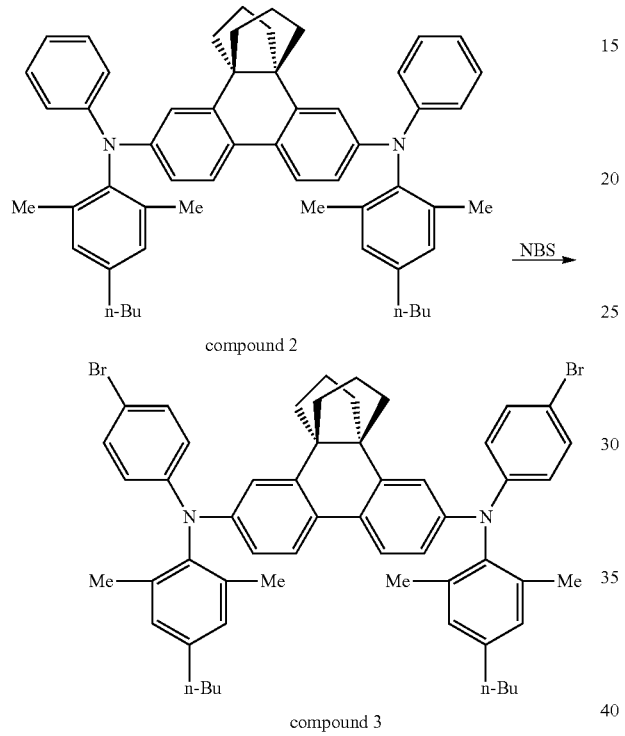

compound 2 compound 3

The gas in a 500 mL four-necked flask equipped with a stirrer was purged with an argon gas, the compound 2 (18.61 g), N,N-dimethylformamide (24 mL) and chlorobenzene (220 mL) were added, and the mixture was cooled down to 10° C. Thereafter, the whole flask was light-shielded, and N-bromosuccinimide (NBS) (8.77 g) was divided into several portions which were added in series at 10° C. Thereafter, the mixture was stirred while thermally insulating for 17 hours at 10° C., then, water was added, then, a saturated sodium sulfite aqueous solution was added until the color of bromine disappeared. The temperature was raised up to room temperature, then, to the resultant solution was added hexane, and the aqueous layer was separated. The resultant organic layer was washed with water once and with a saturated sodium chloride aqueous solution once, and concentrated to obtain a coarse product. The resultant coarse product was purified using a silica gel column (developing solvent: hexane/toluene mixed solution). The resultant solution was concentrated, and recrystallized from a mixed solution of hexane, toluene and ethanol, to obtain 14.7 g of a compound 3 as a white solid.

LC-MS (APCI, positive): [M+H]⁺ 919

$^1$H-NMR (CD$_2$Cl$_2$, 300 MHz) δ (ppm): 0.98 to 1.03 (6H, m), 1.38 to 1.73 (12H, m), 1.86 to 2.06 (20H, m), 2.64 (4H, br), 6.90 to 7.65 (18H, br).

Synthesis Example 5

Synthesis of Compound 4

A compound 4 represented by the following formula was synthesized according to a method described in JP-A No. 2006-188673.

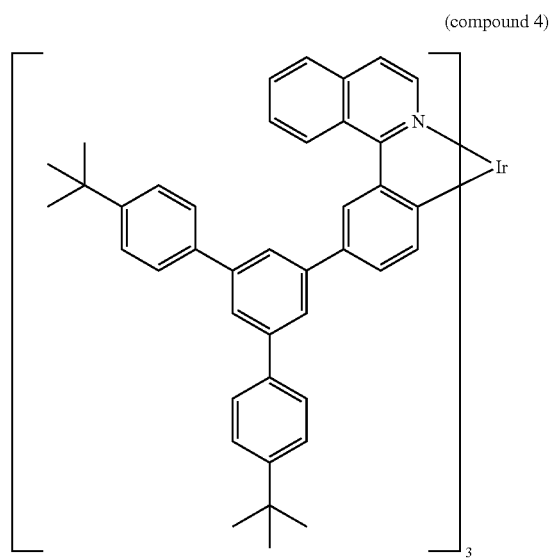

(compound 4)

Example 1

Synthesis of Polymer Compound 1

(Step 1) An inert gas atmosphere was prepared in a reaction vessel, then, the compound 3 (1.80 mmol), a compound 5 (2.97 mmol) synthesized according to a method described in JP-A No. 2011-174062, a compound 6 (0.60 mmol), a compound 7 (0.30 mmol) synthesized according to a method described in JP-A No. 2008-106241, a compound 8 (0.30 mmol) synthesized according to a method described in JP-A No. 2010-215886, dichlorobis(tris-o-methoxyphenylphosphine)palladium (2.6 mg) and toluene (71 mL) were added, and the mixture was heated up to 105° C.

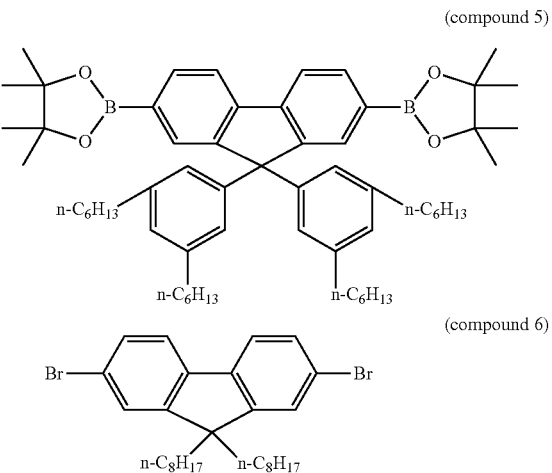

(compound 5)

(compound 6)

95

-continued

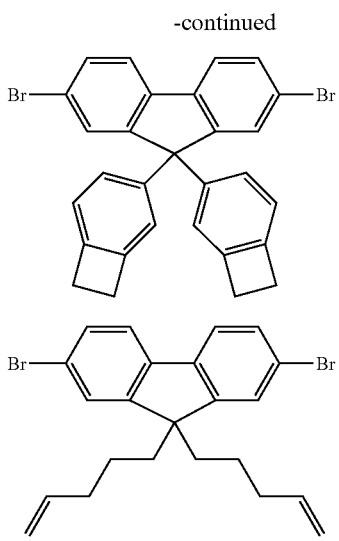

(compound 7)

(compound 8)

(Step 2) Into the reaction solution, a 20 wt % tetraethylammonium hydroxide aqueous solution (10 mL) was dropped, and the mixture was refluxed for 5 hours.

(Step 3) After the reaction, phenylboronic acid (36.6 mg) and dichlorobis(tris-o-methoxyphenylphosphine)palladium (2.6 mg) were added to this, and the mixture was refluxed for 16.5 hours.

(Step 4) Thereafter, a sodium diethyldithiacarbamate aqueous solution was added to this, and the mixture was stirred at 80° C. for 2 hours. After cooling, the resultant reaction solution was washed with water twice, with a 3 wt % acetic acid aqueous solution twice and with water twice, and the resultant solution was dropped into methanol, to find generation of a precipitate. The resultant precipitate was dissolved in toluene, and purified by passing through an aluminum column and a silica gel column in this order. The resultant solution was dropped into methanol, the mixture was stirred, then, the resultant precipitate was collected by filtration and dried, to obtain 2.90 g of a polymer compound 1. The polymer compound 1 had a polystyrene-equivalent number average molecular weight of $4.7 \times 10^4$ and a polystyrene-equivalent weight average molecular weight of $2.6 \times 10^5$.

The polymer compound 1 is a copolymer constituted of a constituent unit derived from the compound 5, a constituent unit derived from the compound 3, a constituent unit derived from the compound 6, a constituent unit derived from the compound 7, a constituent unit derived from the compound 8 at a molar ratio of 50:30:10:5:5 according to the theoretical values calculated from the amounts of the charging raw materials.

Example 2

Synthesis of Polymer Compound 2

A polymer compound 2 (1.71 g) was obtained in the same manner as for synthesis of the polymer compound 1 except that (Step 1) in synthesis of the polymer compound 1 was changed to "An inert gas atmosphere was prepared in a reaction vessel, then, the compound 3 (2.40 mmol), a compound 9 (2.99 mmol), a compound 7 (0.30 mmol), a compound 8 (0.30 mmol), dichlorobis(tris-o-methoxyphenylphosphine)palladium (2.6 mg) and toluene (71 mL) were mixed, and the mixture was heated up to 105° C.". The polymer compound 2 had a polystyrene-equivalent number average molecular weight of $4.8 \times 10^4$ and a polystyrene-equivalent weight average molecular weight of $2.6 \times 10^5$.

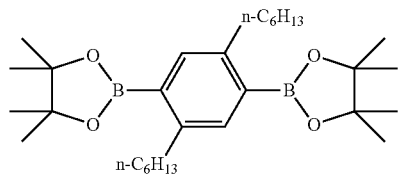

(compound 9)

The polymer compound 2 is a copolymer constituted of a constituent unit derived from the compound 9, a constituent unit derived from the compound 3, a constituent unit derived from the compound 7, a constituent unit derived from the compound 8 at a molar ratio of 50:40:5:5 according to the theoretical values calculated from the amounts of the charging raw materials.

Synthesis Example 6

Synthesis of Polymer Compound 3

A polymer compound 3 (1.75 g) was obtained in the same manner as for synthesis of the polymer compound 1 except that (Step 1) in synthesis of the polymer compound 1 was changed to "An inert gas atmosphere was prepared in a reaction vessel, then, a compound 10 (1.20 mmol), a compound 5 (1.98 mmol), a compound 6 (0.40 mmol), a compound 7 (0.20 mmol), a compound 8 (0.20 mmol), dichlorobis(phenylphosphine)palladium (1.4 mg) and toluene (47 mL) were mixed, and the mixture was heated up to 105° C.". The polymer compound 3 had a polystyrene-equivalent number average molecular weight of $4.6 \times 10^4$ and a polystyrene-equivalent weight average molecular weight of $2.3 \times 10^5$.

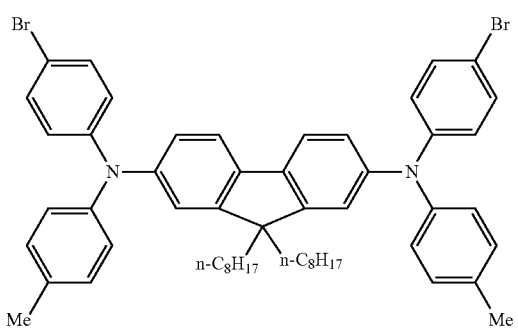

(compound 10)

The polymer compound 3 is a copolymer constituted of a constituent unit derived from the compound 5, a constituent unit derived from the compound 10, a constituent unit derived from the compound 6, a constituent unit derived from the compound 7, a constituent unit derived from the compound 8 at a molar ratio of 50:30:10:5:5 according to the theoretical values calculated from the amounts of the charging raw materials.

Synthesis Example 7

Synthesis of Polymer Compound 4

A polymer compound 4 (1.46 g) was obtained in the same manner as for synthesis of the polymer compound 1 except that (Step 1) in synthesis of the polymer compound 1 was changed to "An inert gas atmosphere was prepared in a reaction vessel, then, a compound 10 (1.60 mmol), a compound 9 (1.97 mmol), a compound 7 (0.20 mmol), a compound 8 (0.20 mmol), dichlorobis(tris-o-methoxyphenyl-phosphine)palladium (1.8 mg) and toluene (47 mL) were mixed, and the mixture was heated up to 105° C.". The polymer compound 3 had a polystyrene-equivalent number average molecular weight of $1.7 \times 10^4$ and a polystyrene-equivalent weight average molecular weight of $9.9 \times 10^4$.

The polymer compound 4 is a copolymer constituted of a constituent unit derived from the compound 9, a constituent unit derived from the compound 10, a constituent unit derived from the compound 7, a constituent unit derived from the compound 8 at a molar ratio of 50:40:5:5 according to the theoretical values calculated from the amounts of the charging raw materials.

Synthesis Example 8

Synthesis of Polymer Compound 5

A polymer compound 5 (1.71 g) was obtained in the same manner as for synthesis of the polymer compound 1 except that (Step 1) in synthesis of the polymer compound 1 was changed to "An inert gas atmosphere was prepared in a reaction vessel, then, a compound 11 (1.20 mmol), a compound 5 (1.96 mmol), a compound 6 (0.40 mmol), a compound 7 (0.20 mmol), a compound 8 (0.20 mmol), dichlorobis(phenylphosphine)palladium (1.4 mg) and toluene (47 mL) were mixed, and the mixture was heated up to 105° C.". The polymer compound 3 had a polystyrene-equivalent number average molecular weight of $6.7 \times 10^4$ and a polystyrene-equivalent weight average molecular weight of $2.4 \times 10^5$.

(compound 11)

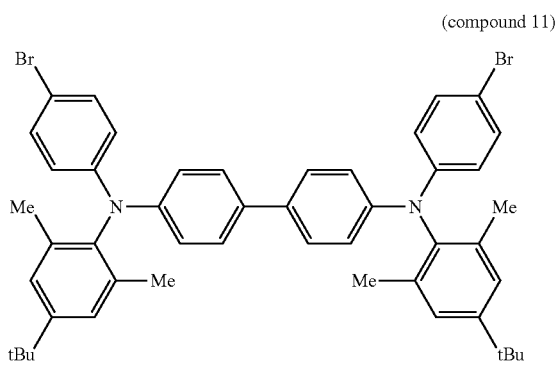 [SMILES: Cc1cc(C(C)(C)C)cc(C)c1N(c1ccc(Br)cc1)c1ccc(-c2ccc(N(c3ccc(Br)cc3)c3c(C)cc(C(C)(C)C)cc3C)cc2)cc1]

The polymer compound 5 is a copolymer constituted of a constituent unit derived from the compound 5, a constituent unit derived from the compound 11, a constituent unit derived from the compound 6, a constituent unit derived from the compound 7, a constituent unit derived from the compound 8 at a molar ratio of 50:30:10:5:5 according to the theoretical values calculated from the amounts of the charging raw materials.

Synthesis Example 9

Synthesis of Polymer Compound 6

A polymer compound 6 (2.00 g) was obtained in the same manner as for synthesis of the polymer compound 1 except that (Step 1) in synthesis of the polymer compound 1 was changed to "An inert gas atmosphere was prepared in a reaction vessel, then, a compound 12 (3.92 mmol) synthesized according to a method described in JP-A No. 2011-174061, a compound 6 (3.60 mmol), a compound 13 (0.40 mmol), dichlorobis(triphenylphosphine)palladium (2.8 mg) and toluene (40 ml) were mixed, and the mixture was heated up to 105° C.". The polymer compound 6 had a polystyrene-equivalent number average molecular weight of $1.1 \times 10^5$ and a polystyrene-equivalent weight average molecular weight of $2.8 \times 10^5$.

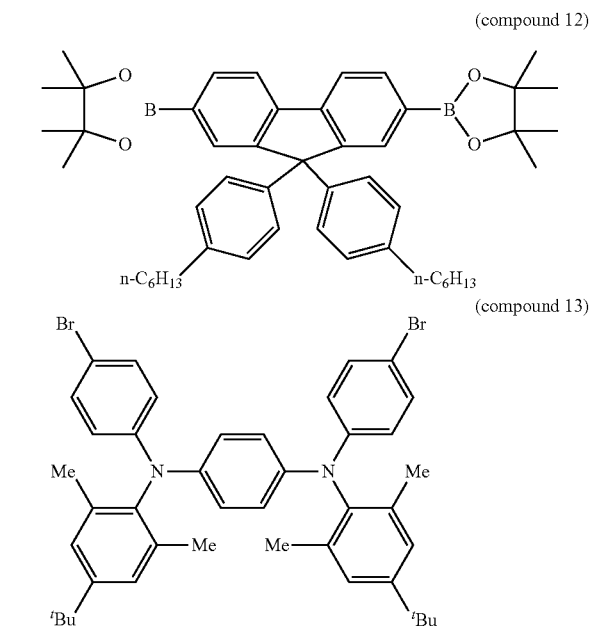

(compound 12)

(compound 13)

The polymer compound 6 is a copolymer constituted of a constituent unit derived from the compound 12, a constituent unit derived from the compound 6, a constituent unit derived from the compound 13 at a molar ratio of 50:45:5 according to the theoretical values calculated from the amounts of the charging raw materials.

Synthesis Example 10

Synthesis of Compound 15

Using a compound 14, a compound 15 was synthesized as described below.

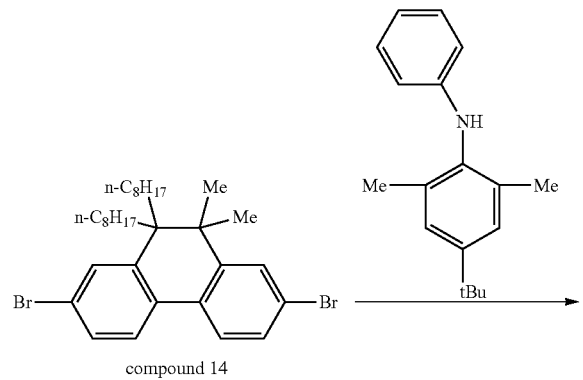

compound 14

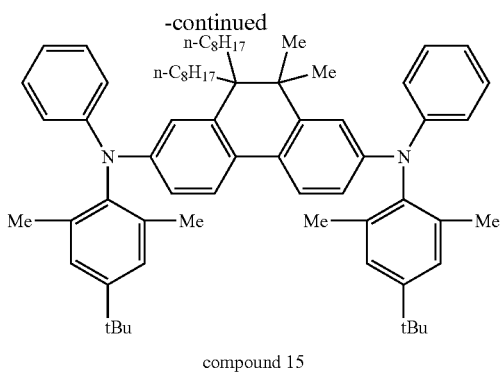

compound 15

Into a 500 mL four-necked flask equipped with a stirrer were added N-phenyl-N-(4-tert-butyl)-2,6-dimethylphenylamine (12.52 g), tris(dibenzylideneacetone)dipalladium (0) (0.75 g), tri-tert-butylphosphonium tetrafluoroborate (0.96 g) and sodium tert-butoxide (6.46 g), then, the gas in the flask was purged with an argon gas. Toluene (50 mL) was added to this, further, a mixture of a compound 14 (12.00 g) synthesized according to a method described in Japanese Patent Application National Publication (Laid-Open) No. 2010-501030 and toluene (100 mL) was dropped. Thereafter, the temperature was raised up to 50° C., and the mixture was stirred while thermally insulating for 3 hours. The resultant reaction solution was cooled down to room temperature, water and toluene were added, the mixture was stirred at room temperature, then, the aqueous layer was separated, and the organic layer was washed with a saturated sodium chloride aqueous solution. To the resultant organic layer was added sodium sulfate, the mixture was filtrated, then, concentrated, to obtain a coarse product. The resultant coarse product was purified using a silica gel column (developing solvent: hexane/toluene mixed solution). The resultant solution was concentrated, then, hexane and activated carbon (2.3 g) were added, and the mixture was stirred while thermally insulating for 0.5 hours at 50° C. Thereafter, the solution was filtrated through a filter pre-coated with Celite at the same temperature, to obtain the filtrate and the residue. The resultant residue was washed with hexane several times, to obtain wash solutions. The resultant solution was concentrated, then, isopropanol and toluene were added and recrystallization was caused, to obtain 11.9 g of a compound 15 as a white solid. By conducting these synthesis procedures repeatedly, the necessary amount of the compound 15 was obtained.

Synthesis Example 11

Synthesis of Compound 16

Using the compound 15, a compound 16 was synthesized as described below.

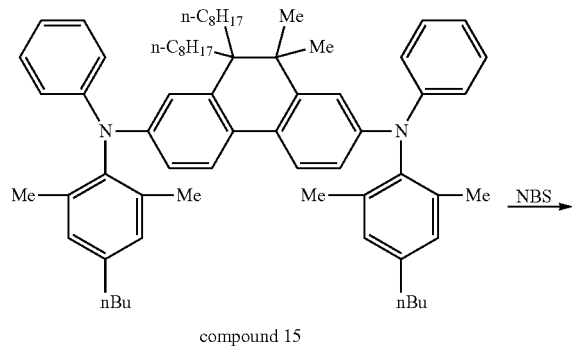

compound 15

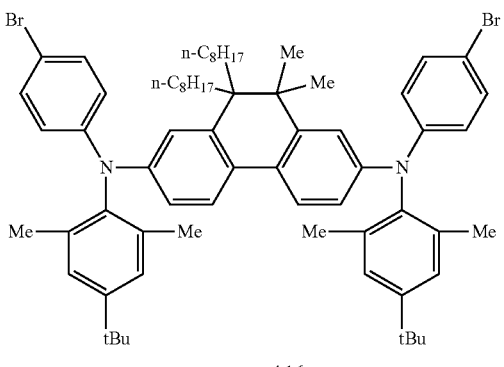

compound 16

The gas in a 500 mL four-necked flask equipped with a stirrer was purged with an argon gas, the compound 15 (18.61 g), N,N-dimethylformamide (19 mL) and chlorobenzene (140 mL) were added, and the mixture was cooled down to 10° C. Thereafter, the whole flask was light-shielded, and N-bromosuccinimide (NBS) (4.01 g) was divided into several portions which were added in series at 10° C. Thereafter, the mixture was stirred while thermally insulating for 10 hours at 10° C., then, water was added, then, a saturated sodium sulfite aqueous solution was added until the color of bromine disappeared. The temperature was raised up to room temperature, then, to the resultant solution was added hexane, and the aqueous layer was separated. The resultant organic layer was washed with water once and with a saturated sodium chloride aqueous solution once, and concentrated to obtain a coarse product. Thereafter, hexane and activated carbon (1.3 g) were added, and the mixture was stirred while thermally insulating for 0.5 hours at 50° C. Thereafter, the solution was filtrated through a filter pre-coated with Celite at the same temperature, to obtain the filtrate and the residue. The resultant residue was washed with hexane several times, and concentrated to obtain a coarse product. The resultant coarse product was purified using a silica gel column (developing solvent: hexane/toluene mixed solution), to obtain 3.10 g a compound 16 as a white solid.

LC-MS (APCI, positive): [M+H]$^+$ 1091

$^1$H-NMR (THF-d$_8$, 300 MHz) δ (ppm)=0.84 (12H, m), 1.11 to 1.34 (46H, br), 1.97 (12H, br), 6.61 to 6.76 (6H, br), 6.93 (1H, s), 7.03 to 7.23 (9H, br), 7.41 (2H, br).

Synthesis Example 12

Synthesis of Compound 17

A compound 17 represented by the following formula was synthesized according to a method described in WO2009/131255.

(compound 17)

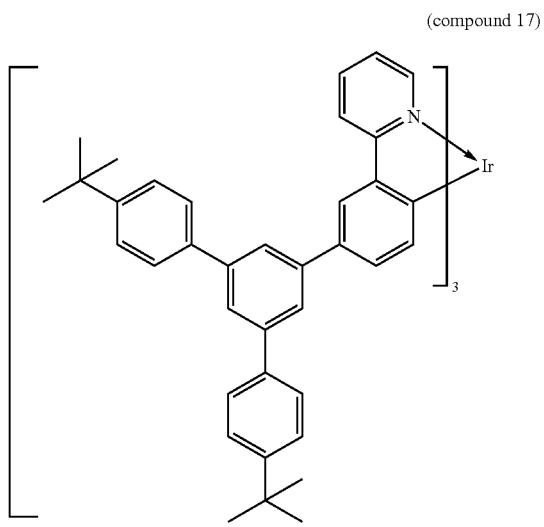

Example 3

Synthesis of Polymer Compound 7

A polymer compound 7 (1.73 g) was obtained in the same manner as for synthesis of the polymer compound 1 except that (Step 1) in synthesis of the polymer compound 1 was changed to "An inert gas atmosphere was prepared in a reaction vessel, then, a compound 16 (1.60 mmol), a compound 9 (1.98 mmol), a compound 7 (0.20 mmol), a compound 8 (0.20 mmol), dichlorobis(tris-o-methoxyphenylphosphine)palladium (1.8 mg) and toluene (55 mL) were mixed, and the mixture was heated up to 105° C.". The polymer compound 7 had a polystyrene-equivalent number average molecular weight of $5.5 \times 10^4$ and a polystyrene-equivalent weight average molecular weight of $2.7 \times 10^5$.

The polymer compound 7 is a copolymer constituted of a constituent unit derived from the compound 9, a constituent unit derived from the compound 16, a constituent unit derived from the compound 7, a constituent unit derived from the compound 8 at a molar ratio of 50:40:5:5 according to the theoretical values calculated from the amounts of the charging raw materials.

Synthesis Example 13

Synthesis of Polymer Compound 8

A polymer compound 8 (1.74 g) was obtained in the same manner as for synthesis of the polymer compound 1 except that (Step 1) in synthesis of the polymer compound 1 was changed to "An inert gas atmosphere was prepared in a reaction vessel, then, a compound 18 (2.40 mmol), a compound 9 (2.98 mmol), a compound 7 (0.30 mmol), a compound 8 (0.30 mmol), dichlorobis(triphenylphosphine)palladium (2.6 mg) and toluene (73 ml) were mixed, and the mixture was heated up to 105° C.". The polymer compound 8 had a polystyrene-equivalent number average molecular weight of $5.0 \times 10^4$ and a polystyrene-equivalent weight average molecular weight of $2.3 \times 10^5$.

(compound 18)

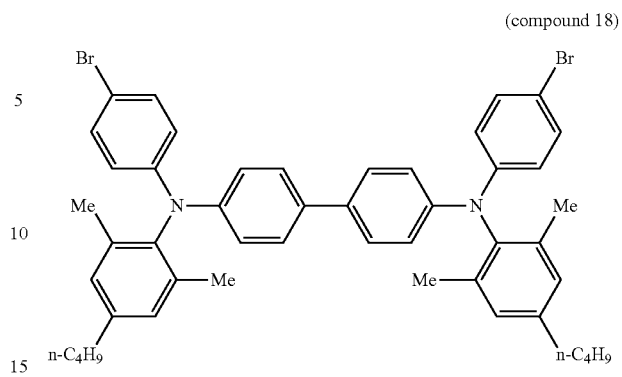

The polymer compound 8 is a copolymer constituted of a constituent unit derived from the compound 9, a constituent unit derived from the compound 18, a constituent unit derived from the compound 7, a constituent unit derived from the compound 8 at a molar ratio of 50:40:5:5 according to the theoretical values calculated from the amounts of the charging raw materials.

Synthesis Example 14

Synthesis of Polymer Compound 9

A polymer compound 9 (9.80 was obtained in the same manner as for synthesis of the polymer compound 1 except that (Step 1) in synthesis of the polymer compound 1 was changed to "An inert gas atmosphere was prepared in a reaction vessel, then, a compound 19 (5.00 mmol), a compound 9 (24.9 mmol), a compound 20 (20.00 mmol), palladium acetate (3.7 mg), tris(2-methoxyphenyl)phosphine (23.2 mg) and toluene (250 ml) were mixed, and the mixture was heated up to 105° C. Into the reaction solution, a 20 wt % tetraethylammonium hydroxide aqueous solution (60 mL) was dropped and the mixture was refluxed for 5 hours.". The polymer compound 9 had a polystyrene-equivalent number average molecular weight of $9.2 \times 10^4$ and a polystyrene-equivalent weight average molecular weight of $2.3 \times 10^5$.

(compound 19)

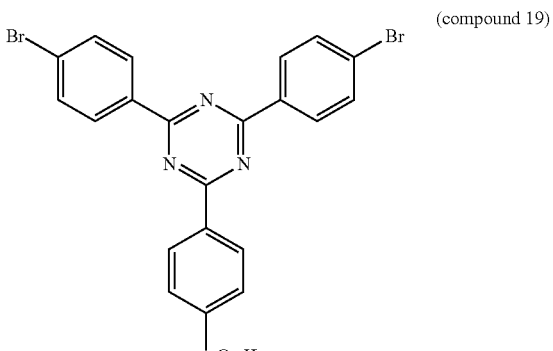

(compound 20)

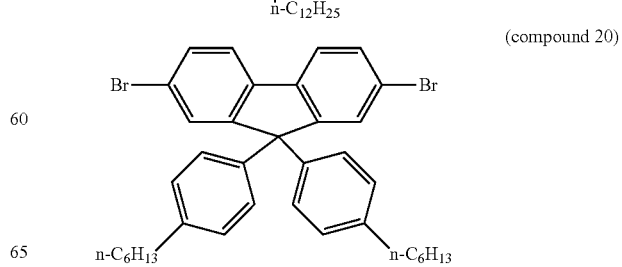

The polymer compound 9 is a copolymer constituted of a constituent unit derived from the compound 9, a constituent unit derived from the compound 20, a constituent unit derived from the compound 19 at a molar ratio of 50:40:10 according to the theoretical values calculated from the amounts of the charging raw materials.

Synthesis Example 15

Synthesis of Compound 22

Using a compound 21, a compound 22 was synthesized as described below.

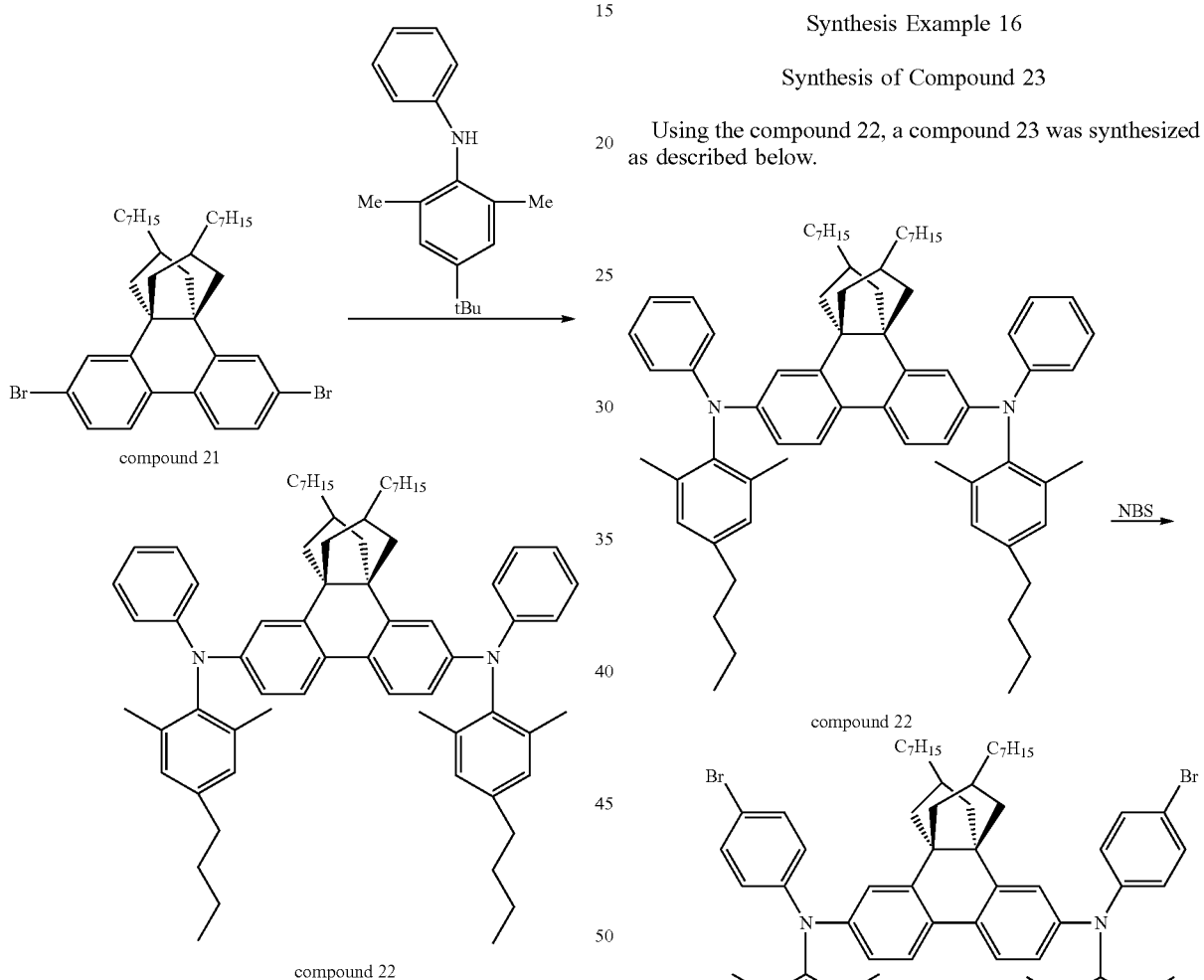

Into a 1000 mL four-necked flask equipped with a stirrer were added N-phenyl-N-(4-n-butyl)-2,6-dimethylphenylamine (23.00 g), tris(dibenzylideneacetone)dipalladium (0) (1.64 g), di-tert-butylphenylphosphine (1.59 g) and sodium tert-butoxide (10.36 g), and the gas in the flask was purged with an argon gas. To this were added toluene (90 mL) and tert-butanol (12.6 g), then, a mixture of a compound 21 (22.00 g) synthesized according to a method described in WO2012/086667 and toluene (220 mL) was dropped. Thereafter, the mixture was heated up to 80° C., and the mixture was stirred while thermally insulating for 3 hours at 80° C. The resultant reaction solution was cooled down to room temperature, then, water and toluene were added, and the mixture was stirred at room temperature. Thereafter, the aqueous layer was separated, and the resultant organic layer was washed with a saturated sodium chloride aqueous solution. To the resultant organic layer was added magnesium sulfate, the mixture was filtrated, then, concentrated, to obtain a coarse product. Thereafter, hexane and activated carbon (17.3 g) were added, and the mixture was stirred at 50° C. for 1 hour. Thereafter, the mixture was filtrated through a filter pre-coated with Celite at the same temperature. The resultant residue was washed with hexane several times. The resultant wash solution was concentrated, then, recrystallization was caused using isopropanol and heptane, to obtain 19.6 g of a compound 22 as a white solid.

LC-MS (APCI, positive): [M+H]$^+$ 959

Synthesis Example 16

Synthesis of Compound 23

Using the compound 22, a compound 23 was synthesized as described below.

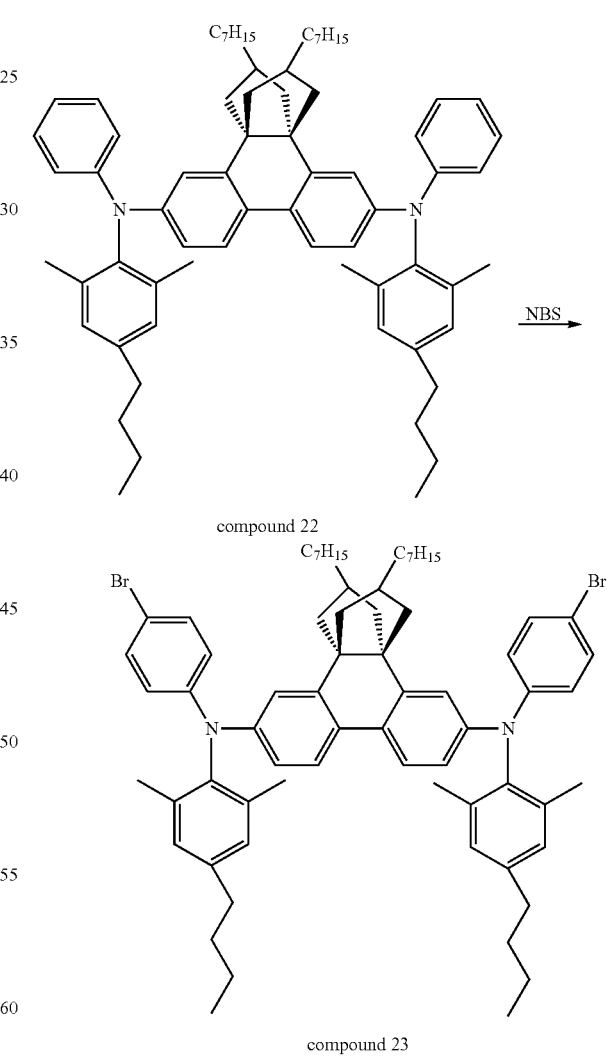

The gas in a 500 mL four-necked flask equipped with a stirrer was purged with an argon gas, then, the compound 22 (16.88 g) and chloroform (250 mL) were added, and the mixture was cooled down to 0° C. Thereafter, the whole flask was light-shielded, N-bromosuccinimide (NBS) (6.24 g) was divided into several portions which were added in series at 0° C., and the mixture was stirred while thermally insulating for 5 hours at 0° C. Thereafter, water was added, then, a saturated sodium sulfite aqueous solution was added until the color of bromine disappeared. The resultant reaction solution was heated up to room temperature, then, hexane was added, and the aqueous layer was separated. The resultant organic layer was washed with water once and with a saturated sodium chloride aqueous solution once, then, and concentrated to obtain a coarse product. Thereafter, hexane and activated carbon (9.3 g) were added, and the mixture was stirred at 50° C. for 1 hour. Thereafter, the solution was filtrated through a filter pre-coated with Celite at the same temperature. The resultant residue was washed with hexane several times. The resultant wash solution was concentrated, then, recrystallization was caused using isopropanol, to obtain 15.0 g of a compound 23 as a white solid.

LC-MS (APCI, positive): [M+H]$^+$ 1115

$^1$H-NMR (THF-d$_8$, 300 MHz) δ (ppm)=0.93 (12H, m), 1.25 to 1.34 (34H, br), 1.65 (12H, m), 2.05 (4H, m), 2.57 (4H, t), 6.60 to 6.69 (2H, m), 6.84 (4H, d), 6.95 (4H, s), 7.11 (2H, m), 7.27 (4H, d), 7.58 (2H, m).

Synthesis Example 17

Synthesis of Compound 25

Using a compound 24, a compound 25 was synthesized as described below.

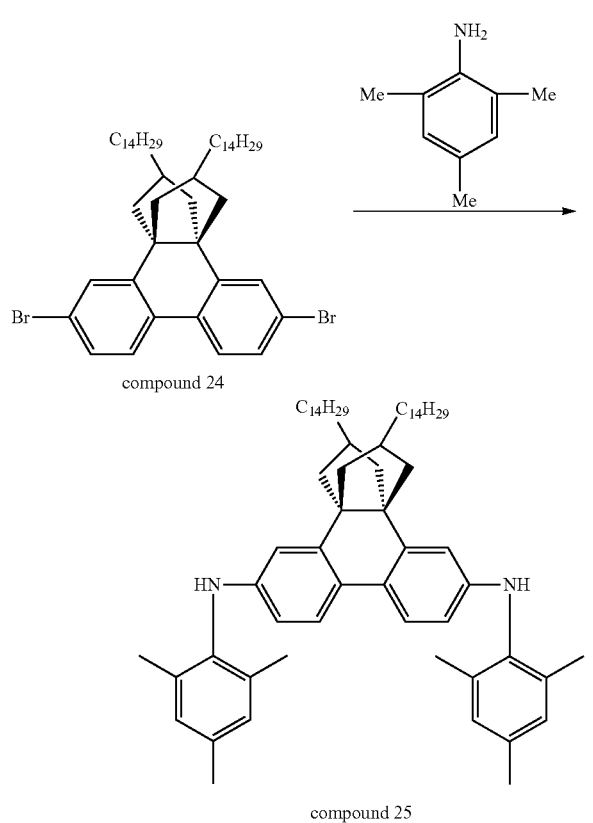

compound 25

Into a 1000 mL four-necked flask equipped with a stirrer were added tris(dibenzylideneacetone)dipalladium(0) (0.54 g), di-tert-butylphenylphosphonium tetrafluoroborate (0.36 g) and sodium tert-butoxide (17.01 g), and the gas in the flask was purged with an argon gas. To this was added toluene (180 mL), then, a mixture of a compound 24 (47.84 g) synthesized according to a method described in WO2012/086667, trimethylaniline (17.55 g) and toluene (480 mL) was dropped. Thereafter, the mixture was heated up to 80° C., and the mixture was stirred while thermally insulating for 2 hours at 80° C. The resultant reaction solution was cooled down to room temperature, then, water and toluene were added, and the mixture was stirred at room temperature. Thereafter, the aqueous layer was separated, and the resultant organic layer was washed with a saturated sodium chloride aqueous solution. To the resultant organic layer was added magnesium sulfate, and the mixture was filtrated, then, concentrated, to obtain a coarse product. The resultant coarse product was purified using a silica gel column (developing solvent: hexane/toluene mixed solution), to obtain 25.11 g of a compound 25 as a white solid.

Synthesis Example 18

Synthesis of Compound 26

Using the compound 25, a compound 26 was synthesized as described below.

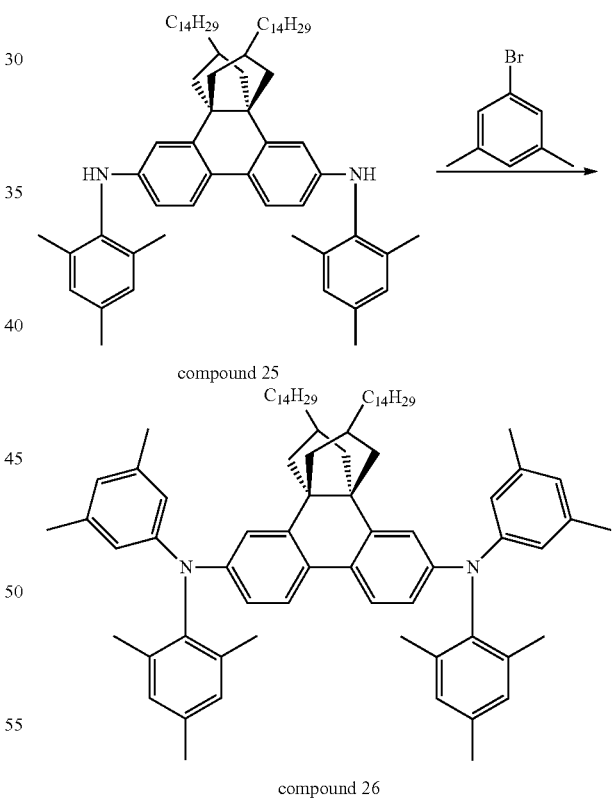

compound 26

Into a 500 mL four-necked flask equipped with a stirrer were added tris(dibenzylideneacetone)dipalladium(0) (1.20 g), di-tert-butylphenylphosphonium tetrafluoroborate (0.81 g) and sodium tert-butoxide (8.85 g), and the gas in the flask was purged with an argon gas. To this was added toluene (92 mL), then, a mixture of the compound 25 (24.19 g), 5-bromo-m-xylene (12.17 g) and toluene (190 mL) was dropped. Thereafter, the mixture was heated up to 80° C., and the mixture was stirred while thermally insulating for 2 hours at 80° C. The resultant reaction solution was cooled down to room temperature, then, water and toluene were added, and the mixture was stirred at room temperature. Thereafter, the aqueous layer was separated, and the resultant organic layer was washed with a saturated sodium chloride aqueous solution. To the resultant organic layer was added magnesium sulfate, and the mixture was filtrated, then, concentrated, to obtain a coarse product. The resultant coarse product was purified using a silica gel column (developing solvent: hexane/toluene mixed solution), to obtain 23.94 g of a compound 26 as a white solid.

Synthesis Example 19

Synthesis of Compound 27

Using the compound 26, a compound 27 was synthesized as described below.

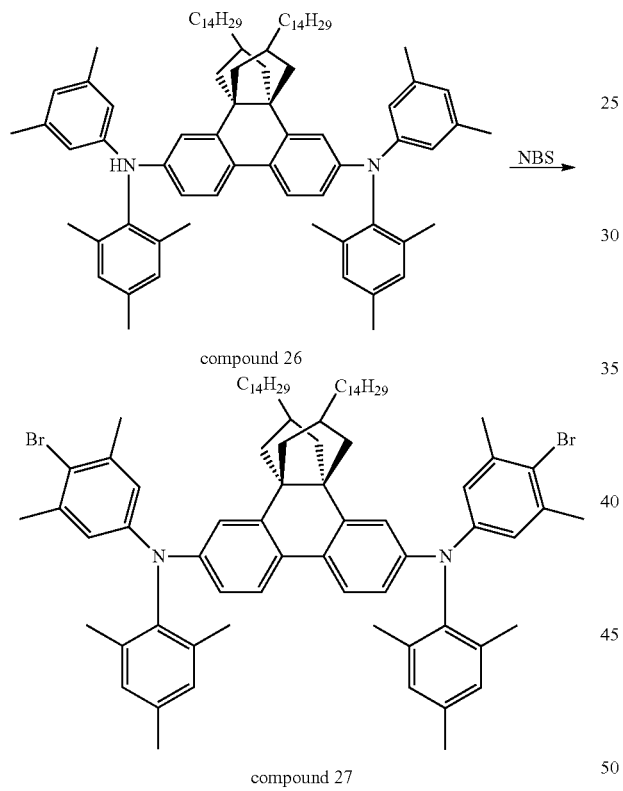

The gas in a 500 mL four-necked flask equipped with a stirrer was purged with an argon gas, then, the compound 26 (22.75 g) and chloroform (230 mL) were added, and the mixture was cooled down to −20° C. Thereafter, the whole flask was light-shielded, N-bromosuccinimide (NBS) (7.30 g) was divided into several portions which were added in series at −20° C., and the mixture was stirred while thermally insulating for 5 hours at −20° C. Thereafter, water was added, then, a saturated sodium sulfite aqueous solution was added until the color of bromine disappeared. The resultant reaction solution was heated up to room temperature, then, hexane was added, and the aqueous layer was separated. The resultant organic layer was washed with water once and with a saturated sodium chloride aqueous solution once, then, concentrated to obtain a coarse product. Thereafter, recrystallization was caused using isopropanol and hexane, to obtain 24.7 g of a compound 27 as a white solid.

LC-MS (APCI, positive): [M+H]$^+$ 1283

$^1$H-NMR (THF-d$_8$, 300 MHz) δ (ppm)=0.86 (6H, m), 1.26 (56H, br), 1.95 (13H, s), 2.28 (19H, m), 6.41 to 6.59 (2H, m), 6.71 (4H, s), 6.92 (4H, s), 7.13 (2H, m), 7.55 (2H, d).

Synthesis Example 20

Synthesis of Compound 29

Using a compound 28, a compound 29 was synthesized as described below.

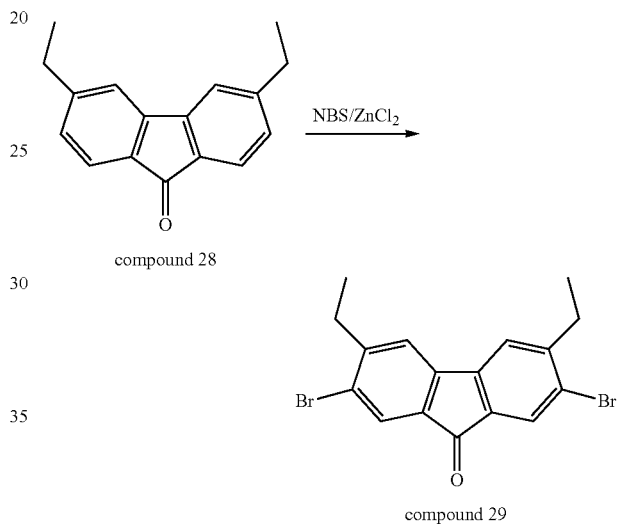

Into a 1000 mL four-necked flask equipped with a stirrer were added a compound 28 (26.12 g) synthesized according to a method described in "Helvetica Chimica Acta 1998, 81, 1821", trifluoroacetic acid (138 mL), chloroform (265 mL) and zinc(II) chloride (31.67 g), and the gas in the flask was purged with a nitrogen gas. N-bromosuccinimide (28.81 g) was divided into several portions which were added in series into this, and the mixture was stirred for 7 hours at room temperature. Thereafter, a 10 wt % sodium sulfite aqueous solution (150 mL) was added, and the aqueous layer was separated. The resultant organic layer was washed with ion-exchange water (150 mL), then, the resultant organic layer was concentrated. The resultant solid was washed with ethanol (200 mL) twice, to obtain 51.87 g of a compound 29 as a yellow solid.

Synthesis Example 21

Synthesis of Compound 30

Using the compound 29, a compound 30 was synthesized as described below.

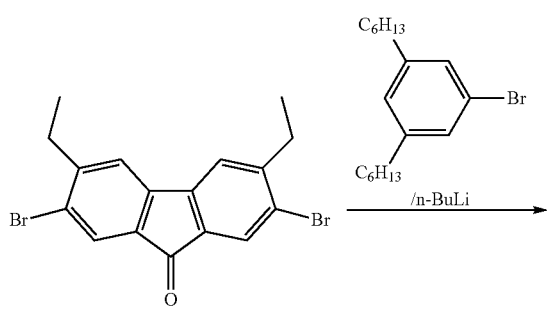

compound 29

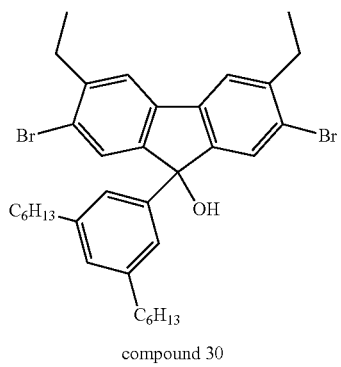

compound 30

Into a 1000 mL four-necked flask equipped with a stirrer were added 1-bromo-3,6-di-hexylbenzene (11.12 g) and tetrahydrofuran (410 mL), the gas in the flask was purged with a nitrogen gas, then, the flask was cooled in a dry ice/methanol bath. To this was added n-butyllithium (1.6 M, 21 mL), and the mixture was stirred for 0.5 hours while the flask being cooled in a dry ice/methanol bath. To this was added the compound 29 (8.90 g), and the mixture was stirred for 3 hours while the flask being cooled in a dry ice/methanol bath. To this was added methanol (20 mL), then, the temperature was raised up to room temperature. The resultant reaction solution was washed with a 10 wt % sodium chloride aqueous solution (100 mL) three times, then, the resultant organic layer was concentrated, to obtain a coarse product. The resultant coarse product was purified using a silica gel column (developing solvent: hexane/ethyl acetate mixed solution), to obtain 14.31 g of a compound 30 as a white solid. By conducting this operation repeatedly, the necessary amount of the compound 30 was obtained.

Synthesis Example 22

Synthesis of Compound 31

Using the compound 30, a compound 31 was synthesized as described below.

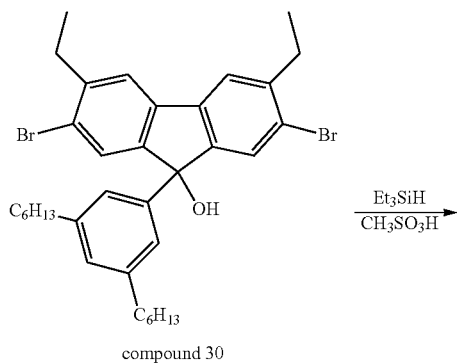

compound 30

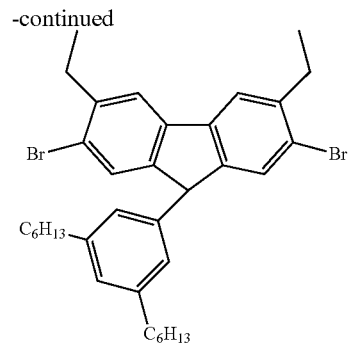

compound 31

Into a 1000 mL four-necked flask equipped with a stirrer were added the compound 30 (81.20 g) and heptane (500 mL), and the gas in the flask was purged with a nitrogen gas. To this was added triethylsilicane (59.04 g), the mixture was heated up to 65° C., then, methanesulfonic acid (48.94 g) was added, and the mixture was stirred at 65° C. for 0.5 hours. The resultant reaction mixture was cooled down to room temperature, then, washed with ion-exchange water (500 mL) twice, with a saturated sodium hydrogen carbonate aqueous solution (300 mL) once, and with ion-exchange water (500 mL) once. The resultant organic layer was concentrated, to obtain a coarse product. The resultant coarse product was purified using a silica gel column (developing solvent: hexane/ethyl acetate mixed solution). The resultant coarse product was dissolved in hexane (400 mL), then, activated carbon (17 g) was added, and the mixture was filtrated and concentrated, and these procedures were repeated three times, to obtain 60.99 g of a compound 31 as a white solid.

Synthesis Example 23

Synthesis of Compound 32

Using the compound 31, a compound 32 was synthesized as described below.

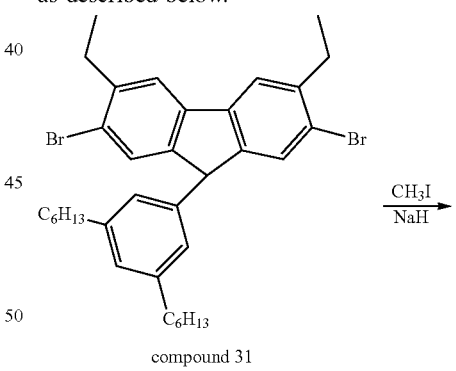

compound 31

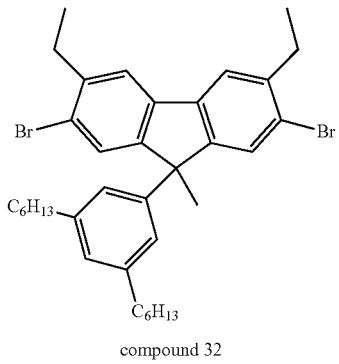

compound 32

Into a 1000 mL four-necked flask equipped with a stirrer were added sodium hydride (4.16 g) and tetrahydrofuran (200 mL), and the gas in the flask was purged with a nitrogen gas. To this were added methyl iodide (40.85 g) and the compound 31 (58.9 g), and the mixture was stirred at room temperature for 3 hours. To this was added hexane (400 mL), and the resultant organic layer was washed with ion-exchange water (200 mL) three times. The resultant organic layer was dried over magnesium sulfate, and the resultant organic layer was concentrated, to obtain a coarse product. The resultant coarse product was dissolved in hexane (450 mL), then, activated carbon (29 g) was added and the mixture was mixed and filtrated. The resultant organic layer was concentrated, to obtain 54.59 g of a compound 32 as a white solid.

Synthesis Example 24

Synthesis of Compound 33

Using the compound 32, a compound 33 was synthesized as described below.

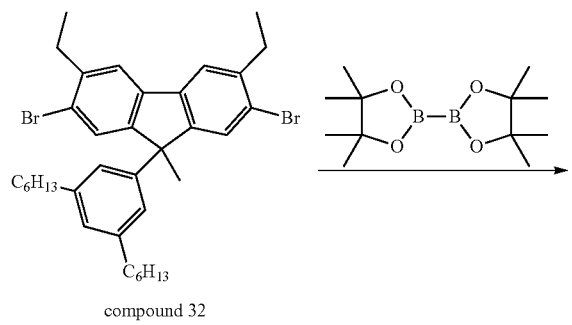

compound 32 compound 33

Into a 1000 mL four-necked flask equipped with a stirrer were added the compound 32 (53.63 g), bis(pinacolato)diboron (64.01 g), potassium acetate (46.52 g) and cyclopentyl methyl ether (457.59 g), and the gas in the flask was purged with a nitrogen gas. To this was added a [1,1'-bis(diphenylphosphino)ferrocene]palladium(II) dichloride dichloromethane complex (1:1) (2.06 g), and the temperature was raised up to 100° C., then, the mixture was stirred for 20 hours at 100° C. The resultant reaction mixture was left to cool to room temperature, then, hexane and activated carbon (25 g) were added, and the mixture was filtrated, and concentrated to obtain a coarse product. To the resultant coarse product were added hexane and activated carbon (25 g), and the mixture was stirred, then, concentrated. An operation of recrystallizing the resultant coarse product using toluene and acetonitrile was repeated twice, to obtain 50.9 g of a compound 33 as a white solid.
LC-MS (APCI, positive): [M+K]$^+$ 772
$^1$H-NMR (THF-d$_8$, 300 MHz) δ (ppm)=0.78 (6H, m), 1.19 (42H, br), 1.43 (4H, br), 1.71 (3H, s), 2.37 (4H, m), 2.92 (4H, m), 6.74 (3H, m), 7.57 (4H, d).

Example 4

Synthesis of Polymer Compound 10

A polymer compound 10 (1.03 g) was obtained in the same manner as for synthesis of the polymer compound 1 except that (Step 1) in synthesis of the polymer compound 1 was changed to "An inert gas atmosphere was prepared in a reaction vessel, then, a compound 23 (1.00 mmol), a compound 9 (1.24 mmol), a compound 7 (0.125 mmol), a compound 8 (0.125 mmol), dichlorobis(tris-o-methoxyphenylphosphine)palladium (1.1 mg) and toluene (35 mL) were mixed, and the mixture was heated up to 105° C.", (Step 2) was changed to "Into the reaction solution, a 40 wt % tetrabutylammonium hydroxide aqueous solution (3.6 mL) was dropped, and the mixture was refluxed for 4 hours." and (Step 3) was changed to "After the reaction, to this were added phenylboronic acid (15.2 mg) and dichlorobis(tris-o-methoxyphenylphosphine)palladium (1.1 mg), and the mixture was refluxed for 16.5 hours.". The polymer compound 10 had a polystyrene-equivalent number average molecular weight of $6.2\times10^4$ and a polystyrene-equivalent weight average molecular weight of $3.2\times10^5$.

The polymer compound 10 is a copolymer constituted of a constituent unit derived from the compound 9, a constituent unit derived from the compound 23, a constituent unit derived from the compound 7, a constituent unit derived from the compound 8 at a molar ratio of 50:40:5:5 according to the theoretical values calculated from the amounts of the charging raw materials.

Example 5

Synthesis of Polymer Compound 11

A polymer compound 11 (1.25 g) was obtained in the same manner as for synthesis of the polymer compound 10 except that (Step 1) in synthesis of the polymer compound 10 was changed to "An inert gas atmosphere was prepared in a reaction vessel, then, a compound 23 (1.00 mmol), a compound 33 (1.23 mmol), a compound 7 (0.125 mmol), a compound 8 (0.125 mmol), dichlorobis(tris-o-methoxyphenylphosphine)palladium (1.1 mg) and toluene (42 mL) were mixed, and the mixture was heated up to 105° C.". The polymer compound 11 had a polystyrene-equivalent number average molecular weight of $5.0\times10^4$ and a polystyrene-equivalent weight average molecular weight of $2.9\times10^5$.

The polymer compound 11 is a copolymer constituted of a constituent unit derived from the compound 33, a constituent unit derived from the compound 23, a constituent unit derived from the compound 7, a constituent unit derived from the compound 8 at a molar ratio of 50:40:5:5 according to the theoretical values calculated from the amounts of the charging raw materials.

Example 6

Synthesis of Polymer Compound 12

A polymer compound 12 (1.27 g) was obtained in the same manner as for synthesis of the polymer compound 10 except that (Step 1) in synthesis of the polymer compound 10 was changed to "An inert gas atmosphere was prepared in a reaction vessel, then, a compound 23 (1.00 mmol), a compound 34 (1.21 mmol) synthesized according to a method described in WO2013/191086, a compound 7 (0.125 mmol), a compound 8 (0.125 mmol), dichlorobis(tris-o-methoxyphenylphosphine)palladium (1.1 mg) and toluene (43 mL) were mixed, and the mixture was heated up to 105° C.". The polymer compound 12 had a polystyrene-equivalent number average molecular weight of $5.5 \times 10^4$ and a polystyrene-equivalent weight average molecular weight of $2.3 \times 10^5$.

compound 34

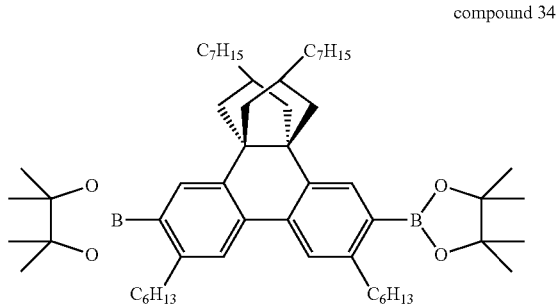

The polymer compound 12 is a copolymer constituted of a constituent unit derived from the compound 34, a constituent unit derived from the compound 23, a constituent unit derived from the compound 7, a constituent unit derived from the compound 8 at a molar ratio of 50:40:5:5 according to the theoretical values calculated from the amounts of the charging raw materials.

Example 7

Synthesis of Polymer Compound 13

A polymer compound 13 (1.85 g) was obtained in the same manner as for synthesis of the polymer compound 10 except that (Step 1) in synthesis of the polymer compound 10 was changed to "An inert gas atmosphere was prepared in a reaction vessel, then, a compound 27 (1.25 mmol), a compound 5 (0.98 mmol), a compound 35 (0.125 mmol) synthesized according to a method described in WO2013/191088, a compound 36 (0.125 mmol) synthesized according to a method described in WO2013/191088, dichlorobis(tris-o-methoxyphenylphosphine)palladium (1.1 mg) and toluene (56 mL) were mixed, and the mixture was heated up to 105° C.". The polymer compound 13 had a polystyrene-equivalent number average molecular weight of $5.8 \times 10^4$ and a polystyrene-equivalent weight average molecular weight of $2.4 \times 10^5$.

compound 35

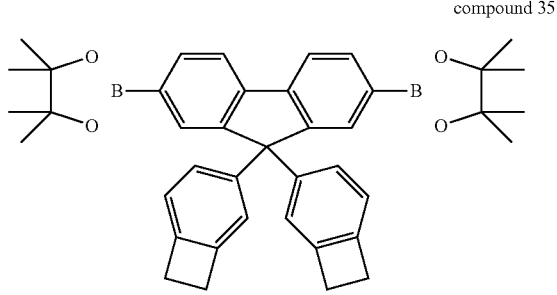

compound 36

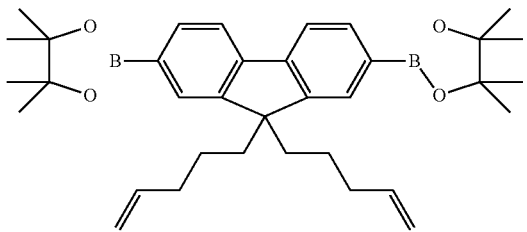

The polymer compound 13 is a copolymer constituted of a constituent unit derived from the compound 27, a constituent unit derived from the compound 5, a constituent unit derived from the compound 35, a constituent unit derived from the compound 36 at a molar ratio of 50:40:5:5 according to the theoretical values calculated from the amounts of the charging raw materials.

Synthesis Example 25

Synthesis of Polymer Compound 14

A polymer compound 14 (0.80 g) was obtained in the same manner as for synthesis of the polymer compound 10 except that (Step 1) in synthesis of the polymer compound 10 was changed to "An inert gas atmosphere was prepared in a reaction vessel, then, a compound 37 (1.00 mmol), a compound 9 (1.24 mmol), a compound 7 (0.125 mmol), a compound 8 (0.125 mmol), dichlorobis(tris-o-methoxyphenylphosphine)palladium (1.1 mg) and toluene (30 mL) were mixed, and the mixture was heated up to 105° C.". The polymer compound 14 had a polystyrene-equivalent number average molecular weight of $4.7 \times 10^4$ and a polystyrene-equivalent weight average molecular weight of $3.7 \times 10^5$.

compound 37

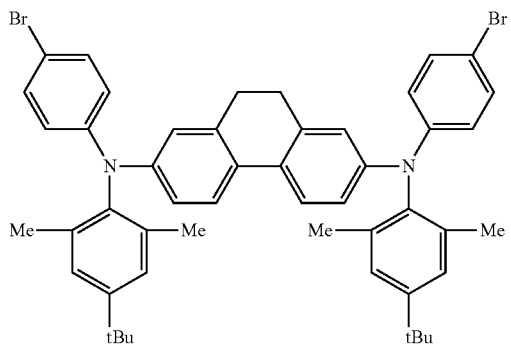

The polymer compound 14 is a copolymer constituted of a constituent unit derived from the compound 9, a constituent unit derived from the compound 37, a constituent unit derived from the compound 7, a constituent unit derived from the compound 8 at a molar ratio of 50:40:5:5 according to the theoretical values calculated from the amounts of the charging raw materials.

Example D1

Fabrication and Evaluation of Light Emitting Device D1

On a glass substrate carrying thereon an ITO film having a thickness of 45 nm formed by a sputtering method, a polythiophene.sulfonic acid-type hole injection agent AQ-1200 (manufactured by Plextronics) was spin-coated as a hole injection material to form a film having a thickness of 35 nm, which was then heated at 170° C. for 15 minutes on a hot plate in an air atmosphere.

Next, a polymer compound 1 was dissolved in xylene to prepare a 0.7 mass % xylene solution. This xylene solution was spin-coated to form a film having a thickness of 20 nm, which was then heated at 180° C. for 60 minutes on a hot plate in a nitrogen gas atmosphere.

Next, a polymer compound 6 was dissolved in xylene to prepare a 1.3 mass % xylene solution. This xylene solution was spin-coated to form a film having a thickness of 60 nm, which was then heated at 150° C. for 10 minutes on a hot plate in a nitrogen gas atmosphere. Thereafter, as a cathode, sodium fluoride was vapor-deposited with a thickness of about 7 nm, then, aluminum was vapor-deposited with a thickness of about 120 nm, fabricating a light emitting device D1. After the degree of vacuum reached $1\times10^{-4}$ Pa or lower, vapor-deposition of a metal was initiated.

When the voltage was applied to the resultant light emitting device D1, EL light emission having a peak at 455 nm was obtained from this device, and the current value was set so that the initial luminance was 5000 cd/m$^2$, then, the device was driven at constant current, and the temporal change in luminance was measured. As a result, the time (LT50) until the luminance reached 50% of the initial luminance was 42.4 hours. The results are shown in Table 2.

Example D2

Fabrication and Evaluation of Light Emitting Device D2

A light emitting device D2 was fabricated in the same manner as in Example D1 except that a polymer compound 2 was used instead of the polymer compound 1 in Example D1.

When the voltage was applied to the resultant light emitting device D2, EL light emission having a peak at 455 nm was obtained from this device, and the current value was set so that the initial luminance was 5000 cd/m$^2$, then, the device was driven at constant current, and the temporal change in luminance was measured. As a result, the time (LT50) until the luminance reached 50% of the initial luminance was 31.9 hours. The results are shown in Table 2.

Example D5

Fabrication and Evaluation of Light Emitting Device D5

A light emitting device D5 was fabricated in the same manner as in Example D1 except that a polymer compound 7 was used instead of the polymer compound 1 in Example D1.

When the voltage was applied to the resultant light emitting device D5, EL light emission having a peak at 455 nm was obtained from this device, and the current value was set so that the initial luminance was 5000 cd/m$^2$, then, the device was driven at constant current, and the temporal change in luminance was measured. As a result, the time (LT50) until the luminance reached 50% of the initial luminance was 34.9 hours. The results are shown in Table 2.

Example D7

Fabrication and Evaluation of Light Emitting Device D7

A light emitting device D7 was fabricated in the same manner as in Example D1 except that a polymer compound 10 was used instead of the polymer compound 1 in Example D1.

When the voltage was applied to the resultant light emitting device D7, EL light emission having a peak at 455 nm was obtained from this device, and the current value was set so that the initial luminance was 5000 cd/m$^2$, then, the device was driven at constant current, and the temporal change in luminance was measured. As a result, the time (LT50) until the luminance reached 50% of the initial luminance was 45.9 hours. The results are shown in Table 2.

Comparative Example CD1

Fabrication and Evaluation of Light Emitting Device CD1

A light emitting device CD1 was fabricated in the same manner as in Example D1 except that a polymer compound 3 was used instead of the polymer compound 1 in Example D1.

When the voltage was applied to the resultant light emitting device CD1, EL light emission having a peak at 455 nm was obtained from this device, and the current value was set so that the initial luminance was 5000 cd/m$^2$, then, the device was driven at constant current, and the temporal change in luminance was measured. As a result, the time (LT50) until the luminance reached 50% of the initial luminance was 30.7 hours. The results are shown in Table 2.

Comparative Example CD2

Fabrication and Evaluation of Light Emitting Device CD2

A light emitting device CD2 was fabricated in the same manner as in Example D1 except that a polymer compound 4 was used instead of the polymer compound 1 in Example D1.

When the voltage was applied to the resultant light emitting device CD2, EL light emission having a peak at 455 nm was obtained from this device, and the current value was set so that the initial luminance was 5000 cd/m$^2$, then, the device was driven at constant current, and the temporal change in luminance was measured. As a result, the time (LT50) until the luminance reached 50% of the initial luminance was 22.0 hours. The results are shown in Table 2.

Comparative Example CD3

Fabrication and Evaluation of Light Emitting Device CD3

A light emitting device CD3 was fabricated in the same manner as in Example D1 except that a polymer compound 5 was used instead of the polymer compound 1 in Example D1.

When the voltage was applied to the resultant light emitting device CD3, EL light emission having a peak at 455 nm was obtained from this device, and the current value was set so that the initial luminance was 5000 cd/m$^2$, then, the device was driven at constant current, and the temporal change in luminance was measured. As a result, the time (LT50) until the luminance reached 50% of the initial luminance was 24.9 hours. The results are shown in Table 2.

Comparative Example CD7

Fabrication and Evaluation of Light Emitting Device CD7

A light emitting device CD7 was fabricated in the same manner as in Example D1 except that a polymer compound 8 was used instead of the polymer compound 1 in Example D1.

When the voltage was applied to the resultant light emitting device CD7, EL light emission having a peak at 455 nm was obtained from this device, and the current value was set so that the initial luminance was 5000 cd/m$^2$, then, the device was driven at constant current, and the temporal change in luminance was measured. As a result, the time (LT50) until the luminance reached 50% of the initial luminance was 11.2 hours. The results are shown in Table 2.

Comparative Example CD10

Fabrication and Evaluation of Light Emitting Device CD10

A light emitting device CD10 was fabricated in the same manner as in Example D1 except that a polymer compound 14 was used instead of the polymer compound 1 in Example D1.

When the voltage was applied to the resultant light emitting device CD10, EL light emission having a peak at 455 nm was obtained from this device, and the current value was set so that the initial luminance was 5000 cd/m$^2$, then, the device was driven at constant current, and the temporal change in luminance was measured. As a result, the time (LT50) until the luminance reached 50% of the initial luminance was 21.9 hours. The results are shown in Table 2.

A comparison of the light emitting device D1 with the light emitting device CD1 and the light emitting device CD3 and a comparison of the light emitting device D2, the light emitting device D5 and the light emitting device D7 with the light emitting device CD2, the light emitting device CD7 and the light emitting device CD10 showed that light emitting devices produced using the polymer compounds of the present invention were excellent in luminance life.

TABLE 2

| | hole transporting layer | light emitting layer | LT50 (hrs) |
|---|---|---|---|
| Example D1 | polymer compound 1 | polymer compound 6 | 42.4 |
| Example D2 | polymer compound 2 | polymer compound 6 | 31.9 |
| Example D5 | polymer compound 7 | polymer compound 6 | 34.9 |
| Example D7 | polymer compound 10 | polymer compound 6 | 45.9 |
| Comparative Example CD1 | polymer compound 3 | polymer compound 6 | 30.7 |
| Comparative Example CD2 | polymer compound 4 | polymer compound 6 | 22.0 |
| Comparative Example CD3 | polymer compound 5 | polymer compound 6 | 24.9 |
| Comparative Example CD7 | polymer compound 8 | polymer compound 6 | 11.2 |
| Comparative Example CD10 | polymer compound 14 | polymer compound 6 | 21.9 |

TABLE 2-continued

| | hole transporting layer | light emitting layer | LT50 (hrs) |
|---|---|---|---|

Example D3

Fabrication and Evaluation of Light Emitting Device D3

On a glass substrate carrying thereon an ITO film having a thickness of 45 nm formed by a sputtering method, a polythiophene.sulfonic acid-type hole injection agent AQ-1200 (manufactured by Plextronics) was spin-coated as a hole injection material to form a film having a thickness of 65 nm, which was then heated at 170° C. for 15 minutes on a hot plate in an air atmosphere.

Next, a polymer compound 1 was dissolved in xylene to prepare a 0.7 mass % xylene solution. This xylene solution was spin-coated to form a film having a thickness of 20 nm, which was then heated at 180° C. for 60 minutes on a hot plate in a nitrogen gas atmosphere.

Next, a polymer compound 6 and a compound 4 were dissolved in xylene to prepare 1.6 mass % xylene solutions, respectively. Then, the xylene solution of the polymer compound 6 and the xylene solution of the compound 4 were mixed so that the mass ratio of the solid component of the polymer compound 6 to the solid component of the compound 4 was 92.5:7.5. This xylene solution was spin-coated to form a film having a thickness of 80 nm, which was then heated at 150° C. for 10 minutes on a hot plate in a nitrogen gas atmosphere. Thereafter, as a cathode, sodium fluoride was vapor-deposited with a thickness of about 7 nm, then, aluminum was vapor-deposited with a thickness of about 120 nm, fabricating a light emitting device D3. After the degree of vacuum reached 1×10$^{-4}$ Pa or lower, vapor-deposition of a metal was initiated.

When the voltage was applied to the resultant light emitting device D3, EL light emission having a peak at 625 nm was obtained from this device, and the current value was set so that the initial luminance was 8000 cd/m$^2$, then, the device was driven at constant current, and the temporal change in luminance was measured. As a result, the time (LT50) until the luminance reached 50% of the initial luminance was 1456 hours. The results are shown in Table 3.

Example D4

Fabrication and Evaluation of Light Emitting Device D4

A light emitting device D4 was fabricated in the same manner as in Example D3 except that a polymer compound 2 was used instead of the polymer compound 1 in Example D3.

When the voltage was applied to the resultant light emitting device D4, EL light emission having a peak at 625 nm was obtained from this device, and the current value was set so that the initial luminance was 8000 cd/m$^2$, then, the device was driven at constant current, and the temporal change in luminance was measured. As a result, the time (LT50) until the luminance reached 50% of the initial luminance was 553 hours. The results are shown in Table 3.

Example D8

Fabrication and Evaluation of Light Emitting Device D8

A light emitting device D8 was fabricated in the same manner as in Example D3 except that a polymer compound 10 was used instead of the polymer compound 1 in Example D3.

When the voltage was applied to the resultant light emitting device 58, EL light emission having a peak at 625 net was obtained from this device, and the current value was set so that the initial luminance was 8000 cd/m$^2$, then, the device was driven at constant current, and the temporal change in luminance was measured. As a result, the time (LT50) until the luminance reached 508 of the initial luminance was 610 hours. The results are shown in Table 3.

Comparative Example CD4

Fabrication and Evaluation of Light Emitting Device CD4

A light emitting device CD4 was fabricated in the same manner as in Example D3 except that a polymer compound 3 was used instead of the polymer compound 1 in Example D3.

When the voltage was applied to the resultant light emitting device CD4, EL light emission having a peak at 625 nm was obtained from this device, and the current value was set so that the initial luminance was 8000 cd/m$^2$, then, the device was driven at constant current, and the temporal change in luminance was measured. As a result, the time (LT50) until the luminance reached 50% of the initial luminance was 323 hours. The results are shown in Table 3.

Comparative Example CD5

Fabrication and Evaluation of Light Emitting Device CD5

A light emitting device CD5 was fabricated in the same manner as in Example D3 except that a polymer compound 4 was used instead of the polymer compound 1 in Example D3.

When the voltage was applied to the resultant light emitting device CD5, EL light emission having a peak at 625 nm was obtained from this device, and the current value was set so that the initial luminance was 8000 cd/m$^2$, then, the device was driven at constant current, and the temporal change in luminance was measured. As a result, the time (LT50) until the luminance reached 50% of the initial luminance was 142 hours. The results are shown in Table 3.

Comparative Example CD6

Fabrication and Evaluation of Light Emitting Device CD6

A light emitting device CD6 was fabricated in the same manner as in Example D3 except that a polymer compound 5 was used instead of the polymer compound 1 in Example D3.

When the voltage was applied to the resultant light emitting device CD6, EL light emission having a peak at 625 nm was obtained from this device, and the current value was set so that the initial luminance was 8000 cd/m$^2$, then, the device was driven at constant current, and the temporal change in luminance was measured. As a result, the time (LT50) until the luminance reached 50% of the initial luminance was 252 hours. The results are shown in Table 3.

A comparison of the light emitting device D3 with the light emitting device CD4 and the light emitting device CD6 and a comparison of the light emitting device D4 and the light emitting device D8 with light emitting device CD5 showed that light emitting devices produced using the polymer compounds of the present invention were excellent in luminance life.

TABLE 3

| | hole transporting layer | light emitting layer | LT50 (hrs) |
|---|---|---|---|
| Example D3 | polymer compound 1 | polymer compound 6/ compound 4 = 92.5/7.5 | 1456 |
| Example D4 | polymer compound 2 | polymer compound 6/ compound 4 = 92.5/7.5 | 553 |
| Example D8 | polymer compound 10 | polymer compound 6/ compound 4 = 92.5/7.5 | 610 |
| Comparative Example CD4 | polymer compound 3 | polymer compound 6/ compound 4 = 92.5/7.5 | 323 |
| Comparative Example CD5 | polymer compound 4 | polymer compound 6/ compound 4 = 92.5/7.5 | 142 |
| Comparative Example CD6 | polymer compound 5 | polymer compound 6/ compound 4 = 92.5/7.5 | 252 |

Example D6

Fabrication and Evaluation of Light Emitting Device D6

On a glass substrate carrying thereon an ITO film having a thickness of 45 nm formed by a sputtering method, a polythiophene.sulfonic acid-type hole injection agent AQ-1200 (manufactured by Plextronics) was spin-coated as a hole injection material to form a film having a thickness of 35 nm, which was then heated at 170° C. for 15 minutes on a hot plate in an air atmosphere.

Next, a polymer compound 7 was dissolved in xylene to prepare a 0.7 mass % xylene solution. This xylene solution was spin-coated to form a film having a thickness of 20 nm, which was then heated at 180° C. for 60 minutes on a hot plate in a nitrogen gas atmosphere.

Next, a polymer compound 9 and a compound 17 were dissolved in xylene to prepare 1.8 mass % xylene solutions, respectively. Then, the xylene solution of the polymer compound 9 and the xylene solution of the compound 17 were mixed so that the mass ratio of the solid component of the polymer compound 9 to the solid component of the compound 17 was 70:30. This xylene solution was spin-coated to form a film having a thickness of 80 nm, which was then heated at 150° C. for 10 minutes on a hot plate in a nitrogen gas atmosphere. Thereafter, as a cathode, sodium fluoride was vapor-deposited with a thickness of about 7 nm, then, aluminum was vapor-deposited with a thickness of about 120 nm, fabricating a light emitting device D6. After the degree of vacuum reached $1\times10^{-4}$ Pa or lower, vapor-deposition of a metal was initiated.

When the voltage was applied to the resultant light emitting device D6, EL light emission having a peak at 515 nm was obtained from this device, and the current value was set so that the initial luminance was 24000 cd/m², then, the device was driven at constant current, and the temporal change in luminance was measured. As a result, the time (LT50) until the luminance reached 50% of the initial luminance was 61.5 hours. The results are shown in Table 4.

Example D9

Fabrication and Evaluation of Light Emitting Device D9

A light emitting device D9 was fabricated in the same manner as in Example D6 except that a polymer compound 10 was used instead of the polymer compound 7 in Example D6.

When the voltage was applied to the resultant light emitting device D9, EL light emission having a peak at 515 nm was obtained from this device, and the current value was set so that the initial luminance was 24000 cd/m², then, the device was driven at constant current, and the temporal change in luminance was measured. As a result, the time (LT50) until the luminance reached 50% of the initial luminance was 64.9 hours. The results are shown in Table 4.

Comparative Example CD8

Fabrication and Evaluation of Light Emitting Device CD8

A light emitting device CD8 was fabricated in the same manner as in Example D6 except that a polymer compound 4 was used instead of the polymer compound 7 in Example D6.

When the voltage was applied to the resultant light emitting device CD8, EL light emission having a peak at 515 nm was obtained from this device, and the current value was set so that the initial luminance was 24000 cd/m², then, the device was driven at constant current, and the temporal change in luminance was measured. As a result, the time (LT50) until the luminance reached 50% of the initial luminance was 44.9 hours. The results are shown in Table 4.

Comparative Example CD9

Fabrication and Evaluation of Light Emitting Device CD9

A light emitting device CD9 was fabricated in the same manner as in Example D6 except that a polymer compound 8 was used instead of the polymer compound 7 in Example D6.

When the voltage was applied to the resultant light emitting device CD9, EL light emission having a peak at 515 nm was obtained from this device, and the current value was set so that the initial luminance was 24000 cd/m², then, the device was driven at constant current, and the temporal change in luminance was measured. As a result, the time (LT50) until the luminance reached 50% of the initial luminance was 16.6 hours. The results are shown in Table 4.

Comparative Example CD11

Fabrication and Evaluation of Light Emitting Device CD11

A light emitting device CD11 was fabricated in the same manner as in Example D6 except that a polymer compound 14 was used instead of the polymer compound 7 in Example D6.

When the voltage was applied to the resultant light emitting device CD11, EL light emission having a peak at 515 nm was obtained from this device, and the current value was set so that the initial luminance was 24000 cd/m², then, the device was driven at constant current, and the temporal change in luminance was measured. As a result, the time (LT50) until the luminance reached 50% of the initial luminance was 13.5 hours. The results are shown in Table 4.

A comparison of the light emitting device D6 and the light emitting device D9 with the light emitting device CD8, the light emitting device CD9 and the light emitting device CD11 showed that light emitting devices produced using the polymer compounds of the present invention were excellent in luminance life.

TABLE 4

| | hole transporting layer | light emitting layer | LT50 (hrs) |
|---|---|---|---|
| Example D6 | polymer compound 7 | polymer compound 9/ compound 17 = 70/30 | 61.5 |
| Example D9 | polymer compound 10 | polymer compound 9/ compound 17 = 70/30 | 64.9 |
| Comparative Example CD8 | polymer compound 4 | polymer compound 9/ compound 17 = 70/30 | 44.9 |
| Comparative Example CD9 | polymer compound 8 | polymer compound 9/ compound 17 = 70/30 | 16.6 |
| Comparative Example CD11 | polymer compound 14 | polymer compound 9/ compound 17 = 70/30 | 13.5 |

INDUSTRIAL APPLICABILITY

The polymer compound of the present invention is a polymer compound which is useful for production of a light emitting device excellent in luminance life.

The invention claimed is:

1. A polymer compound comprising a constituent unit represented by the following formula (1'), a constituent unit represented by the following formula (2-A) and a constituent unit represented by the following formula (2-B):

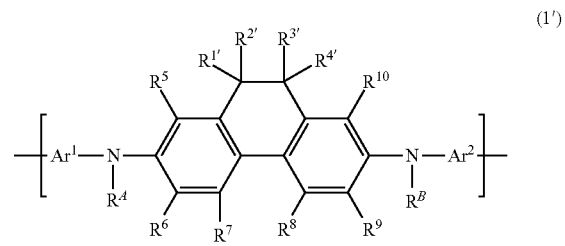

wherein
R$^{1'}$, R$^{2'}$, R$^{3'}$ and R$^{4'}$ represent each independently an alkyl group, an alkoxy group, an aryl group, an aryloxy group or a mono-valent heterocyclic group and these groups may have a substituent,
R$^5$, R$^6$, R$^7$, R$^8$, R$^9$ and R$^{10}$ represent each independently a hydrogen atom, an alkyl group, an alkoxy group, an aryl group, an aryloxy group or a mono-valent heterocyclic group and these groups may have a substituent,
R$^A$ and R$^B$ represent each independently a hydrogen atom, an alkyl group, an aryl group or a mono-valent heterocyclic group and these groups may have a substituent, Ar$^1$ and Ar$^2$ represent each independently an arylene group or a di-valent heterocyclic group and these groups may have a substituent, R$^{1'}$ and R$^{3'}$ may be mutually linked to form a ring structure together with carbon atoms to which they are linked, R$^{2'}$ and R$^{4'}$ may be mutually linked to form a ring structure together with carbon atoms to which they are linked, R$^{1'}$ and R$^{2'}$ may be mutually linked to form a ring structure together with a carbon atom to which they are linked, R$^{3'}$ and R$^{4'}$ may be mutually linked to form a ring structure together with a carbon atom to which they are linked, adjacent groups of R$^6$, R$^7$, R$^8$ and R$^9$ may be mutually linked to form a ring structure together with carbon atoms to which they are linked, Ar$^1$ and R$^A$ may be mutually linked to form a ring structure together with a nitrogen atom to which they are linked, Ar$^2$ and R$^B$ may be mutually linked to form a ring structure together with a nitrogen atom to which they are linked:

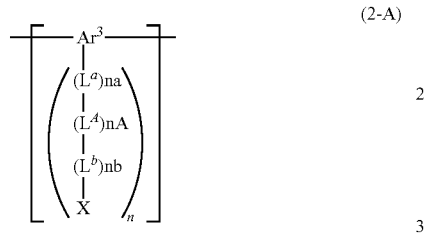

(2-A)

wherein
na represents an integer of 0 to 3, nb represents an integer of 0 to 12, nA represents 0 or 1 and n represents 1 or 2, Ar$^3$ represents a (2+n)-valent aromatic hydrocarbon group or a (2+n)-valent heterocyclic group and these groups may have a substituent, L$^a$ and L$^b$ represent each independently a methylene group or a phenylenediyl group and these groups may have a substituent, when there exist a plurality of L$^a$, these may be the same or different, when there exist a plurality of L$^b$, these may be the same or different, L$^A$ represents an oxygen atom or a sulfur atom, when there exist a plurality of L$^A$, these may be the same or different, X represents a mono-valent cross-linkable group represented by the formula (1-m), (1-m'), (1-D) or (1-D') selected from the following Group A of cross-linkable group, when there exist a plurality of X, these may be the same or different:

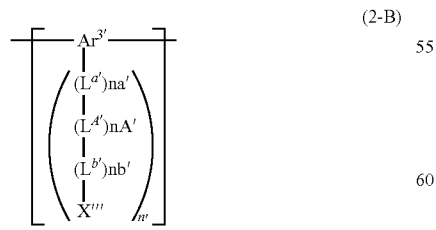

(2-B)

wherein
na' represents an integer of 1 to 3, nb' represents an integer of 1 to 12, nA' represents 0 or 1 and n' represents 1 or 2, Ar$^{3'}$ represents a (2+n')-valent aromatic hydrocarbon group or a (2+n')-valent heterocyclic group and these groups may have a substituent, L$^{a'}$ and L$^{b'}$ represent a methylene group and this methylene group may have a substituent, when there exist a plurality of L$^{a'}$, these may be the same or different, when there exist a plurality of L$^{b'}$, these may be the same or different, L$^{A'}$ represents an oxygen atom or a sulfur atom, when there exist a plurality of L$^{A'}$, these may be the same or different, X''' represents a mono-valent cross-linkable group represented by the formula (1-a), (1-v), (1-w) or (1-x) selected from the following Group A of cross-linkable group, when there exist a plurality of X''', these may be the same or different:

(Group A of cross-linkable group)

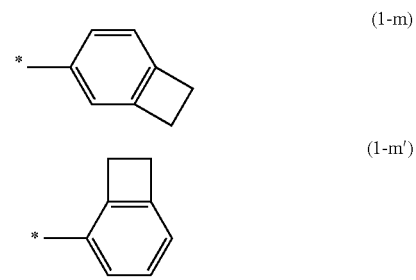

(1-m)

(1-m')

(1-D)

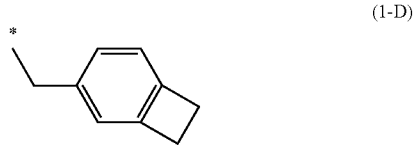

(1-D')

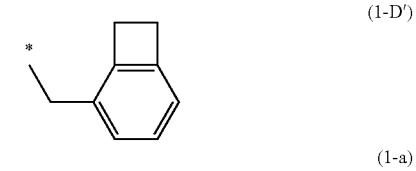

(1-a)

(1-v)

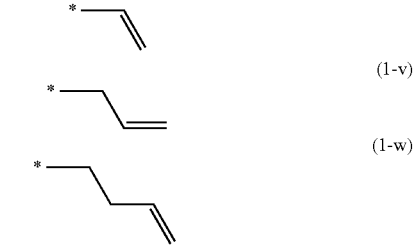

(1-w)

(1-x)

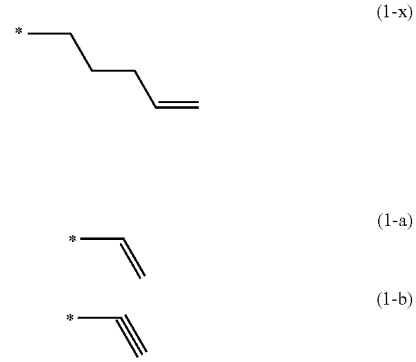

(1-a)

(1-b)

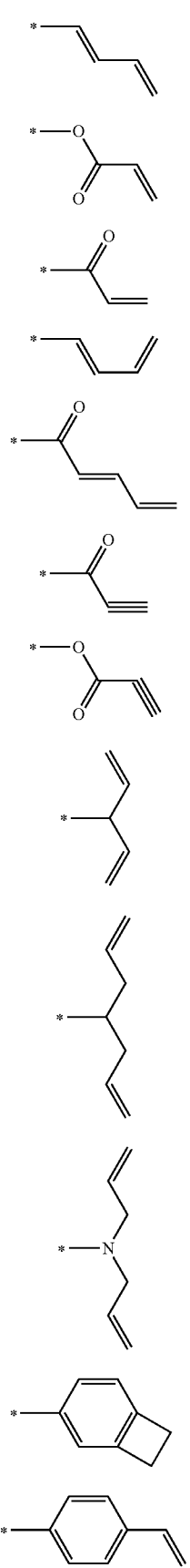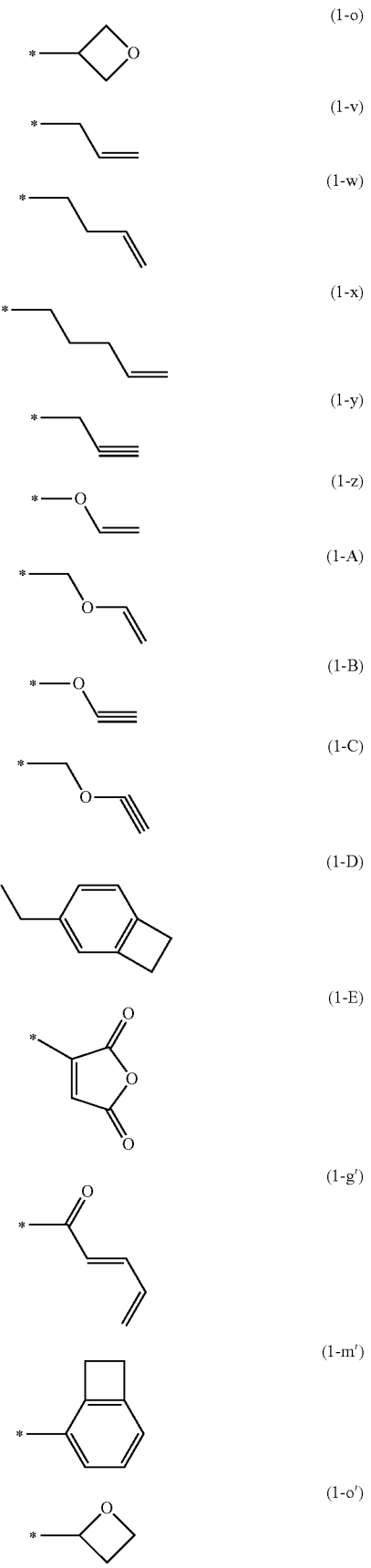

-continued

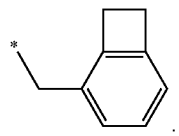
(1-D')

wherein the cross-linkable group may have a substituent, and * represents a linkage position.

2. The polymer compound according to claim 1, wherein the constituent unit represented by said formula (1') is a constituent unit represented by the following formula (1):

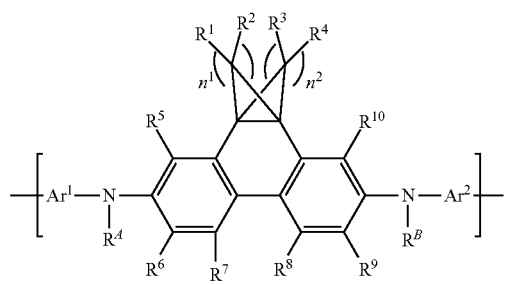
(1)

wherein
$R^5, R^6, R^7, R^8, R^9, R^{10}, R^A, R^B, Ar^1$ and $Ar^2$ represent the same meaning as described above,
$n^1$ and $n^2$ represent each independently an integer of 1 to 5,
$R^1, R^2, R^3$ and $R^4$ represent each independently a hydrogen atom, an alkyl group, an alkoxy group, an aryl group, an aryloxy group or a mono-valent heterocyclic group and these groups may have a substituent, when there exist a plurality of each of $R^1, R^2, R^3$ and $R^4$, the plurality of $R^1, R^2, R^3$ and $R^4$ may each be mutually the same or different,
and adjacent groups of $R^1, R^2, R^3$ and $R^4$ may be mutually linked to form a ring structure together with carbon atoms to which they are linked.

3. The polymer compound according to claim 1, wherein X in said formula (2-A) is a mono-valent cross-linkable group represented by said formula (1-m) or a mono-valent cross-linkable group represented by said formula (1-m').

4. The polymer compound according to claim 1, wherein X''' in said formula (2-B) is a mono-valent cross-linkable group represented by said formula (1-a).

5. The polymer compound according to claim 1, further comprising a constituent unit represented by the following formula (3):

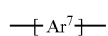
(3)

wherein
$Ar^7$ represents an arylene group or a di-valent heterocyclic group and these groups may have a substituent.

6. The polymer compound according to claim 5, wherein the constituent unit represented by said formula (3) is a fluorenediyl group which may have a substituent.

7. The polymer compound according to claim 5, wherein the constituent unit represented by said formula (3) is a phenylenediyl group which may have a substituent.

8. The polymer compound according to claim 1, further comprising a constituent unit represented by the following formula (4):

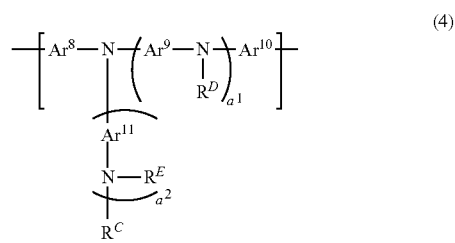
(4)

wherein
$a^1$ and $a^2$ represent each independently 0 or 1,
$Ar^8$ and $Ar^{10}$ represent each independently an arylene group or a di-valent heterocyclic group and these groups may have a substituent,
$Ar^9$ and $Ar^{11}$ represent each independently an arylene group, a di-valent heterocyclic group or a di-valent group obtained by linking two or more identical or different groups selected from the group consisting of arylene groups and di-valent heterocyclic groups and these groups may have a substituent,
$R^C, R^D$ and $R^E$ represent each independently a hydrogen atom, an alkyl group, an aryl group or a mono-valent heterocyclic group and these groups may have a substituent,
$Ar^8, Ar^9, Ar^{10}$ and $Ar^{11}$ may each form a ring structure by mutual linkage of each group with other group than the each group linked to a nitrogen atom to which the each group is linked.

9. The polymer compound according to claim 1, wherein the content of the constituent unit represented by said formula (1') is 20 to 90 mol % with respect to the total content of constituent units contained in the polymer compound.

10. A composition comprising the polymer compound according to claim 1 and at least one material selected from the group consisting of a hole transporting material, a hole injection material, an electron transporting material, an electron injection material, a light emitting material, an antioxidant and a solvent.

11. A film comprising the polymer compound according to claim 1.

12. An insolubilized film obtained by insolubilizing the film comprising the polymer compound according to claim 11 in a solvent.

13. A light emitting device having the film according to claim 11.

* * * * *